United States Patent
Poivet

(10) Patent No.: US 10,277,159 B2
(45) Date of Patent: Apr. 30, 2019

(54) FINISHED MULTI-SENSOR UNITS

(71) Applicant: KBFX LLC, Lewes, DE (US)

(72) Inventor: Alain Poivet, Palo Alto, CA (US)

(73) Assignee: KBFX LLC, Lewes, DE (US)

( * ) Notice: Subject to any disclaimer, the term of this patent is extended or adjusted under 35 U.S.C. 154(b) by 0 days.

(21) Appl. No.: 14/970,431

(22) Filed: Dec. 15, 2015

(65) Prior Publication Data

US 2016/0365825 A1    Dec. 15, 2016

Related U.S. Application Data

(63) Continuation-in-part of application No. 13/831,496, filed on Mar. 14, 2013, now abandoned, and a (Continued)

(30) Foreign Application Priority Data

Nov. 17, 2008 (FR) ..................... 08 06419

(51) Int. Cl.
*H02S 20/23*    (2014.01)
*E04D 3/40*    (2006.01)
(Continued)

(52) U.S. Cl.
CPC ............... *H02S 20/23* (2014.12); *E04D 3/40* (2013.01); *E04F 13/072* (2013.01); *F24S 20/66* (2018.05);
(Continued)

(58) Field of Classification Search
CPC ......... E04D 3/40; E04F 13/072; F24J 2/0444; F24J 2/045; F24J 2/461; F24J 2/4614; F24J 2/5207; F24J 2/5232; F24J 2/5233; F24J 2/5258; F24J 2002/5215; F24J 2002/522; F24J 2002/5226; F24J 2002/5279; F24J 2002/5294; H01L 31/0521; H02S 20/22; H02S 20/23; H02S 20/26; H02S 40/44; Y02B 10/12; Y02B 10/20; Y02B 10/44; Y02B 10/47; Y02B 10/50; F24S 25/12; F24S 25/13; F24S 25/35; F24S 25/636;
(Continued)

(56) References Cited

U.S. PATENT DOCUMENTS 3,800,358 A    4/1974    Ryan
3,895,604 A    7/1975    Ryan
(Continued)

FOREIGN PATENT DOCUMENTS

DE    20219173    2/2004
DE    202005007855    8/2005
(Continued)

OTHER PUBLICATIONS

SerbotSwitzerland, "Serbot Product Range," YouTube video located at https://www.youtube.com/watch?v=sfTE3ZgmQ2c, Jan. 14, 2013.
(Continued)

*Primary Examiner* — James M Ference
(74) *Attorney, Agent, or Firm* — Sheppard, Mullin, Richter & Hampton LLP

(57) ABSTRACT

A new system of solar construction, technology and methods for making off structure constructed panel blocks are disclosed.

18 Claims, 22 Drawing Sheets

Related U.S. Application Data continuation-in-part of application No. 13/760,965, filed on Feb. 6, 2013, now abandoned, said application No. 13/831,496 is a continuation-in-part of application No. 13/129,378, filed on May 13, 2011, now Pat. No. 8,794,583, said application No. 13/760,965 is a continuation of application No. 13/129,378, filed as application No. PCT/FR2009/001322 on Nov. 17, 2009, now Pat. No. 8,794,583, application No. 14/970,431, filed on Dec. 15, 2015, which is a continuation-in-part of application No. 14/217,427, filed on Mar. 17, 2014, now abandoned, application No. 14/970,431, filed on Dec. 15, 2015, which is a continuation-in-part of application No. 14/217,288, filed on Mar. 17, 2014, now abandoned.

(60) Provisional application No. 61/789,607, filed on Mar. 15, 2013, provisional application No. 61/801,089, filed on Mar. 15, 2013.

(51) Int. Cl.

| | | |
|---|---|---|
| *E04F 13/072* | (2006.01) | |
| *H01L 31/052* | (2014.01) | |
| *H02S 20/26* | (2014.01) | |
| *H02S 20/22* | (2014.01) | |
| *H02S 40/44* | (2014.01) | |
| *F24S 20/67* | (2018.01) | |
| *F24S 25/35* | (2018.01) | |
| *F24S 25/13* | (2018.01) | |
| *F24S 25/12* | (2018.01) | |
| *F24S 25/636* | (2018.01) | |
| *F24S 40/20* | (2018.01) | |
| *F24S 20/66* | (2018.01) | |
| *F24S 40/44* | (2018.01) | |
| *F24S 25/00* | (2018.01) | |

(52) U.S. Cl.
CPC .............. *F24S 20/67* (2018.05); *F24S 25/12* (2018.05); *F24S 25/13* (2018.05); *F24S 25/35* (2018.05); *F24S 25/636* (2018.05); *F24S 40/20* (2018.05); *F24S 40/44* (2018.05); *H01L 31/0521* (2013.01); *H02S 20/22* (2014.12); *H02S 20/26* (2014.12); *H02S 40/44* (2014.12); F24S 2025/013 (2018.05); F24S 2025/021 (2018.05); F24S 2025/801 (2018.05); F24S 2025/804 (2018.05); F24S 2025/807 (2018.05); F24S 2201/00 (2018.05); Y02B 10/12 (2013.01); Y02B 10/20 (2013.01); Y02E 10/44 (2013.01); Y02E 10/47 (2013.01); Y02E 10/50 (2013.01)

(58) Field of Classification Search
CPC .. F24S 40/20; F24S 40/44; F24S 20/66; F24S 20/67; F24S 2201/00; F24S 2025/013; F24S 2025/801; F24S 2025/021; F24S 2025/804; F24S 2025/807
See application file for complete search history.

(56) References Cited

U.S. PATENT DOCUMENTS

| | | | |
|---|---|---|---|
| 4,000,850 A * | 1/1977 | Diggs | F24D 3/005 126/613 |
| 4,010,733 A | 3/1977 | Moore | |
| 4,014,133 A | 3/1977 | Brown | |
| 4,029,080 A | 6/1977 | Warren | |
| 4,033,327 A * | 7/1977 | Pei | F24J 2/055 126/608 |
| 4,073,283 A | 2/1978 | Lof | |
| 4,096,861 A | 6/1978 | Bowles | |
| 4,098,260 A | 7/1978 | Goettl | |
| 4,119,084 A | 10/1978 | Eckels | |
| 4,136,669 A | 1/1979 | Lane | |
| 4,150,660 A | 4/1979 | Peters et al. | |
| 4,171,694 A * | 10/1979 | Parker | F24J 2/204 126/675 |
| 4,174,703 A * | 11/1979 | Blakey | F24J 2/045 126/623 |
| 4,175,542 A | 11/1979 | Duchene | |
| 4,178,910 A * | 12/1979 | Gramer | F24J 2/204 126/622 |
| 4,184,476 A | 1/1980 | McArthur | |
| 4,184,479 A | 1/1980 | Ratliff, Jr. | |
| 4,212,291 A | 7/1980 | Erb | |
| 4,215,677 A * | 8/1980 | Erickson | F24J 2/045 126/621 |
| 4,223,667 A | 9/1980 | Paymal | |
| 4,233,958 A | 11/1980 | Heden | |
| 4,239,555 A * | 12/1980 | Scharlack | H01L 31/048 136/251 |
| 4,274,395 A | 6/1981 | Bangs | |
| 4,280,484 A | 7/1981 | Mancosu | |
| 4,324,232 A | 4/1982 | Quiroz | |
| 4,375,637 A | 3/1983 | Desjardins | |
| 4,393,859 A | 7/1983 | Marossy et al. | |
| 4,426,999 A | 1/1984 | Evans et al. | |
| 4,526,161 A | 7/1985 | Kaicher | |
| 4,594,470 A | 6/1986 | Headrick | |
| 4,677,248 A * | 6/1987 | Lacey | F24J 2/5211 126/569 |
| 4,718,404 A * | 1/1988 | Sadler | F24J 2/242 126/621 |
| 4,724,645 A | 2/1988 | Pigout | |
| 4,751,800 A | 6/1988 | Kida et al. | |
| 4,883,340 A | 11/1989 | Dominguez | |
| 4,917,004 A | 4/1990 | Okamoto et al. | |
| 4,928,444 A | 5/1990 | Horie et al. | |
| 4,936,096 A | 6/1990 | Vanderjagt | |
| 4,942,698 A | 7/1990 | Kumagai | |
| 5,038,517 A | 8/1991 | Talbott | |
| 5,092,939 A * | 3/1992 | Nath | E04D 3/3605 136/251 |
| 5,109,566 A | 5/1992 | Kobayashi et al. | |
| 5,134,827 A * | 8/1992 | Hartman | E04D 3/366 126/634 |
| 5,164,020 A | 11/1992 | Wagner et al. | |
| 5,180,442 A * | 1/1993 | Elias | H01L 31/048 136/251 |
| 5,189,851 A | 3/1993 | Omika et al. | |
| 5,261,184 A | 11/1993 | Appeldorn et al. | |
| 5,367,843 A * | 11/1994 | Hirai | F24S 20/67 52/200 |
| 5,528,789 A | 6/1996 | Rostamo | |
| 5,571,338 A * | 11/1996 | Kadonome | E04D 3/3608 136/251 |
| 5,576,947 A | 11/1996 | Wienkop | |
| 5,787,653 A | 8/1998 | Sakai et al. | |
| 5,802,762 A | 9/1998 | Stonecypher | |
| 5,813,169 A | 9/1998 | Engerman | |
| 5,968,287 A * | 10/1999 | Nath | H01L 31/048 136/251 |
| 6,065,252 A | 5/2000 | Norsen | |
| 6,065,255 A * | 5/2000 | Stern | E04D 3/3608 52/173.3 |
| 6,105,317 A | 8/2000 | Tomiuchi et al. | |
| 6,108,597 A | 8/2000 | Kirchner et al. | |
| 6,111,189 A * | 8/2000 | Garvison | H01L 31/02008 136/244 |
| 6,354,289 B1 | 3/2002 | Ridett | |
| 6,559,371 B2 * | 5/2003 | Shingleton | F24J 2/085 136/246 |
| 6,563,040 B2 * | 5/2003 | Hayden | F24J 2/5232 126/600 |
| 6,617,507 B2 | 9/2003 | Mapes et al. | |
| 6,672,018 B2 * | 1/2004 | Shingleton | F24J 2/5205 126/621 |

(56) References Cited

U.S. PATENT DOCUMENTS

| | | | |
|---|---|---|---|
| 6,799,398 B1 | 10/2004 | Plevyak | |
| 7,260,918 B2 * | 8/2007 | Liebendorfer | F24J 2/5205 |
| | | | 136/244 |
| 7,299,591 B2 | 11/2007 | Broatch | |
| 7,454,990 B2 | 11/2008 | Hardcastle, III | |
| 7,531,741 B1 | 5/2009 | Melton et al. | |
| 7,592,537 B1 | 9/2009 | West | |
| 7,600,349 B2 | 10/2009 | Liebendorfer | |
| 7,661,391 B2 | 2/2010 | Sia | |
| 7,745,723 B2 | 6/2010 | Dyson et al. | |
| 7,748,175 B2 | 7/2010 | Liebendorfer | |
| 7,774,998 B2 | 8/2010 | Aschenbrenner | |
| 7,956,280 B2 | 6/2011 | Kobayashi | |
| 8,039,733 B2 | 10/2011 | Kobayashi | |
| 8,136,783 B2 | 3/2012 | Pietrzak | |
| 8,181,402 B2 | 5/2012 | Tsuzuki et al. | |
| 8,336,261 B2 | 12/2012 | Hosking et al. | |
| 8,338,771 B2 | 12/2012 | Park | |
| 8,344,239 B2 | 1/2013 | Plaisted | |
| 8,347,556 B2 | 1/2013 | Stelmaszek et al. | |
| 8,426,792 B2 | 4/2013 | Olsson et al. | |
| 8,459,249 B2 | 6/2013 | Corio | |
| 2003/0015636 A1 * | 1/2003 | Liebendorfer | H02S 20/23 |
| | | | 248/237 |
| 2003/0201009 A1 | 10/2003 | Nakajima et al. | |
| 2004/0011354 A1 * | 1/2004 | Erling | H02S 20/23 |
| | | | 126/621 |
| 2004/0124711 A1 * | 7/2004 | Muchow | F03D 9/007 |
| | | | 307/64 |
| 2004/0144043 A1 * | 7/2004 | Stevenson | E04D 5/00 |
| | | | 52/173.3 |
| 2004/0221886 A1 * | 11/2004 | Oono | F24J 2/5211 |
| | | | 136/251 |
| 2004/0231089 A1 | 11/2004 | Vilarasau Alegre | |
| 2005/0050811 A1 | 3/2005 | Yen et al. | |
| 2005/0115603 A1 * | 6/2005 | Yoshida | H01L 31/048 |
| | | | 136/251 |
| 2005/0144903 A1 * | 7/2005 | Ceria | E04B 7/12 |
| | | | 52/782.1 |
| 2005/0166955 A1 * | 8/2005 | Nath | F24S 25/33 |
| | | | 136/251 |
| 2005/0171644 A1 | 8/2005 | Tani | |
| 2006/0086382 A1 * | 4/2006 | Plaisted | F24S 25/636 |
| | | | 136/244 |
| 2006/0118163 A1 * | 6/2006 | Plaisted | H02S 20/23 |
| | | | 136/251 |
| 2006/0277845 A1 * | 12/2006 | Warfield | H02S 20/23 |
| | | | 52/173.1 |
| 2007/0035841 A1 | 2/2007 | Kinney et al. | |
| 2007/0079861 A1 * | 4/2007 | Morali | E04F 11/1851 |
| | | | 136/244 |
| 2007/0199590 A1 * | 8/2007 | Tanaka | E04D 3/38 |
| | | | 136/251 |
| 2007/0219645 A1 | 9/2007 | Thomas et al. | |
| 2007/0289227 A1 | 12/2007 | Parker et al. | |
| 2008/0012310 A1 | 1/2008 | Weaver et al. | |
| 2008/0029148 A1 * | 2/2008 | Thompson | F24J 2/5239 |
| | | | 136/244 |
| 2008/0035196 A1 * | 2/2008 | Monus | F24S 25/20 |
| | | | 136/251 |
| 2008/0053008 A1 * | 3/2008 | Ohkoshi | H02S 20/23 |
| | | | 52/173.1 |
| 2008/0053517 A1 * | 3/2008 | Plaisted | H01L 31/0422 |
| | | | 136/251 |
| 2008/0087275 A1 * | 4/2008 | Sade | F24J 2/5235 |
| | | | 126/623 |
| 2008/0139106 A1 | 6/2008 | Vachon | |
| 2008/0176504 A1 | 7/2008 | McClendon | |
| 2008/0218307 A1 | 9/2008 | Schoettle | |
| 2008/0236571 A1 * | 10/2008 | Keshner | F24S 25/12 |
| | | | 126/623 |
| 2008/0245399 A1 * | 10/2008 | DeLiddo | E04D 5/12 |
| | | | 136/244 |
| 2008/0245404 A1 * | 10/2008 | DeLiddo | F24S 25/61 |
| | | | 136/251 |
| 2008/0302407 A1 | 12/2008 | Kobayashi | |
| 2008/0313976 A1 * | 12/2008 | Allen | H01L 31/048 |
| | | | 52/173.1 |
| 2009/0045936 A1 | 2/2009 | Miller | |
| 2009/0165843 A1 | 7/2009 | Horioka et al. | |
| 2009/0223142 A1 | 9/2009 | Shingleton et al. | |
| 2009/0241994 A1 | 10/2009 | Lee | |
| 2009/0266353 A1 | 10/2009 | Lee | |
| 2010/0000570 A1 | 1/2010 | Mertins et al. | |
| 2010/0155547 A1 | 6/2010 | Kobayashi | |
| 2010/0206294 A1 | 8/2010 | Blair et al. | |
| 2010/0212654 A1 | 8/2010 | Alejo Trevijano | |
| 2010/0223864 A1 | 9/2010 | Dube | |
| 2010/0235206 A1 | 9/2010 | Miller et al. | |
| 2011/0126378 A1 | 6/2011 | Ota | |
| 2011/0137458 A1 | 6/2011 | Histani et al. | |
| 2011/0167735 A1 | 7/2011 | Sumner | |
| 2011/0209745 A1 | 9/2011 | Korman et al. | |
| 2011/0215213 A1 | 9/2011 | Poivet et al. | |
| 2011/0284057 A1 | 11/2011 | Swahn et al. | |
| 2012/0027550 A1 | 2/2012 | Bellacicco et al. | |
| 2012/0117890 A1 | 5/2012 | Adell Argiles et al. | |
| 2012/0132262 A1 | 5/2012 | Sagayama | |
| 2012/0152877 A1 | 6/2012 | Tadayon | |
| 2012/0199266 A1 | 8/2012 | Potter et al. | |
| 2012/0223033 A1 | 9/2012 | Molek et al. | |
| 2012/0297704 A1 | 11/2012 | Glynn | |
| 2013/0118099 A1 | 5/2013 | Scanlon | |
| 2013/0139468 A1 | 6/2013 | Poivet | |
| 2013/0178951 A1 | 7/2013 | Sandler | |
| 2014/0041321 A1 | 2/2014 | Poivet | |
| 2014/0172176 A1 | 6/2014 | Deilman | |
| 2016/0365825 A1 * | 12/2016 | Poivet | H02S 20/23 |

FOREIGN PATENT DOCUMENTS

| | | |
|---|---|---|
| DE | 202005012993 | 11/2005 |
| DE | 102005039495 | 3/2007 |
| EP | 2422889 | 2/2012 |
| JP | 06229080 | 8/1994 |
| JP | H1113224 | 1/1999 |
| JP | 2000154625 | 6/2000 |
| JP | 2001164713 | 6/2001 |
| JP | 2003343057 | 12/2003 |
| WO | 199835766 | 8/1998 |
| WO | 1999047761 | 9/1999 |
| WO | 2010055235 | 5/2010 |

OTHER PUBLICATIONS

International Application No. PCT/FR2009/001322, International Search Report and Written Opinion dated Jan. 29, 2010.

International Application No. PCT/US2014/024219, International Search Report and Written Opinion dated Jul. 14, 2014.

International Application No. PCT/US2014/030855, International Search Report and Written Opinion dated Aug. 18, 2014.

International Application No. PCT/US2014/030922, International Search Report and Written Opinion dated Aug. 20, 2014.

* cited by examiner

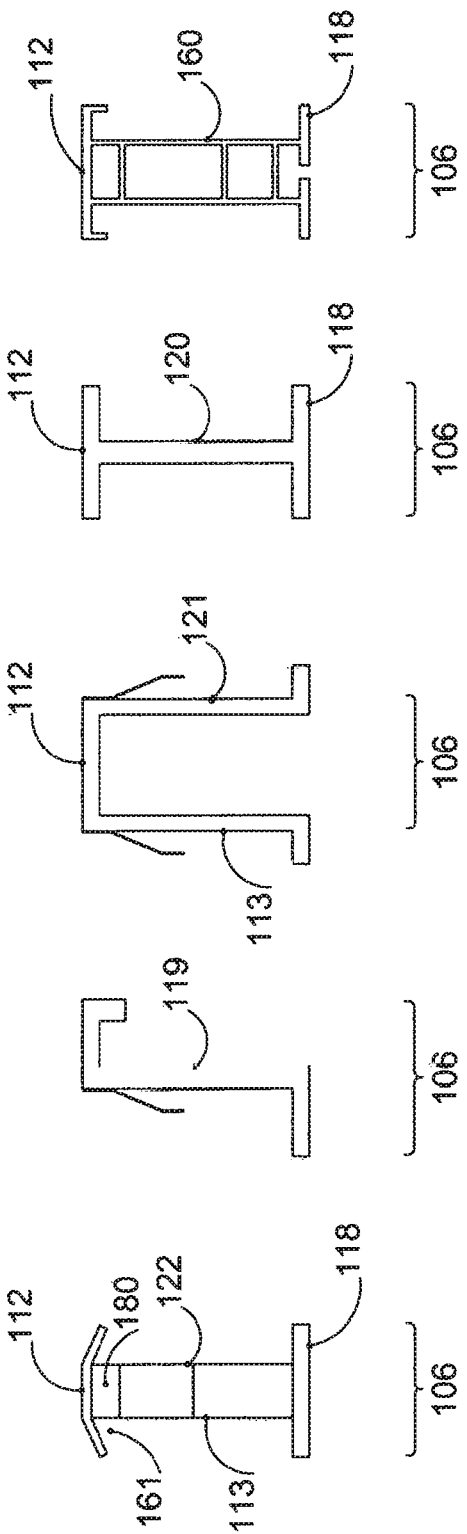

FINISHED MULTI-SENSOR UNITS

CROSS REFERENCE TO RELATED APPLICATIONS

The present application claims priority of U.S. Provisional Application Ser. No. 62/092,793, filed Dec. 16, 2014. The present application is also a Continuation-in-part of: (1) U.S. patent application Ser. No. 13/831,496, filed Mar. 14, 2013; (2) U.S. patent application Ser. No. 13/760,965, filed Feb. 6, 2013, each of which is a Continuation-in-part, and a Continuation, respectively, of U.S. patent application Ser. No. 13/129,378, filed May 13, 2011 (now U.S. Pat. No. 8,794,583, issued Aug. 5, 2014), which is a National Stage Entry of PCT/FR2009/001322, filed Nov. 17, 2009, which claims benefit to French Patent Application Serial No. 0806419 filed Nov. 17, 2008; (3) U.S. patent application Ser. No. 14/217,427, filed Mar. 17, 2014, which claims priority to U.S. Provisional Application Ser. No. 61/801,089 filed Mar. 15, 2013; and (4) U.S. patent application Ser. No. 14/217,288, filed Mar. 17, 2014, which claims priority to U.S. Provisional Application Ser. No. 61/789,607, filed Mar. 15, 2013 all of which are hereby incorporated by reference herein.

TECHNICAL FIELD

The disclosed embodiments relate to building systems.

BRIEF DESCRIPTION OF THE DRAWINGS

For a better understanding of the aforementioned aspects of the invention as well as additional aspects and embodiments thereof, reference should be made to the Description of Embodiments below, in conjunction with the following drawings in which like reference numerals refer to corresponding parts throughout the figures.

FIGS. 1A-1F illustrate a perspective view of a Finished MultiSensor Unit complex and example rail profiles shown in section views, according to certain embodiments of the invention.

DESCRIPTION OF EMBODIMENTS

Methods, systems, user interfaces, and other aspects of the invention are described. Reference will be made to certain embodiments of the invention, examples of which are illustrated in the accompanying drawings. While the invention will be described in conjunction with the embodiments, it will be understood that it is not intended to limit the invention to these particular embodiments alone. On the contrary, the invention is intended to cover alternatives, modifications and equivalents that are within the spirit and scope of the invention. The specification arid drawings are, accordingly, to be regarded in an illustrative rather than a restrictive sense.

Moreover, in the following description, numerous specific details are set forth to provide a thorough understanding of the present invention. However, it will be apparent to one of ordinary skill in the art that the invention may be practiced without these particular details. In other instances, methods, procedures, components, and networks that are well known to those of ordinary skill in the art are not described in detail to avoid obscuring aspects of the present invention.

All or a subset of the solutions, methods, and technologies described herein can be applied partially or wholly or combined to generate various applications.

Although solar cells have recently made progress in terms of efficiency and cost, their deployment remains slow, complicated and expensive. Because of unresolved technology issues, solar panels are still affixed to supporting structures by using labor intensive processes, which face many technical problems such as leaks or structural issues. Overall complexity of selling, designing, installing and inspecting solar systems, combined with low efficiency and complexity, result in high costs and slow penetration of solar solutions. A new approach is described along with the new technologies, components, processes and systems it uses or enables.

The embodiments disclosed herein present solutions that address the above problems.

Figure 1A:
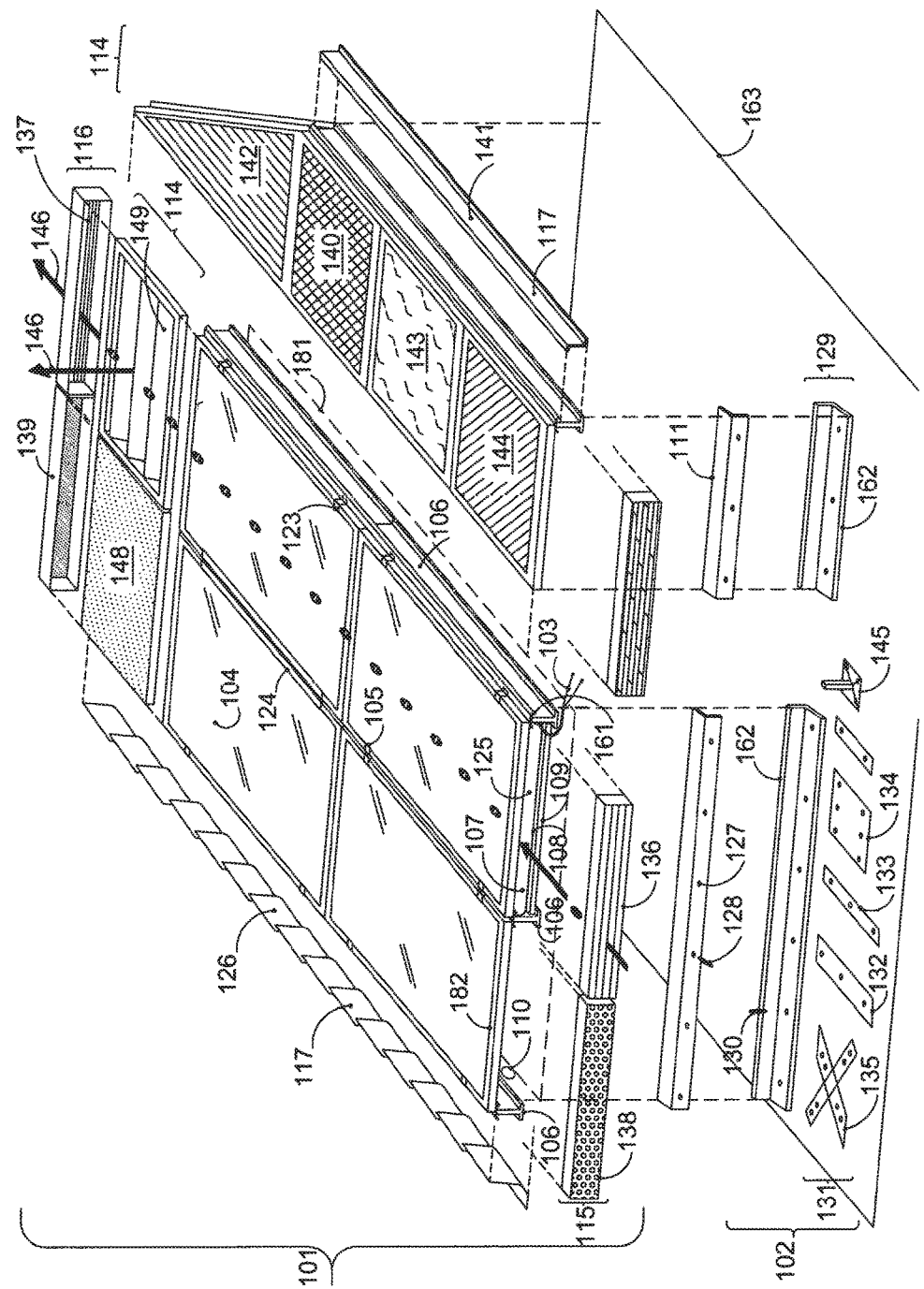

FIG. 1A is a layered perspective view illustrating an example of embodiment of a Finished Multi-sensor Unit equipped with an example set of components and accessories. FIGS. 1B-1F illustrate examples of rail profiles shown in section views. FIGS. 1A-1F also refer to elements described in other figures.

Solar implementation traditionally requires installers to design a system, to procure or fabricate the components needed for the system to work, such as panels, wires, attachment members, etc., and to assemble, attach and connect them. Much labor is usually performed on-structure, often at height, on roofs or elevated structures, which is costly, difficult, dangerous and slow.

A different approach is described: solar systems come as "Finished Multi-sensor Units", also referred to as FMUs, which are blocks of pre-assembled components or mega-components such as panels or solar panels, structural components, production components, other components and accessories, and they allow to install several solar panels or solar panels at a time and to perform a large part of the assembling labor off site. Various embodiments of various sizes, functions, aspects or including various components can be designed and constructed for various applications. In their solar embodiment, FMUs are sets of 6, 8, 10, or any number of solar panels, which along with other components are assembled into blocks that can be moved and installed as a whole. In some embodiments, FMUs also include components such as structural parts, Longitudinal Supporting Components, waterproofing systems, flashing systems, attachment systems, decoration components, or other accessories or components. In some cases, FMUs systems are used to install products or solar systems: many components, for example several solar panels with proper components, are assembled in a convenient place such as a factory or a local or distant shop; these FMUs come as one block that is attached as a whole to the host structure or location so the panels or components do not need to be attached individually, which reduces the onsite labor. The FMU system is designed to meet the requirements of a large number of cases that correspond to the wide variety of cases that exist for example in the construction industry. Therefore, the FMU system is designed to take a large number of embodiments meeting the needs of various projects. Solutions to design, construct and install FMUs for various situations are described as examples and other variations can be designed. Examples of the new technologies, products, systems or processes FMUs need or enable are also described in FIG. 1A and in other figures.

FMUs can be constructed off host structure either on the same site or in a distant shop: for example if a multi component FMU is to be installed on a roof, it is assembled, off the roof, in the form one or several mega components which are moved and attached to the host roof; the crewmembers or the machines that install the FMU on the host location thus only have to deal with one block or with a few mega components instead of many parts thus reducing the onsite labor and bringing the benefits of shop enabled processes. In some embodiments, FMUs are created or sold virtually. In some embodiments, FMUs are made so they can be installed automatically. In some cases, FMUs enable automated design, robotic construction and online sales. The processes of creating FMUs and of connecting FMUs, for example connecting a solar FMU to the electrical grid, can be separate, which allows for large economies of scale. FMUs enable other applications, several of which are described too.

In some cases, FMUs arrive as Plug and Play devices: finished, assembled, wired, ready to connect and ready to affix to a supporting structure when they are not self-standing. FMUs considerably reduce the on-site labor, and enable a better quality control and a higher level of automation at every step of the process from design to completion.

FMUs are a modular system that has many possible embodiments since it can comprise various components that can be arranged in various ways in order to provide different functions or features and to solve a wide range of problems. In some embodiments, a FMU is a roof: it replaces a roof or can be installed in lieu of a roof. In some embodiments, a FMU is installed over a roof. In some embodiments, a FMUs is integrated into a roof or a façade. In some embodiments, a FMU is used for structures that have a roof but it does not fulfill a roofing function. In some embodiments, FMUs are used in structures that are not roofs, such as carports, ground mounts, domestic canopies, façades or other examples. In some embodiments, FMUs are self-standing structural components such as columns, walls or other members. Non solar embodiments of FMUs which use non solar panels can also be designed. A FMU can be fixed or mobile. In some embodiments, FMUs are designed and constructed in order to allow for partial or total automation of one or more of the following: the assembling process or of the installation process or of the sales process.

Some embodiments of FMUs use new technologies, new components, new designs, new tools, new installation techniques and enables new applications and processes. Examples are described.

FMUs can be constructed as one block. In some cases, in order to facilitate their installation on site or their usage, they use components that are to be used before or after the main part is installed; in this case, the FMU is better described as made of several mega-components. In the example of FIG. 1A, a FMU is organized in 3 "Mega Components": a "Production Component" (101) also referred to as PComp, an "Attachment Component" (102) also referred to as AComp and a "Data Component", not illustrated herein since it is data, but in other embodiments FMUs may come in one piece or be organized differently. Other layouts can be designed. The "Data component" includes information such as for example the instructions for mounting or for use, or other soft features or programs. The AComp (102) is to be installed first on a supporting structure. The PComp (101) can be constructed off-structure, transported and fastened to the AComp, which is affixed to a host supporting structure. The FMU is connected to the electrical network or to the data network using cables (103).

In some embodiments, FMUs comprise one or more of the following components: sensor panels, active panels or solar panels also referred to as "Panels", rails also referred to as Longitudinal Supporting Components (LSC), wires, connectors, fixing members, attachment members, clamps, dressing elements, flashing systems, waterproofing elements, insulation elements, decoration elements, information elements, monitoring systems, interaction systems, intelligent systems, structural elements, electrical elements, fire protection elements, boards, grilles, architectural components, actuators, devices, drive systems, control systems, brake systems, communication systems, accessories, or other components. The components may form "Mega components" such as "Attachment Components", "Production components", "Data components".

FIG. 1A illustrates an example of embodiment of FMU with the goal of illustrating what logic is used to develop other embodiments of FMUs in order to meet the requirements of various situations. Many variations of the FMU are possible and they cannot be all illustrated herein.

"Production Component" (101)

In this example of embodiment, a PComp (101) comprises "Panels" (104), attachment "Clamps" (105, 123, 124), "Rails" (106), "Waterproofing barrier" (107), thermal "Insulation layer" (108), rigid "Board" (109), "Sensors" (110), "Transversal beams" (111), and several examples of "Dressing elements" (114). In other embodiments, other sets of components are comprised such as "Lower faces", "Longitudinal beams", "Pipes", accessories, computer systems, or other components. FMUs can be designed with more or fewer components. In some embodiments, FMUs can move or rotate or transform (for example with sun-tracking systems or other applications) or take various architectural forms, aspects, functions or technical designs. In some cases, FMUs are part of intelligent systems.

Panels: Any type of panel (104) can be used such as multi-cell solar panels, photovoltaic panels, solar water heating panels, regular non solar panels, active panels or others. Panels can have any size, orientation, material, aspect or technical specifications. Any number of panels can be used or any combination of various types of "Panels". The example in FIG. 1A illustrates a PComp (101) comprising 4 photovoltaic panels (104). In other embodiments, FMUs comprise any number and type of components and any number and nature of "Panels", such as 1 panel, 2 panels, 5 panels, 9 panels, 10 panels, 12 panels, 84 panels, 90 panels, 96 panels, etc. Panels are attached to rails (106), either attached directly to the rails or secured using clamp systems (105, 123, 124). In some cases, panels are connected and grounded at the same time they are attached.

Rails (106), also referred to as Longitudinal Supporting Components (LSCs) can be installed in any direction, for example parallel to the short or to the long side of the panels (104) or other directions. A FMU comprises one or more rails or other structural components, which can be parallel to each other or not. The rails or structural components are made of one or several parts and can have any size, shape or material or design. The rails can be made of extruded aluminum or folded steel, standard profiles or of any other material or design. The panels or other components such as dressing or accessories, are attached to the rails. In some cases, the rails (106) are attached to a supporting member, such as a "Transversal Beam" (111) or to other members. In some cases, the rails are spaced apart the dimension of a panel (104) and are aligned with the panels' edges, which allows 2 panels to be supported by the same rail like in FIG. 1A. In other cases, the rails are installed so they meet the panel's or the accessories' or the dressings' or other FMU's installation requirements: for example a panel can be installed on more than 2 rails, or a panel can need its supporting rails to be some distance away from the edges. In some cases, the rails are not parallel to each other. In some embodiments, the rails (106) include a top portion (112) and a central portion (113) as illustrated in FIG. 1B and FIG. 1D. In some cases, rails include gutters, drip formers, sliders, or supporting portions (118), as illustrated in FIG. 1B, FIG. 1E and FIG. 1F. Rails can be designed with various dimensions, materials or shapes such as a Z shape (119) as illustrated in FIG. 1C, a I shape (120) as illustrated in FIG. 1E, a Omega shape (121) as illustrated in FIG. 1D, a complex shape (122, 160) as illustrated in FIG. 1B and FIG. 1F, or any other shape and comprise one or several components. The rail's, or the structural member's, shape, height, material or profile can be designed specifically to meet a project's requirements, for example stiffness requirements, channel height requirements, accessories bearing or load bearing requirements, cable tray, or additional functions or features, or other requirements.

Attachment clamps (105): panels (104) are attached to rails (106) either directly, for example using snap systems or fast fasteners or other fastening systems, or using clamps (105). Clamps can be short (123) or long (124). Clamps can be designed so they are attached to the rail (106) and press the panel (104) against the rail in order to hold it. Clamps can have a U shape (124) or a Z shape (123) or other shapes. Depending on the rail design, the clamps can be screwed directly into the rail, or can be attached using bolts adjusted in sliders part of the rail system or other systems. In some cases, a gutter is created in order to collect water penetrating through the clamp attachment screw holes. In some embodiments, the panel (104) frame (182) and the rail, or a component added to the rail or to the panel, have shapes and features that allow the panel to just snap into place without the need of traditional screwing.

Waterproofing: in some embodiments, FMUs are waterproof, or even air tight in some cases. Waterproofing is achieved by using a "Waterproof barrier" (107), also referred to as WB, that prevents water coming from outside the FMU such as rain, or from the inside the FMU such as condensation, to reach below or behind the FMU. Some embodiments of FMUs can be used to provide waterproofing to a place or a structure, for example when used to create a roof, a façade, a canopy, an awning or other structures. In some embodiments, a waterproof layer (107) spans from rail to rail and goes up on the vertical walls of the rails on each side like a flashing system. In some embodiments, a board (109) or a membrane spans from rail to rail and is connected to the rails or to the flashing systems or to the waterproofing systems in a waterproof manner so a waterproof layer is created below or behind the panels. In some embodiments, a waterproof layer spans several rails or is installed below or behind the rails. In some cases, the rails or other components provide drip formers that prevent water from going behind or below the WB. The WB (107) can be made of any impervious material, such as membrane, metallic sheet, plastic, fiber glass, synthetic materials, molded, extruded or formed materials or other materials. Favorably, the system is designed so one waterproof sheet is as long as the FMU or as the rails, so there is no leak. The WB (107) can be self-standing or it can be supported by an underlying material (109) or a board (109). All waterproofing systems can also be designed for protection against other liquids or fluids. In some cases of application, a waterproof membrane is installed on the roof prior to the FMU's installation, whether or not the FMU has waterproofing features. In some embodiments, the waterproofing barrier is completed by flashing systems or it includes flashing elements. Favorably, a WB (107) slips under drip formers (161) on some of its sides such as the lateral sides of a channel and provides drips, flashing or counter-flashing on some sides such as the tips, either in one component such as a formed sheet or in several components. Flashings, drips and waterproofing sheet can be combined in one or several parts. In some embodiments, waterproofing sheet, board, membrane flashing systems and drip formers are made out of separate elements. However, in some embodiments, larger components such as folded or embossed metal sheets, formed or molded sheets or components made out of rigid, flexible or formable material can be fabricated in order to fulfill several functions with fewer components. When FMUs are standardized products, or when they repeatedly used the same components, standardized "Waterproof barriers" or "Waterproof barrier components" can be used. In some embodiments, the WB is self-standing or supports itself from rail to rail or from supporting structure to supporting structure. In some embodiments, the WB lies on a supporting board or on supporting members or lies on an underlying roof or material. When installed on a roof or a deck, the WB (107) or its support can touch the roof or the deck, or it can hover over it with a gap. The gap can be filled with material or not. In some cases, even if the FMU includes a WB, a waterproof membrane or sheet is installed below the FMU, for example on the roof's plywood, in order to obtain an even better level of waterproofing.

Channel (125): In some cases, the WB (107) or the board (109) or the insulation layer (108) are distant from the panels (104) so a space between panels, rails and WB or boards is created, which forms a channel (125) that can be used as a ventilation channel for evacuating or extracting, naturally or mechanically, the heat produced by the panels or for other purposes. Channels may be used to create an air flow (146). The air can enter the channel at one end and exit at the other end. The air intakes can be made in any side of the channel, such as the front, the top, the sides or the bottom of the channel and they can be open or protected by grilles. Air intakes can also be created at any point of the channel's length. Air intakes can be inert or active or controlled. Rails, boards, panels, waterproofing systems, or other components may need to be designed so they allow for creating this channel as needed.

Multi-Function Board (109): in some cases, boards (109) can be installed between rails or LSCs (106), or above, below or on the sides of rails. In some cases, boards are supported by a supporting member (118), or they can be attached to the rail. Boards are often multi-function and are also referred to as "MFBs". "MFBs" can be rigid or flexible and made of any material, thickness or specifications. In some embodiments, the "MFBs" are used to make the FMU more rigid, for example in a plane like a sheathing sheet or a bracing system, or to provide support to various loads such as the WB, accessories or devices. In some cases, loads can be attached to "MFBs". In some cases, insulation boards, or decoration boards or functional boards can be used as "MFBs". In some embodiments, a FMU can be rigid, waterproof and thermally insulating. In some cases, the "MFB" is the WB or is part of it. The "MFB" can be waterproof, made out of waterproof material such as foam, plastic, metal or other materials, and can be sealed, welded, glued or fastened to other components in order to be part of a waterproof system. In some cases, the board is formed, folded, molded or shaped so it provides flashing, drips, seals or other waterproofing or air-tightening features. "MFBs" can span from rail to rail or span several rails or span between the limits of a waterproof system or can be below or above the rails. "MFBs" can be attached to the rails or to supporting structures or they can stay in place dues to their shape or the shape of their supporting systems or be clipped. In some embodiments, boards are multifunction. In some embodiments, "MFBs" are used to provide structural rigidity to a FMU, such as planar rigidity. Other systems such as brackets or bracing systems can be used instead of a "MFB" or in addition to a "MFB" in order to provide structural rigidity to a FMU.

Insulation (108): In some cases, FMUs include a thermal or a sound insulation layer (108) of any thickness or material for example when a FMU is used as a roof or a façade. The insulation material can span from rail to rail or be installed below or above the rails. It may be rigid and self-supported or lie on a supporting "MFB" (109) like in FIG. 1A or on any type of support. It can also be attached below, above or behind a supporting substrate. "Dressing elements" can also comprise insulating material. In some embodiments, insulation can be the "MFB" or can be on the "MFB" or below the "MFB".

Sensors (110): besides solar sensor panels, any kind of sensor can be used in a FMU including for collecting data that may be used in intelligent systems. Sensors such as temperature sensors, wind sensors, movement sensors, azimuth or slope sensors, pressure sensors, light sensors, odor sensors, electrical sensors, torque sensors, hygrometry sensors, infra-red sensors, cameras, microphones, presence detectors, position sensors, or any other kind of sensor can be used.

Transversal beams (111): in some cases FMUs use strong LSCs (106), which provide rigidity in their longitudinal direction. If the FMU is to be transported, moved or craned without excessive deflection, it may also need rigidity in the transversal direction. In some cases, "Transversal Beams", also referred to as TBs are a permanent or a temporary component of the FMU and make the FMU stiffer by providing rigidity, which means the FMU, thanks to its TBs, can span larger distances in both directions between supporting points and thus be attached or supported in fewer points also referred to as "Fastening points" (127). Two solutions can be used: either the FMU is rigidified during the transport phase using reinforcing frames, jigs or bars that can be attached to the FMU and removed afterwards, or the FMU is built structurally rigid in one or several directions by using the transversal structural components, also referred to as TBs (111). The LSCs (106) may be attached to one or several TBs by "Attachment members". The design of the TB can be calculated according to the loads and functions.

In some embodiments, FMUs have 1, or more TBs (111), for example located substantially close to the ends of the rails or at a distance from the ends, and each one of the 1 or more TBs may need to be supported in 2 points or more. The TB, in some cases of application, can also be fastened to a pre-installed AComp (102). In some embodiments, a FMU may comprise more than two TBs. Not all of the TBs (111) are necessarily used to provide fastening to a supporting structure. In some cases, sheathing systems or bracing systems or "MFBs" can be used to complement the "Production component's" (101) rigidity. In some embodiments, thanks to this technology, a small or large PComp can be supported in only four "Fastening points" (127); any other number of supporting points is possible. The screws, bolts, or other systems used to fasten the PComp to a supporting structure or to an AComp are referred to as "Main Fasteners" (128). In FIG. 1A, an example of TB (111) is illustrated as a reversed L profile but it can be any type of beam including channels, tubes, special profiles or wide flange beams for long spans or large FMUs. The TB can span below the rails, above the rails, at the tip of the rails or be in any location an have any design.

"Attachment Component" (102).

FMUs can be used in a great number of cases such as roofs, façades, ground mount, carports, domestic canopies, self-standing structures, or other cases. Installing a FMU that arrives on site as a ready-to-mount block is a very different process than constructing a system on site, by attaching components individually, layer after layer. In some cases, this FMU includes attachment parts that are used to connect the FMU to a host structure. These attachment parts can come as a block or as separate parts that are to meet the FMU's requirement. The attachment system can take various forms depending on the needs. It is referred to as the "Attachment Component" or "AComp".

In some embodiments, creating a multi panel solar system on the roof of a house or on a structure using an off-structure constructed multi panel FMU reduces the labor to essentially attaching the PComp (101) to the AComp (102), instead of crews traditionally going on the roof and attaching each panel in several points, one at a time. If an example of embodiment wherein the AComp comprises 2 horizontal supporting structures on which the two transversal beams of the PComp are to be attached, affixing the FMU to the roof structure may require only attaching 2 or more "Main fasteners" on the top and 2 or more "Main fasteners" on the bottom, or 2 or more series of fasteners, for example one in the top and one in the bottom, which makes the installation process much simpler, much faster and automatable. In some cases, the location and the design of the transversal beams and the load spreaders may need to be close to the edges so a crewmember or a machine can easily attach the "Main Fasteners".

FMUs can be installed on new structures, such as buildings, carports, canopies, etc., that can be designed to take advantage of FMU's properties and to meet their requirements. In this case, using FMUs may enable innovative architectural or technical designs as well as new construction, maintenance and sales processes.

FMUs can also be installed on pre-existing structures. Installing equipment, such as solar systems or architectural elements, on existing structures, especially on roofs, has been complex and costly because of two major problems: leaks and loads.

Leaks: affixing an equipment to a structural member, using screws or nails, often requires piercing the waterproof layer the structural member is protected by, thus creating a risk of leaks.

Loads: a new equipment adds loads to the existing structure and may cause structural problems, especially when the load is applied to weak supporting members.

FMUs allow for solving the problems of leaks and loads, and for reducing the costs and risks, or for making the whole process simpler.

Leaks:

Traditional solar systems are generally affixed to supporting structures by many screws, bolts, nails or fasteners, which, when installed on roofs, create holes in the waterproofing sheet and potential risks of leak. Precautions are usually taken by using sealing or flashing solutions for each point, but this is very costly and not 100% efficient, and leaks occur frequently.

Using FMUs appropriately designed "AComps" can reduce considerably the number of attachment points of the FMU to the host structure, thus reducing the number of roof penetrations (in the case the FMU is installed on a roof or any waterproof system), and thus reducing the risks of leak. A FMU system can be designed in order to support a large number of panels, or large area of any type of FMU, with only a few Fixing Members.

Using waterproof embodiments of FMUs allows for reducing even more or for eliminating the risks of leaks: if a FMU has to be designed in such a way that it is attached to a roof or a waterproof structure and thus needs roof penetrations (in some cases, the FMU system allows for designing non penetrating solutions: see other figures), the points where the FMU or the AComp is affixed to the supporting structure, also referred to as "Fixing points", can be protected from water by using a waterproof FMU. With a waterproof FMU the attachment points can be positioned in an area that is protected by the waterproof FMU so that no water is on the roof and can sneak into the Fixing points and create leaks. In some cases, a waterproof FMU can also be used to provide the waterproofing function to a structure and, for example, be used instead of a building's roofing system.

In some cases, using a FMU that is waterproof on part of its area or on all its area may not be sufficient: some water, coming for example from the uphill side or from the lateral sides of a roof on which a FMU is installed, may however sneak below or behind the FMU. For example water can be pushed downward by gravity, or pushed laterally by the wind or a lateral slope. In these cases, two solutions are proposed: either make the "Fixing points" waterproof, or block water outside the FMU's perimeter by using "Waterproof curtains" as described in other figures.

Examples of solutions are illustrated in other figures, especially in FIG. 3-9

Therefore, the leaks problem can be solved by placing the "Fixing points" beneath or behind waterproof embodiments of FMUs or within the FMU's perimeter flashing systems but the consequence is that the "Fixing points" lie beneath or behind the FMU and may not be uneasy to install. Installation is made easy by splitting the FMU into 2 parts: an AComp is installed first and a PComp is then attached to it.

Loads:

With pre-existing structures, for example existing buildings, two load related issues need to be solved:

The "Fastening points" location and characteristics need to meet the FMUs requirements and location.

The loads are concentrated in fewer points, and the designer needs to make sure the supporting structure can accept these loads.

Using FMUs allows for solving these problems.

An AComp (102) is used: once it is installed on the supporting structure, the PComp is attached to it by "Main fasteners" (128). The AComp, no matter how it is affixed to the supporting structure, can provide the "Fastening points" (127) the "Production component" (101) needs. Several types of supporting structures or of attachment systems can share the same "Fastening points" (127) design, which allows for large standardization of the products, installation processes and tools. Many embodiments of AComps and PComps can be designed in order to meet the requirements of a wide range of cases.

The AComp is a "Mega component" that includes all the parts needed to provide support or connection to the PComp and therefore the "Attachment component's" design may differ depending on the project or the case to be solved or the PComp design. In some cases, the AComp comprises "Attachment pods" (145) that are affixed to a roof's structural member, rafter or purlin and each "Attachment pod" provides a "fastening point" to a "PComp"; in some embodiments, the AComp works like a beam system that transfers loads from the points where a PComp needs fastening to the points where a supporting structure can take these loads; in some cases, the AComp comprises columns and supporting arms or mobile systems or other structures, like in carports or domestic canopies, or flat roof buildings or ground mount. In some cases, the AComp comprises "Load spreaders" (129) or "Spreader legs" (131, 132, 133, 134, 135) as described below. The AComp can come as an off-structure assembled block or as a set of components to be installed.

When the host structure is too weak to accept the FMU's concentrated loads, for example in the case of existing buildings with metal or wooden structure and metal sheets or plywood sheets supporting a roofing material, "Load spreaders" (129) can be used.

"Load spreaders" (129) are systems designed to support the "P Comp". In some cases, they are designed to turn a concentrated load into a load that is distributed either on a larger area of supporting sheet or on a larger number of supporting members such as rafters, purlins or beams so each "Fixing point" has less load. Instead of supporting a system by few difficult to make, complex and expensive points, FMUs and "Load spreaders" allow using a larger number of basic and inexpensive points that crew members or robots can install quickly. "Load spreaders" can be affixed to any type of underlying structure using "Fixing members" (130), which can be of any kind, such as screws, bolts, glue, or others. For example, the "Fixing members" can be bolts attached to a metallic structure, screws or nails affixed to underlying wooden purlins, screws or nails affixed to an underlying plywood or other kinds of sheets, or other fasteners. In some embodiments, the "Load spreaders" (129) divide the concentrated loads transmitted by the "Main fasteners" (128) by the number of "Fixing members", which are spread on a large area of supporting material such as plywood, metal sheet or any supporting material or structure; in other cases the "Load spreaders" distribute the concentrated loads transmitted by the "Main fasteners" (128) to several "Fixing members" (130) affixed to several rafters or purlins or structural members. If the underlying structures such as purlins or rafters are not visible, they may be discovered using tools such as stud finders or other tools, either manually or robotically. In order to spread this load, "Load spreaders" can use "Load spreader legs" (131) or larger plates, or other systems.

A "Load spreader" (129) can be a punctual pod (145) providing support to a "Main fastener" (128), and possibly spreading the load on a large area using plates or legs (131), or it can be a beam that spreads the load on a greater length. In specific some embodiments, "Load spreaders" (129) are beams as long as the "Production component's" transversal beam, which provide room for fastening the "Production component's" (101) TB to the "Spreader beam" in one or several points. In the example illustrated in FIG. 1A, a TB (111) is connected to rails (106), both are part of the PComp (101). The TB (111), as wide as the FMU, is connected to all of the rails (106). TBs can be connected to LSCs in any way, such the TBs can be below the LSCs, above the LSCs or within the LSCs height, they can be at the tip of the LSC or distant from the tip. TBs may be pre-pierced to facilitate the installation. In this example, the AComp (102) comprises a "Load spreader" system (129), which may comprise a "Spreader beam" (130) and in some cases "Spreader legs" (131). In the example of FIG. 1A, the "Spreader beam" (162) is as long as the TB but in other embodiments it could have a different size or there could be several smaller "Spreader beams". In this example, the "Spreader beam" (162) is an L profile and it is designed to match the "Transversal beam's" (111) profile, but the designer can use any other set of profiles or designs. The "Spreader beam" can be affixed to a supporting structure by "Fixing members" (130), for example screwed to a plywood sheet or screwed or nailed through the plywood into underlying rafters or purlins. If needed, the "Spreader beam" can be supported by "Spreader legs" (131), which allow for dividing the load by an even larger number of "Fixing members" (131), which are spread on a larger area.

"Spreader legs" (131), "Spreader beams" (162), or "Attachment pods" (145) can either rest directly on the supporting structure or hover over the structure using spacers so water can pass below or between them. Spacers can include waterproofing systems such as seals or waterproof screws. Spacers and adjustment blocks can also be used to make up for lack of flatness in the supporting sheet or structure. FIG. 1A illustrates a few examples of "Spreader legs" such as long legs (132), short legs (133), plates (134) or multi member legs (135) among many other possible embodiments.

In some cases, "Load spreaders" (129), "Spreader legs" (131), "Attachment pods" (145) or AComps (102) are affixed to an existing roof, either after the covering material such as tiles, shakes, shingles, etc., has been removed on all or some of the area of the FMU, for example in order to remove weight, or removed only on the area needed to attach the Fixing components, or on top of the non-removed covering material such as shingles, which is faster. When "Load spreaders", possibly including "Spreader legs" are installed, for example screwed or nailed, on top of non-removed shingles, their sole that rests on the roof may include seals so no water flowing on the roof sneaks into the fixing holes, and sealing washer or other sealing systems can be put around the screw or nail. This way it is possible in some cases to install "Load spreaders" directly on a roof without removing the covering material and without creating a "Waterproof curtain". This job of installing "Load spreaders" without flashing or roofing removal can be done by crews or by automated machines that in some cases have information about the expected location of the "Load spreaders", the nature of the roof or the supporting structure, and about their own 3d positioning. The exact design of the AComp depends on the supporting structure, on the PComp and on other factors. In some cases, the AComp only consists in a few attachment points such as pods for example and the PComps fits on them. In some cases, the attachment points are part of the PComp and come with it for direct attachment without the need for an AComp.

In the example of FIG. 1A, the AComp (102) is to be affixed first to a supporting structure (163). The PComp (101) is to be driven down to the top of the AComp (102) so the TB (111) fits on top of the "Spreader beam" (162). Exact positioning may be manual or automated, possibly using positioning data part of a "Data component" provided with the FMU, possibly compared to 3D measurements performed after the AComp was installed in real time. When in position, "Main fasteners" (128) are installed manually or robotically, thus securing the FMU onto the building or the supporting structure.

"Load spreaders" can also distribute the load from structural member to structural member, for example from rafter to rafter. Each "Load spreader" can have any shape, size, material and design; "Load spreaders" can be individual pods or longer beams, or beams plus supporting legs, both of any design and material, and spread the loads on an even larger area. When the "Load spreader" is a beam, it can be affixed to a supporting structure by as many "Fixing members" as necessary, and it can be designed so it provides strong "Fastening points" to a "Production component". For example, a "Load spreader" can be affixed to a roof by 15 "fixing members" but support a PComps by only 2 "Fasteners", or 2 "Fastening points": it concentrates the loads. Other numbers are possible. In some cases "Load spreaders" enable to give the location of the "Main fasteners" some degree of independence relative to the host building's supporting structure, which allows for using standard FMUs, anywhere regardless of the supporting structure. Installing many "Fixing members" this way can be done manually or robotically.

In traditional solar applications, using many screws or nails to affix the panels to a roof is a major problem because it may involve piercing the roof's waterproofing sheet in order to reach the underlying structural components, which may cause leaks. Using many "Fixing members" as described above could result in the same problem, but when waterproof FMUs are used and properly installed the holes are not exposed to water. So, regardless how many holes are made in the roof, the FMU concept may allow to design the system described that allows no water to be present nor to leak through these holes.

Therefore waterproof FMUs allow for spreading the loads by multiplying the fixing holes and the "Fixing members" and many roofs or structures that previously needed to be reinforced prior to installing any equipment on them can now support FMUs. Installing the supporting points becomes easy since, in some cases, it mainly consists in nailing or screwing many "Fixing members" on undifferentiated surfaces with very little preparation, which means it can be done quickly by crews or automatically by machines. In some cases, sealing systems are used for with "fixing members" so no leak is created.

In some cases, even if water coming from above is stopped by the FMUs, it may still be necessary to stop water from coming from around the FMUs, for example water flowing on a roof a FMU is installed on or integrated into. The solutions for creating a "Waterproof curtain" around the FMUs are described in other figures.

In some embodiments, "Spreader beams" and TBs are combined in 1 component. In this case, PComp and AComp may be combined and installed in the same time, which in some cases allows for a simpler installation process in 1 step only.

Cable, data. FMUs may output power, especially when they comprise photovoltaic panels. They may also use or produce data. In some cases, FMUs include internal cable trays or cable circulation systems, including cross rail connections.

FMUs may produce electricity or data or use electricity or data or both. FMUs may be part of complex systems such as building or home energy management systems and exchange data or modify settings according to system's directions. Some embodiments of FMUs comprise electrical devices that need or produce power or data, such as motors, sensors, computer systems, lights, cameras, 2D or 3D vision systems, heaters, coolers, sound systems, display devices, mobile or active parts, intelligent systems, power plugs, or other equipment or accessories.

In some cases, FMUs also include easy connection systems so that connecting a FMU to a network can be done by connecting very few cables or plugs: in some cases, a large FMU comprising many solar panels could be fully connected using only 1 or 2 cables per string, or even less if micro-inverters are used, and 1 cable for grounding and sometimes 1 or several cables for data.

In some cases, "Super plugs" can be used. "Super plugs" are plugs that include several or all of the electrical connections a FMU needs to make, in order to make connections easier, faster, more standardized and more reliable. "Super plugs" may be used for electrical power connections or for data connection, or both. "Super plugs" can be standardized so the FMUs and the host network have the same type of connectors easily pre-installed. In some cases, the FMU comes in one block and its "Super plug" connects to the "Super plug" of a host network or of a supporting structure. In some cases, a "Super plug" comes with the PComp and connects to a "Super plug" attached to an AComp. In some cases, attaching the PComp to the AComp or attaching the FMUs to its supporting structure also connects the electrical or data systems in the same time.

When FMUs use photovoltaic panels or electrical panels or devices, the panels or other devices may need to be connected and grounded. In this case, grounding components can be included when the FMUs are off structure constructed before transportation. Metallic components such as rails may be connected in order to provide contact, communication or grounding. Favorably, panels are grounded in the same time as they are attached to the rails for example via the screws or using grounding washers or cables or other systems. The rails may be connected so they directly provide grounding.

If photovoltaic panels are used, they may use micro-inverters that output AC current, which means AC cables have to be run out of the FMUs and connected to the host network. If regular inverters are used, the panels may be connected in strings, which have to be connected to inverters. Inverters may be either attached to the FMUs, on the PComp or on the AComp, or be elsewhere.

FMUs may need electrical boxes, electrical panels or other electrical equipment, which, depending on the embodiments, can be part of the FMUs or not. In some embodiments, FMUs arrive as Plug and Play devices, completely wired and finished, that one only has to plug, and in some cases attach, for them to start working.

If liquid systems are used, such as solar water heating panels, cooling or heating systems, lubrication fluids, or other liquids or gases, the FMUs may include fluid circulation networks inside and easy connection to host networks outside.

The "Data component" may come with the FMU and include any set of data such as with mounting kits, plans, instructions or other data that designers, clients, installers, maintenance people, permitting authorities, service providers or professionals may need. The "Data component" package may include soft components such as engineering components, such as mounting instruction or positioning data, measurements, plans, 3D positioning data or instructions, testing protocols or results, track records, components or systems identification, data base entries, connection protocols, identification systems, as well as marketing components, complete service and interaction for many years, financing components, permitting components, mounting components and others. The "Data component" can also be utilized when automated processes are used. For example, a robotic mounting machine can use 3D data and other data. The data can be of any type such as 3d measurements or information, fabrication records or processes, testing processes or records, sales data, site data, mounting or operation instructions or any other data.

The exact location of the attachment points and the exact knowledge of the components and of the supporting structure's specifics are key to the operation's success and accurate initial measurement and computerized design can make the process much more efficient. In some cases, the whole installation process can be partly or entirely robotized and may require little or no human labor. Same is true for the design and measurement processes.

FMUs are modular products that can easily be made in various sizes or configurations. In some embodiments FMUs can be built out of a set of standardized components such as various types of panels, of rails, of mounting systems, of accessories, of features, of aspects, etc., which combined together allow for creating a very large palette of embodiments. An ever wider range of applications can be created by combining together various embodiments since several FMUs can be arranged together to form larger projects.

When taken to industrial scale, FMUs become a standardized product that people get used to installing, designing, permitting, maintaining, and buying. The whole solar process, or any other implementation process, is thus made simpler and more affordable.

Due to the variety of their embodiments, "FMUs'" can be presented and marketed by lines of products, which can have various sizes, shapes, power, aspect, finish or specifications, and which can solve many particular cases and target various markets such as domestic of various styles, commercial of various styles, carports with several models, domestic canopies, ground mount, or other products. FMUs can also be seen as Plug and Play products that can be selected, configured or customized and sold online and installed robotically as described in other figures. Examples of some of these embodiments are illustrated in other figures.

However the range of cases to be addressed is very large and no line of product can fit them all. Therefore, FMUs can also be personalized, customized or completed with various features, accessories or dressing components, in order to reach any shape, size, aspect or technical requirement.

Specific embodiments can be designed by combining, removing, adding or tuning components or settings such as number and type of panels, number and type of rails, location and geometry of the rails, type of mounting system and attachment system, ventilation channel, waterproofing solutions, gutters, flashing, airtightness, hot air extraction, thermal insulation, thermal components, additional functions such as sensors or intelligent systems, electrical systems, type of under layer, etc. Any component can exist in several versions and, in some cases, different versions can be combined, thus allowing a large number of configurations.

Additional elements referred to as "Dressing elements" can be added in order to customize the FMUs even more in order to achieve any shape, size or function such as technical requirements, added functions or specifications, or architectural requirements. For example, it is possible to create FMUs of any shape, in 2D or 3D, such as triangular, square, curbed, trapezoid, or to match a roof's shape and size or to meet a designer's desire or for any reason. "Dressing elements" can be used to extend the FMUs wider or longer or thicker, or to give it more features or to change its aspect and to customize it in any way. "Dressing elements can have any shape, size, material, design or function, and can be solid or hollow, walkway, gratings, or grilles, embossed, flat, or decorative, opaque, transparent, luminous, inert, active or intelligent. "Dressing elements" are generally part of the off-structure constructed FMU but can in some cases, they may be mounted independently. "Dressing elements" can be self-supported or can use rails (106) or rail variations or other supports. "Dressing elements" comprise for example "Top dressing elements" (114), "Lateral dressing elements" (117), "End dressing elements" (116). "Dressing elements" may fulfil additional functions, have a different finish or have shapes or sizes or aspects different than the one provided by the only panels (104). "Dressing elements" are often used to adjust the size of a FMU to a dimension different from that of the panels, or to adjust functions or the look and feel of the FMU. Panels can also be used, such as plain panels, luminous panels, sensor panels, information panels, active panels, etc. For example, a FMU may need to be larger, wider or thicker than the only panels set and use "Dressing elements" for this purpose. In some cases, "Dressing elements" can also provide flashing, connection, sensors or others functions. In some cases, "Dressing elements" have an aesthetic purpose. FIG. 1A illustrates an example of FMU using "Top dressings" (114), "Lateral dressing" (117), "Lower face" (181), "Front dressing" (115) and "End dressing" (116). "Dressing elements" can be fixed or mobile or active: for example, ventilations grilles can be fixed or opening, or removable, or they can have automatic status detection (for example for checking if they clogged, dirty, of for measuring the flows, etc), or they can have automated cleaning devices or maintenance devices or status changing systems. Examples of FMU personalization are illustrated in other figures.

Flashing (126): in some cases, for example when they are integrated into waterproof systems such as roofs or other structures, FMUs need to use systems to provide waterproof sealing to connection areas. Components, also referred to as "Flashing elements" (126) are used: when a FMU is waterproof, it can, in some cases of application, replace a roof or be integrated into a waterproof roof and a connection may need to be made with external waterproof systems. "Flashing elements" can be used, such as flashing sheets installed on the edges of the FMU, or on the rails, or on "Dressing elements" or on the TBs, in order to prevent water from flowing below the FMUs or to provide sealing when the FMUs connects to a wall or another roofing component. In some cases, "Flashing elements" are hidden by "Dressing elements". "Flashing elements" can also be used inside the FMU, for example around the edges of a waterproof layer. Several examples of FMUs using flashing systems are described in other figures.

In some embodiments, FMUs comprise a "Lower face" (181), which may be customizable too, have various shapes, materials or functions. In some embodiments, the "lower face" can handle various functions such as supporting loads or accessories. It can also be visible like in a domestic canopy and be personalized. Examples are illustrated in other figures.

"Lower face" and "Dressing elements" can also be fixed, mobile, removable or interchangeable and include accessories such as light systems, sound systems, temperature control systems, sensors, image capture systems, technical systems, active devices, luminous systems, decoration or architectural elements or any other component or feature. Examples of dressing elements are provided only to illustrate how wide the range of possibilities is.

FIG. 1A illustrates an example of embodiment wherein the FMU includes 4 panels (104), which are attached to parallel rails (106) using two examples of clamps (123, 124). Any other size, type and number of panels, number and length of rows of panels could be used. In this embodiment, the rails are aligned with the panels' edges. In other embodiments, the rails could be oriented differently and not necessarily aligned with the panels' edges. In this example, the rails are attached by screws or bolts or glue or welding to TBs (111) but they could be attached to another structure. The rail (106) has a central portion (113) made of 2 substantially vertical walls (but it could be only one wall) spaced apart so a waterproofing sheet going up on the side of each wall can be screwed through the wall on each side without piercing the other side; and a top portion substantially perpendicular to the walls, where the panels are attached. The central portion (113) is oriented so it provides sufficient distance between the top portion (112) and the attachment portion. The attachment portion (118), favorably united to the central portion (113) provides contact with the supporting structure. Each of these portions is shaped according to the needs. In this example, the top portion is wider than the central portion and overhangs in order to form drip formers (161) under which flashing or waterproofing elements can be water-protected or in order to attach optional parts such as cable trays, gutters or others. Drip formers could also be designed another way. In some cases, the top portion or the bottom portion of the rail include a slider in which a nut can slide and allow for attaching loads, clamps or panels. In some cases, a hollow (180) is created below the top part in order to create an internal gutter or a channel so the water that might leak by the screw holes when a clamp is screwed into the top part is collected and evacuated away. In this example, the two rows of panels are set differently: one row is equipped with a waterproof barrier (107) that creates a channel (125), which can be used for ventilation (146) or for other purposes such as maintenance or data collection. The other row includes no closed channel and ventilation is achieved by air flowing freely. However, boards or insulation, or waterproofing could be used if needed. The WB spans between the two rails and goes up on the rail's wall on each side as a flashing system where it slips behind a drip former. The waterproof barrier may be self-standing or rest on a supporting board (109) or on a layer of insulation material (108), which can be a rigid board or any other material. It can be made of various materials such as membrane, molded or synthetic materials, a metal or aluminum sheet. In this example, it is made of a folded aluminum sheet that spreads all the length of the channel without any junction or seal and thus leak-free. It is attached to the rail on the upper part of the lateral banks, for example screwed, nailed, riveted, stapled, glued or maintained by a mechanical system. The rails are supported by a TB (111) which is supported by an AComp (102) that has been described earlier.

FIG. 1A illustrates an example of a customized FMU using examples of "Dressing elements". In this example, the ventilation channel (125) ends are customized using a "Front dressing element" (115) that is a grille or louvres of any type (136) with an example of material and an "End dressing element" (116) that is a grille of any type (137). The row that has no closed channel illustrates examples of non-breathing "Dressing elements": a "Front dressing element" (115) that is a plate with a specific pattern or aspect (138) and the "End dressing element" (116) that is a solid block (139) of any shape with another example of material. In this example, "Dressing elements" are supported by rails but other supporting solutions can be used. On the right of FIG. 1A are illustrated four examples of "Top dressing elements" (114, 142, 140, 143, 144) using various materials. One of the "Top dressing elements" (142) is not rectangular: it illustrates the fact that FMUs can have any shape regardless of the panels' shape. In this example, the FMU uses also "Top dressing elements" (148, 149) at the bottom end of the panels' rows. They can have any shape or material, such as solid (148) or ventilation grilles (149) or any other shape. This allows to create FMUs that meet many requirements such as for example matching the shape of an existing roof.

FIG. 1A also illustrates examples of "Lateral dressing elements" (117): on the right side is a finishing plate (141) used for architectural purposes, for example for making a nice color or for hiding a lateral flashing system.

In another example, the FMU could be tuned to match the environment's characteristic such as the color or material of a roof or any kind of tuning that may be desired. Some parts may be raw material, some parts may be painted, some parts may be coated or covered or dressed, some parts may be shaped, deformed, engraved or sculpted, etc.

On the left side of FIG. 1A is a lateral dressing element (117) that can be used as a "Flashing system" (126). It could also be used with or hidden by an additional "Lateral dressing element" such as the one illustrated on the right (141). A "Lower face" (181) is also illustrated.

Wires (103), for power or data, or fluid hoses, may come with the "P-Comp".

A FMU may come as a totally finished or as a to-be-finished product.

Other embodiments of FMUs include active FMUs that can move or rotate or transform (for example with tracking systems) or that can take various architectural forms, aspects or functions or various technical designs or that can be part of intelligent systems. Other embodiments of FMUs include portable 'TMUs", foldable FMUs, self-standing FMUs that can be either fixed or using a hinge, or rest on 2 or more legs and be either fixed or rotating on a horizontal axis like for a domestic sun-tracking canopy, or rest on 1 leg and be either fixed or rotating on a horizontal or vertical axis or that comprises foldable parts. Examples are illustrated in other figures.

Embodiments of FMUs can be fixed or mobile such as rotating on a horizontal axis for example in a carport application, or may interact with the environment and may take advantage of an additional sun light using a reflecting surface such as a mirror, a metal sheet, a layer of water or other liquid, or any reflective environment.

Since FMUs are easy to mount and are rigid, they can be used in mobile or moving applications, and since they can be equipped with sensors and wires, they can be used to create a large range of intelligent or robotic systems. FMUs can be part of more complex systems such as buildings, machines, robots or devices. Active sun-tracking carports or domestic canopies are examples of products created using FMUs.

In some cases, the FMU is tested before it leaves the assembly shop. The FMU can be finished and tested in every aspect such as mechanically (for example panel attachment's completion, resistance, rigidity, planeness, etc.), electrically (for example connection, efficiency, grounding, panel flashing, etc.), architecturally (for example control of the aspect, control of the dimensions, control of waterproofing, dimension controls, colors, materials, code complying, shapes or planeness, position of the handles), testing of any functional systems. The test results can be recorded and stored in a database or provided to the client as well as all the prefabrication data such as mounting processes, screwing torque, as well as the components' sourcing, testing, processing, etc., traceability. In some cases, each FMU can be identified and tracked with an identity code. The fabrication process, as well as the installation process or everything happening at the host location, can also be recorded by cameras, various sensors, and systems recording the actions performed by robotic systems or people as well as the environment. A FMU can also be equipped with auto control systems either for its making or for its further use and life. The prefabrication system can drive the supply chain and sourcing process, test and control the supplied components before using them and record the data. The FMU can be constructed on a mounting frame or table, on the ground or on other systems. Off-structure construction can use automated or partly automated processes such as automated or partly automated positioning of the components, automated or partly automated fixing of the components (such as screwing, soldering, welding, positioning, installation) or use some level of manual labor. Manual operations can be mixed with automated or semi-automated operations, including in the case of customized products.

Figure 2:
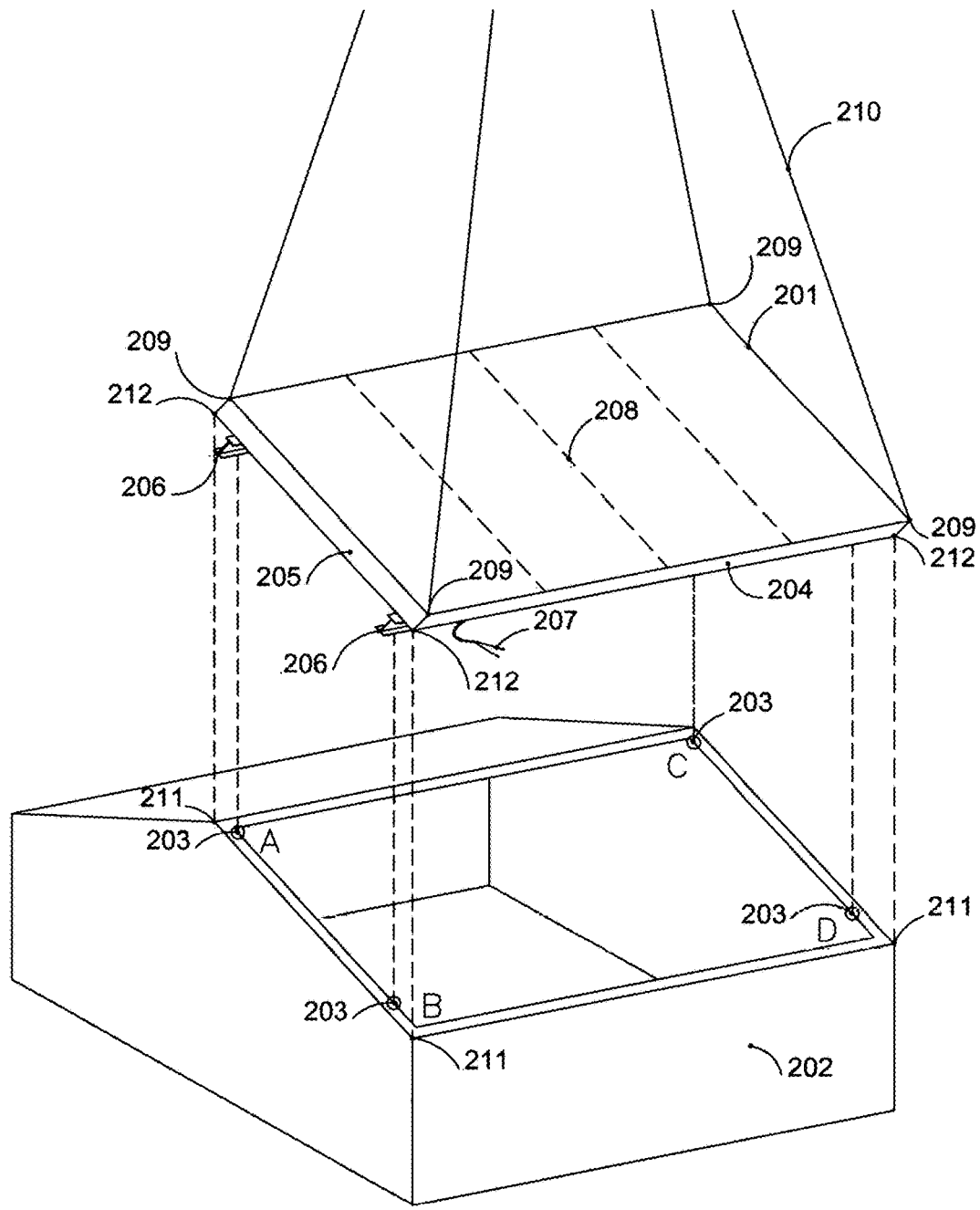
FIG. 2 illustrates a perspective view of a Finished MultiSensor Unit complex used as a roof, according to certain embodiments of the invention.

FIG. 2 is an exploded perspective view illustrating an example of utilization of a FMU (201) as a replacement for a roof, or in lieu of the roof of a structure, or as a component of a structure. It could also be used as a façade, or any other part of a structure. In other cases of application, FMUs or other systems are to be installed on a structure instead of in lieu of a roof. FIG. 2 also refers to elements that have been described in FIG. 1A or in other figures.

In the example of FIG. 2, a FMU (201) which has been built off structure, either onsite or in a distant shop, is attached by lifting points (209) to a lifting or moving system (210) and moved, craned or lifted on the top of a building (202). Key points (212) of the FMU are to match key points (211) of the host structure. FIG. 2 also illustrates an example of process for installing one or more FMUs on a host structure (202) by craning off site constructed FMUs onto a prepared roof or structure of any kind, as well as methods for gathering information, designing, fabricating and installing FMUs or other systems on host structures.

In some embodiments, FMUs can be used as roofs or façades in new or pre-existing structures. In this example, the FMU is the whole roof of a structure, but it could be only a part of a roof or of a façade. The roof or the façade to be created can be made of one, as in this example, or several combined FMUs. The FMU can be built in place or it can be built off-structure and be transported to its final location.

In this embodiment, the building or the structure (202) may have been designed with FMUs in mind and the "Fastening points" A, B, C, D (203) have been built accordingly. In other cases, the building could be existing and need a roof replacement. In some cases, an AComp has to be installed in order to provide the FMU with proper "Fastening points" (203). The FMU can also be designed specifically to meet a host structure's (202) requirements. FMUs can be created in many versions and can be customized, such as adapted in size, material, aspects, features or functions. The designer of a building can choose from many preset configurations or get a FMU built to particular specifications.

In this example, one large FMU is being used. It has been built off-structure and it is being lifted in one piece (in some cases, several FMUs could be used) to a destination structure (202). The FMU is a full roof, solar and photovoltaic, complete with its own structure. It is made rigid by LSCs (208) and 2 TBs (206), which due to the large size of the FMU are in this example 2 strong beams and each beam only needs to be fastened to the supporting building in 2 or more "Fastening points". In this example, the FMU can be designed so it is a structural part of the building or not. Therefore, the building's structure only has to provide support to 4 or more "Fastening points" (203) and its structure can be in some cases simpler and less expensive than with a classical roof. Installing the FMU may be quicker than building a classical roof. In other embodiments, the designer would define the structure according to the one or several FMUs to be used and vice-versa. Using FMUs enables to develop specific structural or architectural designs, specific construction processes and to rethink the whole project development process.

Depending on the selected embodiments, the FMU may include waterproofing or not, thermal insulation or not, ventilation channel or not, additional functions or not, as well as "Dressing elements", other features or options. In the example of FIG. 2, the FMU (201) is to be installed in lieu of the roof of a building (202) and therefore, in this embodiment, it is waterproof, sealed and thermally insulated. Rain water or condensation water are collected in waterproof channels between the rails (208) and they also permit the solar panel's ventilation. In this example, the FMU (201) includes "End dressing elements" such as ventilation grilles (204) and "Lateral dressing elements" (205) that help provide an architectural finish to the building. Sealing or flashing systems may have to be installed at the connection area if required by the design. A set of cables (207), or in some cases one or several "Super plugs", come with the FMU and only have to be connected. If the roof is photovoltaic, it may include pre-installed and pre-wired solar panels, inverters and grounding, sensors or electronic components; in some other cases, the inverters are installed close to the building's electrical panel or meter, or elsewhere, and are not attached to the FMU. A larger roof (201) could be made of several FMUs connected together. The structure could be different and require more or fewer "Fastening points" (203), possibly designed another way. In some cases, an AComp would need to be built in order to provide the exact "Fastening points" the FMU needs.

The FMU (201), or the complex made of several FMUs, may be a regular roof, a solar photovoltaic roof, a solar thermal roof, an intelligent roof, or any other function or mix of functions and characteristics.

Figure 3:
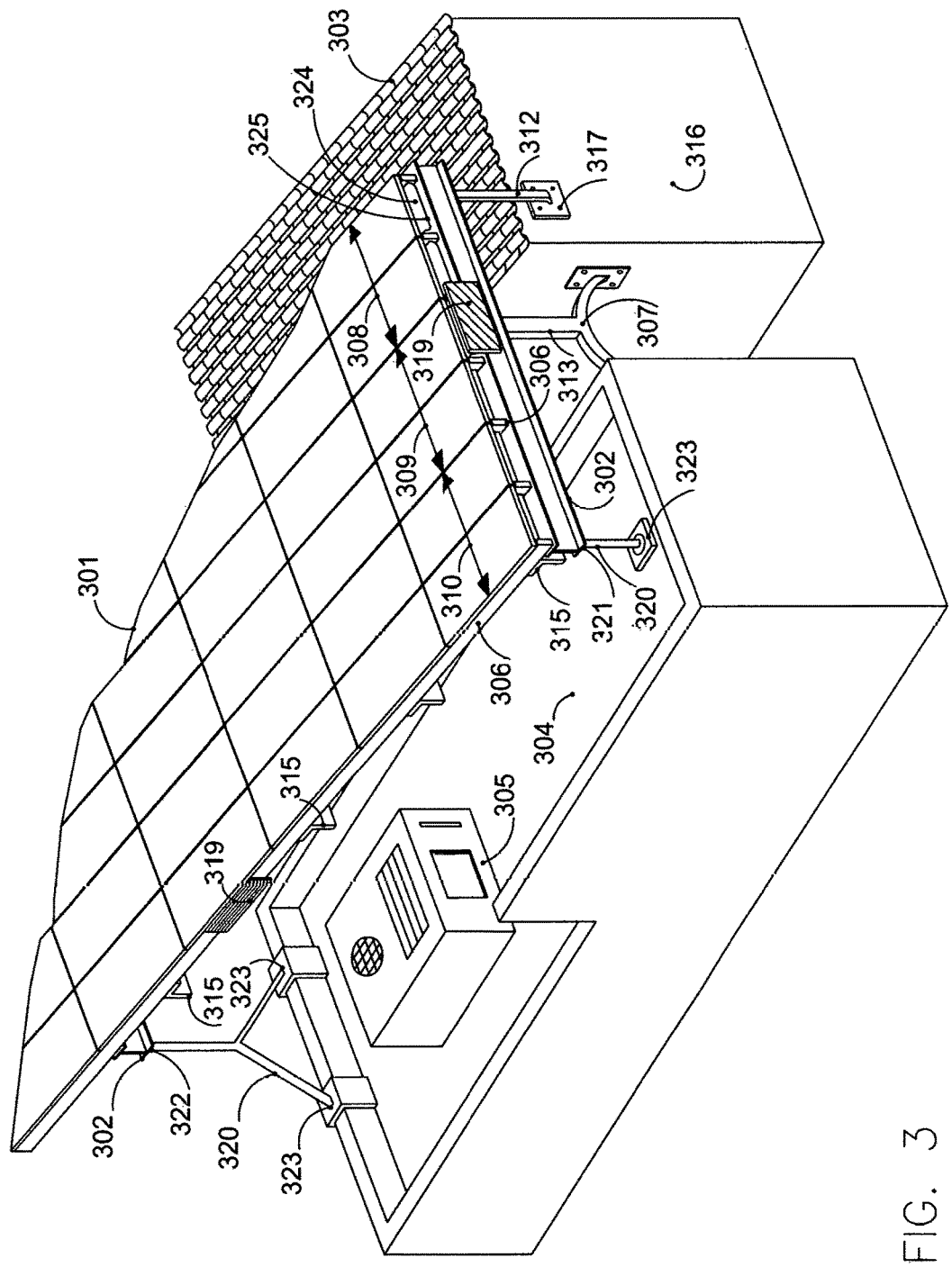
FIG. 3 illustrates a perspective view of a Finished MultiSensor Unit complex wherein the structural capabilities are leveraged for solving installation problems, according to certain embodiments of the invention.

FIG. 3 is a perspective view that illustrates three examples of embodiments wherein the structural capabilities of a FMU are leveraged for solving installation problems. Other embodiments are possible. FIG. 3 also illustrates an example of process for installing one or more FMUs on a host structure by craning off site constructed FMUs onto a prepared roof or structure of any kind, as well as methods for gathering information, designing, fabricating and installing FMUs or other systems on host structures. FIG. 3 also refers to elements that have been described in FIGS. 1 and 2 or other figures.

An example of FMU (301) is illustrated. It could also be 3 smaller FMUs (308, 309, 310) combined together, or any other combination. This FMU (301) is installed on a supporting structure that illustrates 3 different but common cases. FMU (308) is hovering over a sloped roof (303). A FMU (309) is installed on a random structure (307). A FMU (310) is installed on the flat roof (304) of a building.

In this example, the FMU (301) comprises structural LSCs (306) that provide longitudinal rigidity so the FMU (301) can span long distances in the longitudinal direction. The LSCs may be supported or bound together by TBs (315, 302) which can be any type of beam or structure. In this example, a wide flange beam (302) is used as a TB to span long distances in the transversal direction. Therefore the FMU (301) is able span long distances in both directions and a large system can be supported by very few points. The number and the quality of the supporting points depends on the design and the requirements. If the FMU (301) is in one piece, the TB (302) is in some cases able to provide rigidity either when installed on the supporting structure or when being transported (reinforcing frames from transportation can also be used), or both.

However, other TBs (315) could exist in the same time and have another design or size: for example they could help rigidify the FMU (301), or if several FMUs (308, 309, 310) are combined together, and each one has been separately constructed off-structure and shipped, the TBs (315) could give the FMU (301) its transversal rigidity. In this case, the TB (302) would be used as an AComp and serve to transfer the loads from the FMU (301) to "Fixing points" located where the supporting structure can accept them or another beam, part of an AComp could support several FMUs and connect them to the supporting structure.

In FIG. 3, a FMU embodiment (308) is hovering over a sloped roof that is not to be touched or that is to be touched as little as possible, such as a tile or shake roof (303) or other cases. As tiles are rigid and fragile, lying on them is problematic. Traditional solar systems are usually attached to tiled roofed buildings by supporting legs that need to be attached to an underlying structure of the roof such as purlins or rafters, generally after removing the tiles, sometimes opening the plywood sheet, reinforcing the rafter, breaching the waterproof layer, sealing it, using flashing, etc. . . . which overall is a costly job, and which may create leaks. Instead, a FMU (301, 308) can simply hover at any height and angle over the tiled roof (303) without touching it and without compromising its waterproofing or very little.

The FMU (308) can, in some cases, be attached outside the roof (303), for example at the eave and at the ridge or the sides of a roof, and step over the roof without touching it. On the eave side, or on the lateral sides, one or several brackets (312) can be created and attached to "Fixing points" (317) in walls (316), beams or other supporting structures.

In some cases, "Fixing points" have to be created inside the roof area. When "Fixing points" are needed on the ridge of a roof, brackets or a "Fixing pods" can be created and attached to whatever support is available, such as walls, beams, purlins or other structures. If attaching the ridge side member involves opening the existing roof waterproof membrane, flashing solutions can be used as described in other figures. When "Fixing points" are created within the roof area, for example on the ridge line or anywhere else on the roof area, one or several tiles are removed, a "Fixing pod" is affixed to an underlying beam, and sealing or flashing is created around this penetration point so no leak is created. Since the FMU has very few supporting points, the labor intensive job of creating "Fixing points" this way is repeated only a few times. Favorably, a waterproof FMU can be used in order to protect the "Fixing points" from the rain thus reducing the risks of leaks.

In some cases, one or several large FMUs can be supported by an AComp, which collects the loads of the one or several FMUs and transmits them to the selected "Fixing points". In some cases, the underlying structure needs to be reinforced in order to accept these loads. In some cases, "Spreader beams" or "Spreader legs" are installed under the tiles and then in some cases covered again by the tiles, in order to distribute or divide the loads. When the roofing material is other than tiles, such as shakes, cement, wood, etc., or when hovering over a roof is desired for any reason, the solutions can be adjusted to the specific case.

Waterproof FMUs can be used in some cases. If a puncture is to be made in the waterproof sheet, it may in some cases be done below a FMU's waterproof layer or behind a "Waterproof curtain" or a ridge flashing system so there is no water to leak through the punctures created. In this example, FMU (308) includes a WB (325), although it is installed above a supposedly waterproof tiled roof, in order to help prevent possible leaks at the ridge attachment point or elsewhere.

The "FMU" embodiments (309, 310) have no WB in this example, although they could have one as they have other features such as sensors, lighting systems, heating systems, etc., for example in order to protect from the rain the roof-top equipment they span over or for any other reason. If attaching the FMU in few points creates loads that are concentrated and too high for the supporting structures, "Load spreaders" and "Spreader legs" can be used. If the FMU (308) is not as large as the roof it steps over, its structural members such as LSCs or TBs can be extended enough to reach the remote "Fixing points". In some cases, an AComp is created so it can be attached to the supporting structure and provide proper "Fastening points" to a PComp wherever it they need to be. The FMU (301) can use any customization and any "Dressing elements" (319). The TBs (315, 302) can be classically installed below or behind the LSCs they support as described in FIG. 1A, or at the tip of the LSCs, at the same level, or above the LSCs, in order to create a thinner, nicer or more efficient assembly or to solve specific problems. With embodiments of FMU that include a ventilation channel (324), alternate air entries or air exhausts can be created such as on the lower face or the upper face of the FMU (301) so the raised TB does not block the ventilation channel's air entries. The TB does not have to be at the tip of the LSCs (306), it can be anywhere.

The FMU (309) is supported by any kind of structure (307) and spans between distant supporting points. The FMU (309) can be supported by "Fixing pods" (313) either directly or via TBs (302). This configuration could also be found for example on a ground mount structure or other types of supporting structures.

FMU (310) is an example of embodiment installed on a flat roof (304), or on the ground or on any situation where touching the ground or the floor as little as possible is preferred or where the ground or the floor is not flat or is cluttered. In this example, the FMU (310) is hovering over the flat roof (304) of a building and steps over pieces of equipment (305) that are sometimes found on roofs, such as electrical, mechanical, air conditioning equipment or skylights, staircases, or others. In some cases, FMUs (310) are hinged or moved or craned away or rolled away in order to provide temporary access to underlying structures or equipment. Moreover, some embodiments of FMU (301) are mobile, active or rotating. FMUs allow to install systems on cluttered roofs or sites that are usually considered unsuitable for solar or other equipment. FMUs also allow for creating solar canopies, solar shades or other types of structures.

The FMU (310) can have any slope, orientation, size or specification and thanks its structural capabilities, it can provide large areas of solar cells or other functions with very few supporting points. The structures of many buildings do not allow for attaching loads such as solar systems anywhere. In some cases, buildings have flat roofs in which piercing the waterproofing sheet can have dramatic consequences. In such cases, using FMUs (310) allows to have very few "Fastening points" (322, 321), and using AComps (320) enables to transfer the loads to "Fixing points" (323) that are compatible with the structure, as well as to reduce the risk of leaks by reducing the number of "Fixing points" and by placing them wisely. In cases where "Fixing points" are problematic, for any reason, having fewer of them is a big advantage.

The FMU (301) can be constructed off-structure and transported or lifted or adjusted to its final destination and setting. In some cases, such as on large flat roofs or ground mounted systems, the FMU (301) is constructed off structure close to its final location but in a more convenient setting, or it is constructed in a distant location. For example, if the FMU (301) is to be sloped and therefore some parts are to be high, the FMU can be built horizontal on the flat roof or on the ground, and then lifted, hinged or moved to its final location, angle or slope. This makes labor regular instead of "at height", easier, faster, cheaper, less dangerous. Constructing the FMU can also be an automated or a robotic job even when it is done on site, on a roof, or on the ground. For some large projects, an off-structure construction site or shop can be created somewhere on the site, on a roof or on the ground.

Figure 4:
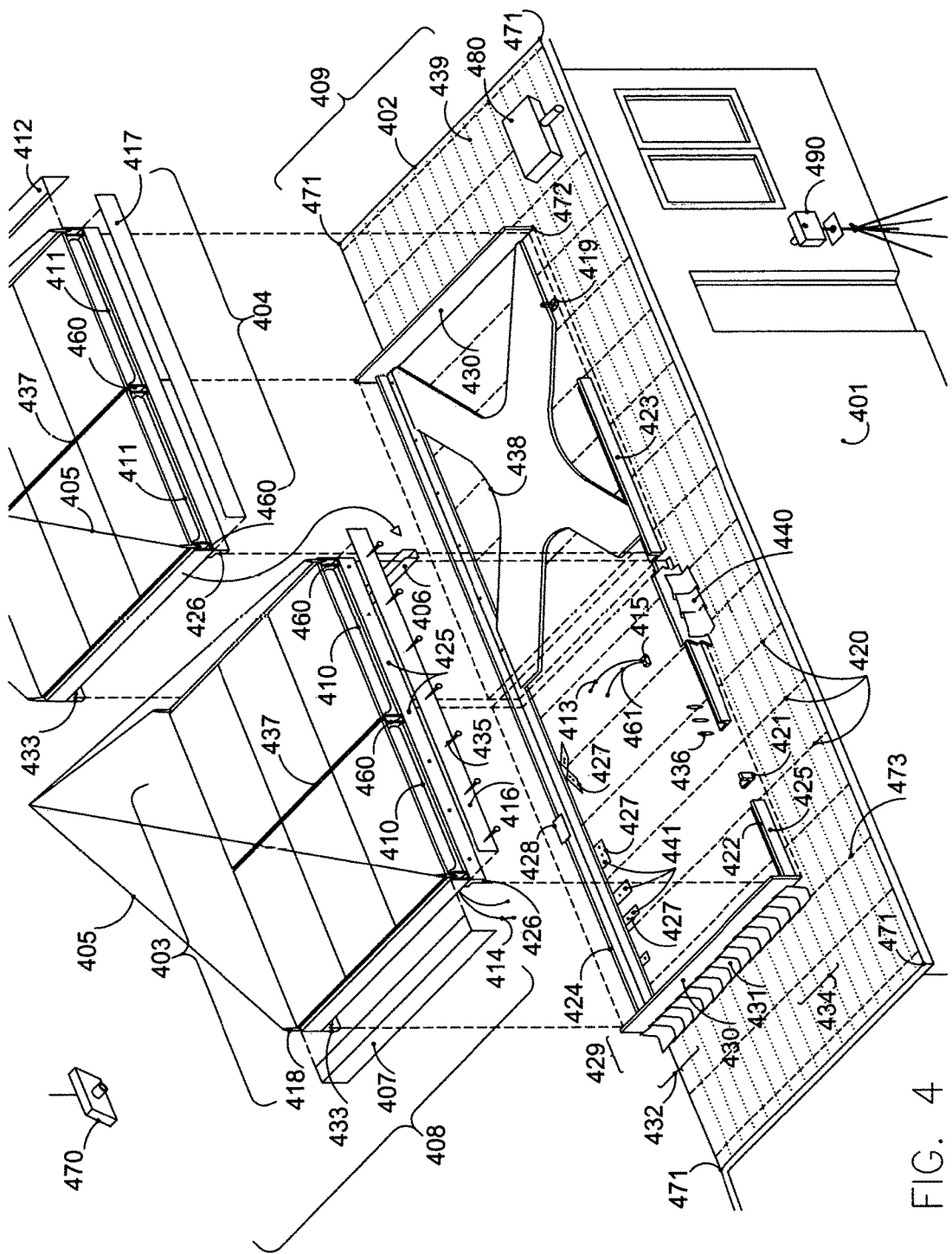
FIG. 4 illustrates a perspective view of a Finished MultiSensor Unit and its installation process, according to certain embodiments of the invention.

In some cases, FMU are easy to move or to remove. Therefore, FMUs can be installed on a site and later moved to another site, for example if the owner moves, or they can be temporarily moved or removed, for example for maintaining the underlying roof or equipment or the FMU itself, or they can be replaced by another system or another FMU FIG. 4 is a layered perspective view that illustrates an example of FMUs being installed and integrated into a sloped roof. FIG. 4 also refers to elements that are described in FIG. 1A, 2, 4 or in other figures.

FIG. 4 illustrates an example of technologies, systems, methods and processes for installing off structure constructed FMUs or solar systems on a new or on an existing roof or on any kind of structure. In this example, a FMU, product or solar system has been pre-assembled first and it is lifted, transported or craned onto a host structure or onto an existing roof. Solutions are described for lifting and attaching it, as well as for designing, positioning, fabricating, preparing and waterproofing the FMU, product or solar system or the roof or host structure.

FMUs are integrated into roofs in many cases such as when FMUs are smaller than the roof they are installed on or when there are waterproof issues or when hovering over a roof is not the selected solution, or in other cases wherein FMUs are installed on any type of structure. The FMU could be installed on other parts of the roof or on other types of structure.

In this example, a building (401) has a sloped roof (402), which includes "Structural members" (420) such as rafters or purlins supporting a planar sheet (439) which is covered with any roofing material. An AComp (409) has been installed on the roof (402) for one or several "Production components" (403, 404). One or several PComps (408) of FMUs are being driven down by any type of lifting or handling system (405). In this example, the to-be-built roof-top solar system comes as 2 FMUs that are to be combined on the roof.

Two examples of "Production components (403, 404) are illustrated: in this example, the PComps have 2 rows of 2 solar panels (437) and a WB (410, 411). In other embodiments, units with 1, 2, 3, 4 or more rows, or more or less panels or any other embodiment or configuration could be used or combined together. As described in other figures, FMUs could have any number and type of panels or optional features or any customization. In this example, the FMUs (403, 404) have been constructed off-structure, either in a remote factory, or in a portable or local shop, or on site, and completely finished and wired before they were shipped or transported. In some embodiments, FMUs could be partly finished or wired before installation. Some of the technologies and processes described herein can be utilized in other cases of application and embodiments. A system can comprise any number or embodiment of FMUs.

In this example, each FMU comes with its own set of "Dressing elements" such as "Front dressing elements" and "Lateral dressing elements", which can be of any type. An example of "Front dressing elements" is illustrated by painted ventilation grilles (416, 417). An example of "Lateral dressing elements" is illustrated by folded and painted metal sheets (407, 412). In other examples, some "Dressing elements" could come separately, or could be carried by only some of the FMUs, or could be made in place, for example when the designer wishes to see only one part without junction, or designed in any other ways as described in other figures.

In this example, the FMUs (403, 404) come entirely wired: the solar panels (437) are attached to LSCs (460) and are wired. They are grounded either by direct grounding connection through the LSCs or by wires; the quality of the connections and of the grounding, as well as the overall performance of the system can, in some cases, be tested in the factory or in the shop before shipping and the data can, in some cases, be recorded for future tracking; the power cables and the grounding cables, as well as the data cables if the FMU includes data collection or utilization, are prepared and ready to plug, in some cases using "Super plugs" (413, 414), or to be classically connected, possibly via a box. The solar panels can use micro-inverters embedded into the PComp or classical inverters embedded into the PComp or into the AComp or installed on the building or use other systems.

In this embodiment, the FMUs comprise temporary or permanent "Lifting points" (418), preinstalled hooks or other pre-determined lifting systems, which allow the FMU, the "PComp", the AComp, or the "Mega component" to be easily manipulated, lifted, moved or craned.

In this example, an AComp (409) for the whole system, or several AComps since there are several PComps (403, 404) to be connected, have been installed on the roof (402). Depending on the nature of the roof and on the project, the roofing material is either still in place or it has been removed on all or part of the FMU area for example in order to reduce the total weight (a FMU can, in some cases, be made lighter than a classical roofing material).

In this example, two problems need to be solved: attaching the PComps (403, 404) and waterproofing.

Attaching the "Production Components".

In this example, the embodiments of PComps (403, 404, 408) illustrated in FIG. 4 need to be attached to a supporting structure. The attachment points have been described as "Fixing points" (441), where "Fixing members" (436) are used to attach the FMU's components to a host structure. "Fixing points" can either be inside a waterproof or a water protected perimeter or outside it. In some cases, it is possible or preferable for the FMU to hover over the roof as described in other figures. In some other cases, the FMU can be integrated into the roof and interact with the roof's waterproofing system. In some cases, hovering over a roof is not possible or desired, for example when the roof is much larger than the FMU or when the "Fixing points" (441) have to touch the waterproofing system, or when it is not desired to keep roofing material under a FMU. Both "hovering over a roof" and "integrated into a roof" technologies can also be mixed in some cases of application. In the example illustrated in FIG. 4, the FMUs are going to be integrated into the roof and be part of the building's waterproofing system or even replace it locally.

PComps or AComps can include waterproofing features or not. When FMUs need to be affixed to roofs or roof structures, the "Fixing members" (436) often need to pierce the waterproofing sheet in order to get a grip on the underlying supporting members. In order to prevent the piercing points from causing leaks, waterproof FMUs can be used: the area below the FMUs is then water-free or water protected. The "Fixing points" can thus be placed within the water-free or water protected area below the FMUs and no water can leak via the holes created by the "Fixing members" (436). When the "Fixing members" are thus placed below the FMU and not easily accessible after the PComp is installed, the "Fixing members" are favorably part of the AComp, which in some cases is installed before the "Production component".

In the embodiment of FIG. 4, the AComp (409) includes "Fixing pods" (419), "Spreader beams" (421, 422, 423, 424) or "Spreader legs" (427). The AComp can come as a whole assembly that is brought to the roof or as separate elements that are assembled on the roof.

It is sometimes critical that the AComp and the PComp match perfectly. In some cases, the elements of the AComp can be accurately placed using a "Positioning frame" (438), which holds together the elements of the "Attachment Component" before or while their installation or helps placing them precisely with the proper position of each element relative to each other element or to the supporting structure. The "Positioning frame" (438) is a rigid or a flexible frame that can have any shape, design or material. "Positioning frames" can be made to measure or made in the same time as the PComp so they match perfectly. 3D data can also be used to position precisely the elements as described in other figures. The "Positioning frame" (438) can also be shipped altogether with the elements so they stay in place and do not deflect during transportation or positioning phases, and match perfectly the PComp (408) they are expected to host. If a standardized model of FMU is used, a corresponding standard model of "Positioning frame" can be used. In another method, the AComp, with or without a specific "Positioning frame", can be brought to the destination roof or structure altogether with the "Production component", so they match perfectly; then the AComp is affixed completely or minimally to the roof or the structure; then the PComp is detached from the AComp and is temporarily lifted away while the AComp remains on the supporting structure; once the PComp (408) has been lifted away, the AComp can be fully attached if it was not the first time; then, the PComp is installed on the AComp. These 2 methods enable the AComp, and the "Fastening points", and the PComp to match perfectly. All methods can be mixed or improved.

Several examples of "Attachment component's" elements are illustrated in FIG. 4. The AComp (409) provides support for the PComps (408, 404, 403). PComp and AComp have to be designed so they provide compatible "Fastening points" (425) for the "Main fasteners" (435). Therefore, standardized systems will be used as much as possible.

In some cases, if the supporting structure is strong enough to hold concentrated loads, the PComp can be fastened to "Fixing pods" (419), which can either be affixed directly to the underlying "Structure members" (420) such as rafters or purlins or be affixed by several "Fixing members" (436) sitting on large footings that spread the load on a larger area. In some cases, "Spreader beams" or "Spreader legs" can also be used.

"Spreader beams" of several types, such as short "spreader beams" (421), mid-size "Spreader beams" (422), unit-long "Spreader beams" (423), can be used to help support one or several FMUs. "Extra-long spreader beams" (424) can also be used to support several FMUs. The size, profile, design, position and fixing methods of the "Spreader beams" is calculated by the designer depending on the loads, the quality of the supporting structure and material, the design of the PComp to be supported, and other factors such as the ease of mounting. The "Spreader beam" system allows for spreading the loads on a large area of supporting structure, or for spreading the loads between several "Structural members" (420), while allowing the PComp to be fastened in points that are not directly dictated by the supporting structure. The location and the number of the "Fastening points" (425) provided by the "Spreader beams" can be made independent from the location of the supporting members (420) and the number of "Fastening points" (425) is not limited. In some cases, FMUs or PComps are fastened in very few points, in other cases, many points can be used.

When even more load spreading is needed, various types of "Spreader legs" (427) can be used to support the "Spreader beams" in order to spread the loads on larger areas. "Spreader beams" and "Spreader legs", of any design, size, material or fixing method, can be affixed directly to the supporting structure or supporting material (439), such as plywood or metal sheet for example, or be affixed through spacers or washers or other systems creating a distance between the supporting material and the spreaders, in order to either make up for a planarity defect or to leave room for water to flow. The "Fixing points" can be made waterproof. Spacers or adjustment systems can be used to adapt when the supporting structure is not flat or planar.

"Spreader legs", "Spreader beams" or "Fixing pods" can be affixed either to underlying supporting "Structural members" (420) such as rafters or to a sheet (439) such as plywood or metal. Finding the hidden underlying "Structural members" (420) can be done using tools such as stud finders, magnetic sensors, digital wall scanners or other tools. Therefore, affixing "Fixing members" (436) to underlying supporting "Structural members" (420) can be done easily and can be automated: a robot could do all or part of this work. "Spreader legs" or "Spreader beams" may, in some cases, divide the loads applied to each "Fixing point" so that a simple sheet, such as plywood or metal sheets is able to hold the FMU without exceeding its specific capacity. In this case, affixing the "Spreader beams" (419, 422, 423, 424, 432, 434) consists primarily in positioning them and affixing screws or nails, sometimes numerous, onto the sheet, which can be done manually or robotically. Using a "Positioning frame" (438) makes it easier to place each element of the AComp relative to each other. Therefore, in some cases, if using proper data as described in other figures, the AComp can be affixed quickly by crews or automatically by robotized tools.

In some cases, the described technologies allow for robotic installation: an automated or robotic tool can place the "Spreader beams", "Spreader legs" or "Fixing pods" in the right place using proper information and screw, nail or affix them automatically and, in some cases, test the strength of the support thus provided. If needed a robot or an automated tool can also locate the underlying "Structural members" and place the "Fixing members" precisely with respect to the supporting structures. The crewmembers or the automated tool can also use 3D data, recognize the 3D model used during design phase and the existing 3D structure, point a laser beam, or any other type of pointer, to the exact location where the fixing member has to be, so a human or robotic worker can install it in the right place.

Once the AComp (409) is affixed to the host structure (401), the PComp (408) can be driven down in order to be fastened to the AComp. In some embodiments, the "PComp's" LSCs (460) or other structural elements are fastened directly to the "AComp's" elements. In some other embodiments, the PComp is equipped with TBs (426, 433) which are designed either to provide transversal structural rigidity to the "PComp" or to provide "Fastening points" (425) to the "PComps", or favorably to do both of these. The TBs are designed to be compatible with the AComps or reverse; favorably all the components are part of the same bank of components and they are compatible. In this example, both the TBs (426, 433) and the "Spreader beams" (423, 424, 422, 432, 434) are shaped as L profiles that interlock, but other designs are possible such as in U, in T or others. A PComp can be supported by as many TBs and "Spreader beams" as needed. However, TBs are more easily fastened to the "Spreader beams" when they are accessible from outside the PComp perimeter when the PComp is in place, and so 2 TBs (426, 433) are often used in sloped rooftop applications: at the up-hill sides of the FMU so the "Main Fasteners" are accessible for fastening from the up-hill and at the down-hill outer sides of the FMU. An example of fastening process is as follows: the off-structure constructed PComps (408, 403, 404) are driven down onto the previously installed AComp (409). The FMU or the PComp are attached to a lifting system (405) such as a crane or any lifting system, by "Lifting points" (418). "Lifting points" can be hooks pre-installed on the FMU, which can be removed after use or not, or points where the lifting system is screwed or attached such as points where a tie, a jig, a beam, or a holding system can be easily used and removed once on the roof. In some embodiments, hooks can be pre-installed at the tip of the LSCs so the lifting system's ropes or bars or arms can hook to them and in some cases un-hook automatically without manual intervention. In some cases, a beam suspended to the lifting system, fits into several LSC's hooks and lifts them altogether, thus providing temporary rigidity, and unhooks after installation. In some cases, the FMU is lifted, driven down and positioned by a powered arm or a robotic arm which attaches to the FMU or by suckers attached to the panels or the FMU and positions the FMU or the "Mega component" or separate components exactly where it needs to be, in some cases without on-roof human intervention. It is driven either virtually or using 3D data or 3D positioning systems. The "Production component's" TBs (426, 433) fit on the "Spreader beams" (421, 422, 423, 424) or on the "Fixing pods" (419). Favorably, like in FIG. 4, the 'Transversal beams" are designed so they work as a hook: when the PComp is driven down, the for example L ou reversed U shaped upper TB (433) hooks up to the upper "Spreader beams" (432, 424) and, when driven down more, the PComp rotates around the upper "Spreader beams" (432) like around a horizontal axis working as a hinge, and thus remains aligned until the lower TB (426) reaches the lower "Spreader beams" (434). In some cases, both the "Spreader beams" and the TBs can include "Centering pods" (428) which allow the TBs and the "Spreader beams" to be perfectly aligned in the transversal direction, especially when the installation is partly robotized or entirely robotized. When the PComp properly rests on the AComp, it can be fastened and connected. The "PComp's cables (414) or "Super plugs" (413) are to be connected to the cables (461) or "Super plugs" of the AComp or of the host structure. The cables (461) are connected to the electrical network or to the data network and may use any cable way or, since they are inside a waterproof area, they can use simple sealed slots (415) to get inside the building's envelope without creating leaks. When the "PComp's" TBs (426, 433) are resting in the right place on the "Spreader beams" (421, 422, 423, 424, 434, 432), or on the "Fixing pods" (419) so the "Fastening points" (425) are in the right place, the "Main fasteners" (435) are used to fasten the PComp and the AComp together thus securing the FMU on the building. The "Main fasteners" may be bolts or screws, or rivets, or sticking systems, or welded connections, or other systems. In some cases, the "Main fasteners" (435) are self-tapping screws: they can be installed in several ways: an easy way is to install them from the outer side of the FMU, go through pre-pierced holes in the substantially vertical leg of the TB and screw directly in the substantially vertical leg of the "Spreader beam". In some other cases, the "Main fasteners" (435) are bolts that screw in a nut pre-attached to the "Spreader beams". Attaching the "Main fasteners" can be performed by crews or by machines, and can be fully automated.

In some cases, a simpler embodiment can be used: the TB and the "Spreader beam" can be the same part that is attached to the PComp before it is lifted. The PComp is positioned on to the roof or supporting structure. The combined "TB+Spreader beam" component is affixed to the roof. In some cases, waterproofing or flashing systems are added.

A system can comprise one or several FMUs combined together. FIG. 4 illustrates an example wherein 2 FMUs are used. Large FMUs can be made but in some cases smaller FMUs are easier to ship, lift, fasten, or make. Creating projects by combining a few models of FMUs also allows for reducing the costs, especially thanks to standardization and larger series. In the example of FIG. 4, 2 FMUs of 6 panels each are used. They may have separate "Attachment systems" or a common one.

Waterproofing:

Some embodiments of FMUs are built waterproof using WBs (410, 411) and can be integrated into the roof. They are, in some cases, used in lieu of the waterproofing system for the area they cover. However, in some cases, water can still flow below or behind them, for example when rain water is already flowing on a roof the FMU sits on. Technologies for creating a "Waterproof curtain" with FMUs are described in other figures and for cases wherein the FMUs are installed on the ridge of a roof or anywhere on the roof.

In some cases, creating a "Waterproof curtain" only on the up-hill side of the FMU is sufficient. The up-hill side curtain can be created using a flashing system on the upper side of the FMU, whether it is sitting on a roof's ridge or anywhere on the roof. These systems are precisely described in other figures. In some cases, the waterproof curtain is needed on 3 or 4 sides, which boils down to creating a peripheral waterproofing wall on top of which the waterproof PComp or FMU comes as a top cover.

In some cases, a "Waterproof curtain" is created on the up-hill side of a FMUs installed on a sloped roof: no water thus penetrates the roof area situated below the FMUs and many "Fixing members" can be used without the risk of creating leaks by piercing the waterproofing sheet in an area exposed to water. However, in some cases, water coming from the lateral sides could penetrate below the FMU and create leaks, especially when the wind pushes the rain water on the roof surface. This lateral water penetration can be stopped by "Lateral flashing systems" (429) completing the "Waterproof curtain": a "Lateral shoulder" (430) is installed on the lateral side of the FMU: it is for example a board standing vertically at the edge of the to be created waterproof area. The "Lateral shoulder" (430) can in some cases come with the AComp or be placed using a "Positioning frame". A flashing system (431) goes from the roof's roofing material to the outer wall of the "Lateral shoulder" (430), thus preventing flowing water from penetrating the space below the FMU.

When, like in the example of FIG. 4, several waterproof FMUs are used for creating a larger waterproof assembly, the FMUs can be connected by central gutters (406). The central gutter (406) fits between the lateral LSCs (460) or the side flashing elements of 2 FMUs and collects the water between the 2 waterproof FMUs. This gutter (406) can come with the first FMU to be installed: the second FMU fits on it. In other cases, the gutter (406) can be installed on site before or while the FMUs are being installed. This gutter (406) uses the same principles as the WB: it goes up on the walls of the rails on each side, it fits under a drip former and it is attached to the rails on at least one side.

When several FMUs are installed side by side like in FIG. 4 in order to create a larger array, only one "Lateral flashing system" (429) on each side of the whole array may be needed since the gap between 2 FMUs is waterproofed by gutters (406). In some cases, the "Lateral flashing system" is preinstalled in the same time as the AComp or as a part of it, and when the FMUs is craned down it only has to fit between the 2 "Lateral flashing systems", or close to the "Lateral flashing systems" if only 1 side is equipped. In some cases, FMUs come with "Lateral dressing elements" (412, 407) that are for example folded metal sheets attached to the lateral LSCs or to other components that step over the "Lateral flashing system" (429) so it is both hidden and protected like with a drip. In some other cases, the "Lateral flashing system" fits under the LSC or a drip element, so no water coming from above can flow behind the flashing sheet. Eave side flashing systems (440) are used in some cases.

Design Tools:

Using Off-structure constructed FMUs is more efficient if perfect knowledge, such as measurements or 3D models, of the host structure is available. Moreover, 3D data allows for faster or automated design and new sales processes.

It may be necessary to collect accurate information such as exact 3d measurement of the site and its surroundings, the host structure or the building (401), as well as materials, structure and other characteristics. In some cases, the collected information may include colors, materials, properties, structural information or other information such as shading, access, power lines and other obstacles, etc. Very precise and accurate 3d information about the host structure enables to improve the way the FMUs (or other systems) are designed, fabricated or prefabricated and installed thus allowing cost reduction or quality improvement. This information may be collected and provided by a third party player or by the designer or the client or by crewmembers visiting the site or by the customer or be collected automatically or semi automatically.

3d Model.

If a FMUs (403, 404) is to fit an existing structure, it sometimes needs to fit in perfectly, although some embodiments of FMUs have large positioning tolerances in order to simplify the installation process. If the FMU is to be installed on a new built structure, it also sometimes needs to fit perfectly in the new structure's real world dimensions. If computer assisted modeling or automated mounting processes are to be used, accurate 3d information is critical. Similarly, if the design process involves previewing the product on the hosting structure, an accurate image of the hosting structure is necessary. Therefore, in some cases, the process includes building a reliable 3d model of the site along with fundamental site info such as access for delivery and tools or shading. An accurate 3d model of the host structure may enable changing the whole process: sale, design, prefabrication, installation, and maintenance. For other applications, other information may be used.

How to Build a 3D Model

Several companies, using various technologies, provide 3d information about locations, buildings or even roofs. This information is sometimes precise enough to assess the feasibility of a project (for example identify the roof's slope and orientation and its approximate size) but their accuracy may be insufficient for some applications, especially in the case of a Computer Numerical Controlled prefabrication of products that are to fit exactly an existing structure. Relevant information is a key driver of cost reduction and quality improvement. A very accurate 3d model may have to be built: many 3d computer systems are able to create the 3d model using 3d measurement data. Several methods for accurately collecting and processing this data are described below.

The collected information may be limited to the measurement of the outer shapes. It can also be enriched with additional information about the materials, colors, etc. In many cases, it is also useful to have information about the inside of a building, for example about the building's structure such as the carpentry supporting a roof and about materials, structures, colors, wiring, accesses, shading, trees, etc. Getting this information may involve combining measurements made from inside and outside or using tools, which can describe the structure or other important information from the outside. For example laser, sonar, radar, X-rays, radio waves or WiFi waves or other technologies can be used to see through a building's skin or to use thermic cameras or infrared or other technologies to build a more or less precise model of an underlying structure.

The 3D model in some cases includes simple 3D points built from 3D measurements of a few key geometric points, for example the angles of a target roof, or many more points for example when a cloud of points is used to generate a mesh. In this case, it may be useful to extract the key geometric points from this mesh to build simpler vectorial planes, either manually or automatically.

In some cases the on-site process is performed by one or more person in a very short time or by a robotic system. The crew may go to the site with a vehicle that includes everything necessary, such as measurement tools, flying drones, communication equipment or computing equipment. In some cases of application, such a site visit may be performed by robotic means with little or no human intervention: a robotic system using a robotic vehicle can go on site and perform automatically the tasks described herein (such as taking measurements, analyzing a site, designing a solution, or even proposing the solution to a client) and transfer directly the information to a controlling system or it processes the information in an autonomous way. In some cases, this visit is been triggered automatically as a result of a contact, an online sale process or of an analysis as described in other figures. The information collected can be directly or indirectly fed to a 3d model computer programs such as Autocad, Revit, 3DS Max or many others.

Several methods to make it less labor intensive are described; methods can be combined or be combined with traditional techniques.

Optimizing cloud of points measurements: automated measurement systems sometimes have a problem having the exact scale, especially picture based cloud of points measurement systems. In this case, one or several reference object may be placed in the field to be measured. The reference object or the ruler may have any shape, size, aspect, nature or color. It may be in 2D or in 3D. It may be an object that the software system knows and can recognize. It has, in some cases, a series of visual or electronic marks, or other types of marks, that the software can easily identify and use as a reference in its measurements or that helps the computer understand the site. For example, the reference objects can be placed at specific distances from each other or at specific location, they can have recognizable shapes or be identified by other means. Identification may be automatic or manual. The operator brings one or several 2D or 3D reference objects or scale reference rules to the site, in the field of measurement. They are included in the measurement system's analysis and may be used as an absolute reference of size, angle or location. Once the cloud of points is done, a manual or automated operator can identify the scale reference ruler in the cloud of points and use it to provide accurate scale or geometry to the model. In some cases, it is automatic: the software knows the ruler, since it has been described before, recognizes it automatically and adjusts automatically the scaling of its 3D model, which becomes perfectly accurate. The scale reference ruler can also be equipped with leveling systems in order to provide exact horizontal and vertical references to the system. It can also communicate with the measurement tools and exchange data.

Method 1. Crewmembers or robotic systems go on site and perform 3d measurements on the building (401) using surveyor tools (490) such as laser tools or others. Any classical measurement tool may also be used, including crew or robotic system physically walking around the site or on the roofs to make measurements or collect information. Tools like laser systems or magnetic stud detectors and internal capacitor stud finders or digital wall scanners or metal detectors can be used to collect information such as location of structural components (420) or of electrical wires. In some cases, crewmembers or robotic systems are also followed and positioned in 3 dimensions when collecting data so the computer knows exactly where the measurements where performed. New devices such as mobile distance measurement tools can also be used. In some cases, key geometric points (471) of the supporting structure (401) are measured, such as the edges of a roof, or chimneys, or beams, etc., and a 3d software will use them to build a simple 3d model based on simple vectorial planes.

In some cases, crewmembers or robotic systems use tools that collect clouds of points that will be used with a computer program that will build a 3d model out of it. The measurement may be done from several points in order to be more accurate. Crewmembers or robotic system may use surveyor tools working from a distance or go physically to some of the points they want to measure. In some cases, crewmembers or robotic systems also take pictures or measures either from the ground or from an elevated location using any elevator system such as cranes, high locations, long booms or flying tools such as flying drones (470), automated or human controlled. The collected data is sent to a 3d modeling computer program which builds, with or without human intervention, a 3d model and if needed it may apply textures using the pictures in order to provide optimal rendering.

Method 2 involves using a mobile 3d positioned measurement tool (480) that moves to each node point (471) of the site, or goes to specific points, or systematically roams over all the area, and takes a 3d measure of the key geometric points, may be using fixed surveyor tools to triangulate, or of every interesting point of the site. It can be lifted by any mechanical means, or can move on or around the building, it can roll or crawl on a structure like illustrated in 480 or it can fly over/around the site and hover over the key points (471) to locate them precisely in 3d like illustrated in 470. This tool can be of any kind. It can also be equipped with 3d positioning tools, with photo cameras and with any kind of sensor such as Xray sensors, magnetic sensors, internal capacitor stud finders or digital wall scanners or metal detectors, or thermic cameras or other technologies enabling to visualize and measure both a building's or site's outer skin and the supporting structure hidden behind a building's skin or to analyze the surface's properties or other characteristics of the building.

Method 3 involves using computer programs that create a 3d model using a series of pictures of a site. The process may involve taking pictures from the ground but more efficiently it may use information collected from a higher location. The information collector is primarily a photo or video camera (making 2d or 3d pictures) but there might also be other sensors such as thermic cameras, x-rays, laser, sonar, infrared, or any tool that can give additional information about the building's structure, size, shape, geometry, material, age, temperature, leaks, structure, mechanical tools or chemical tools or sound systems or testing systems, etc. The information collector may be fixed or mobile. Ideally, it is supported by a plane or a helicopter or a flying drone or a crane or any other means like illustrated in 470, for it to fly over and around the site and take pictures of the site from the alr or from all relevant position. Ideally it is able to turn all around the target host structure in order to obtain complete information. It may be controlled or remote controlled by crews or robotic systems or it may be programmed to autonomously follow a pre-determined path, possibly determined automatically based on "site information analysis". For example for the measurement of a building, a virtual path may be drawn on a map and the sensor follows the path. For example a flying drone (470) carrying one or several cameras or sensors may fly around a host structure (401) at various altitudes and collect a complete set of data such as pictures or other information. The data is sent to a software program (such as Photo-to-3d, Strata Foto 3D, Insight 3d, or Autodesk's 123d or Real Capture or others) that builds a 3d model using it. An ideal process might include a drone taking pictures all around a building and sending them to a computer system that transforms them into a 3d model, for example through a cloud of points.

In some cases, in order to accelerate the on-site processes and obtain quickly a preview of the 3d model in order to allow for the teams to work on the project's pre-design, all or some of the pictures can be copied in a low resolution version and sent to the calculator, the calculator can be onsite or remote. This way two 3d models can be built: a quick, light and rough one, that is sufficient for pre-design purposes (choosing the products, customizing them, etc. while still on site), and a high resolution model that will be used later for final design purposes. The whole process takes only a few minutes. Hopefully the additional data described above have been collected in the same time.

This data collection method is used project by project (for solar projects or for any other kind of project such as deploying any type of equipment or technology, or running any type of information collection) or in some cases it is used to systematically, and in some cases automatically, measure a larger territory such as a block or a town, possibly in interaction with the "statistics analysis" or the "site information analysis" processes described above.

Several of the above methods provide clouds of 3d points. The information is fed to a computer program that transforms it into a 3d model of the host structure. The program can either create a mesh using a cloud of points or it can extract the critical geometric shapes, edges, angles and planes, and possibly add information about materials, structures, energy, thermal, leaks, data, etc. . . .

This 3d model of the host site can then be used to implement virtually the solar products, or other products or technologies, on the site, either with or without the human intervention of a designer. If information can be obtained about the structures supporting the roof or the façade this information can be used to design the solar system's attachment to the structure or for other purposes.

In some cases, several types of measurements are combined: for example for a roof, measurements made from the outside and measurement made from the inside such as a diagram of the carpentry members in an attic. A camera or sensor equipped flying manned or unmanned aircraft such as a drone (470) can for example fly around a structure (401) and take pictures at regular angle spacing while a surveyor laser tool (490) can measure a cloud of 3d points. It is also possible to combine or cross-reference measurements obtained from pictures and from laser cloud of points or onsite manual measurement in order to obtain an accurate and complete 3d model, possibly supplemented with non-geometric information. It is also very useful to include a scale reference ruler in the measured field as described above.

In some cases, the computer system extracts relevant information from the raw data and provide a simple vectorial model made of simple planes possibly enriched with additional information. Geometric forms are interesting in that they are easy to work with. But clouds of 3d points give information on a big number of points of each surface of the building. For example, this information can be used to record a plane's planarity defects: if a roof or a façade is being measured in preparation for a solar product to be installed on it, an exact knowledge of the plane's defects enables to adapt the product or to take any relevant action. It can also be used as a report of the state of the building before the solar product is installed, for example in case of litigation. It thus enables the adapted product to fit perfectly to its location when it is installed. The same is true for information other than geometric such as material, thermic or underlying structures.

In this process, a very small team, in some cases only 1 person, or in some cases only a robotic system, come to a site, for example an existing home or building to be equipped with a FMU, and perform in a few minutes a series of measurements for example by having a light drone fly all around the building taking pictures and or various kinds of measures (may be infrared, magnetic, density, laser, thermal or X-rays) and a laser 3d measurement, both would create 3d clouds of points that can be sent to a computing system, local or distant, and possibly combined together into an accurate 3d model. In some cases, the data analysis or 3d model building can be processed in real time while the operator (human or robotic) is on the site. Additional information may be collected (for example samples of materials, paperwork or other information can be collected) and the standard process may include the automatic collection of any available data at the first time so it is available if changes to the project are made afterwards. Accessories, accidents or obstacles present on the buildings such as chimneys, vents, windows, etc. are also reported in this process.

In some cases of application, the whole process is automated: a digital 3d model of the host structure (401) is made (automatically or not), the FMU is chosen and customized on a computer using 3d a modeling software, a 3d model of the product is created (several variations can be tested virtually), the order is processed online as well as sourcing, the components are prepared automatically, installed by robots on the prefabrication bench, the LSCs (460) and other adjustable components such as dressings or waterproofing are installed and cut automatically, the panels and other components are installed, connected and attached robotically, the complete system is tested and prepared for hauling, it is shipped to the host location with its specific mounting parameters and instructions, and installed robotically. In some cases, all the steps of the process are recorded and saved for further use.

In some cases, the new overall process aims at reducing the time and cost of the process of mounting solar systems and at improving its quality, reducing the risks of errors, defaults or accidents and at leveraging the advantages of prefabrication and or of the above described solar products as described above or in other figures. FMUs, off-site construction, standardization, 3d modeling allow for a new mounting process partly or fully automated or robotized. Methods and devices are described herein or in other figures, they aim at making this whole process as simple, fast, secure, inexpensive and labor free as possible, with consistent quality and easy permitting. Various versions of the process exist or may be developed; some of them are described below. An ultimate version is completely automated. An installation process using FMU constructed off-structure or prefabricated components of a system is described. The FMUs have been assembled either on site or in a remote location. They are brought to the site and lifted to their final location, possibly on a pre-existing structure.

In some cases of application, the system checks that all the paperwork is complete as well as the scheduled payments. In some cases, it generates a mounting round or an inspection round which may include several sites. The round can in some cases be entirely robotized or automated. The round may involve a vehicle (manned or unmanned) that can carry all the necessary equipment, communication tools, instructions, material, paperwork, etc.

In some cases, the process includes one or several of the following steps (Some operations may be performed manually or automatically, robots may be used at any step of the process if available):

Preparation:
Verify that the site (401) is the right one, meets all the requirements and is consistent with the previously available information or the 3D model and all the paper work is correct.
Verify if the client is present (optional).
Record everything or some key steps in order to provide proofs, feedback, control, records.
The system, using measurement methods and tools such as surveyor tools or pictures, starts with verifying that the site's characteristics are what they are expected to be. It controls the similarity between what it observes and what the design expects to find.

Installation:
Determine the exact installation location on the host structure (401)
Install the fixing members (441)
Install the products (408) in one or several steps
Verify
Connect
Control In some embodiments, the improved installation process uses specific technologies and processes which are described below or in other figures. Once the measurements have been verified and the preparation has been done, the installation process can start. An example is described herein:

The first step is to make sure all the necessary components and tools are present.
In some cases, preliminary operations have to be conducted such as site preparation (for example remove tiles on a roof, remove vents, prepare the ground, prepare attachments, prepare access ways, etc.).

The second step is to locate precisely the key geometric points (471) the project's design has been based on and to determine precisely the position of key mounting reference points (472) such as, for example, the future location of the FMU (403, 404) on the roof or the location of the supporting pads and their fixing members.

Once these points (471, 472) are located, they can be marked either physically or virtually by recording a 3d position that will help guide the mounting job. This can be done in several ways, for example using a 3d laser and compares what it reads with what it has on file, in the 3d model or measurement the product was built on, identifies key points and may show them by locating 3d position coordinates or a physical signal such as a light ray aiming at guiding the installation operations.

In some cases, it may be necessary to locate certain elements of the site, for example purlins (473), structural points, networks, feeding points, connection points, etc. This can be performed before starting the mounting or during it.

Then, the mounting process can begin, either manned or automated partly or totally In some embodiments, a robotic fixing machine can be used to attach the lower part of the FMU (409) to the roof. For example, an automated fixing machine such as a screw gun that can roam on and around the host structure and partly or fully automatically fasten the "A Comp" (409) to the host structure. It is used as follows:

The AComp (409) of a FMU (403, 404, 408) is installed on the host structure (401).

The robotic fixing machine is brought on it, or in some cases, it has been brought in the same time as the AComp The robotic fixing machine screws or attaches all the securing means (436, 435) that need to be attached, possibly following a set of instructions defined during the designed and prefabrication phase. The system may also include data recording such as a video camera or other sensors recording the operations performed or devices recording for example the screwing torque applied, or the verifications performed. The machine or tool can also be operated manually.

After completion, the tool is removed.

To summarize, one of the applications of the process, which works with FMUs or other products, is be as follows: 1) a 3d model of a supporting structure has been created. 2) FMUs or products have been designed and prefabricated to match exactly the shape and requirements of the supporting structure. 3) These FMUs or products may be a standard one or a customized version. In some cases, they have been designed to be installed at a very precise location of the supporting structure. Since the product is a well-known one and its attachment to the supporting structure spreads the load, the permitting process can be simplified thanks to less structural concerns and to using a well-known repetitive product. 4) When installation begins, the system reads the existing structure, compares it to the 3d model or the data that has been used for the product's design and determines the exact position it has to be installed at. In some cases there may be intermediate operations to be performed such as site preparation. In some cases, the system determines the exact position of the fixing members be they a set of individual objects or a pre-framed supporting piece. 5) The fixing members are put in place and attached to the host structure either by crews or by a machine. Then the product is brought and attached to the fixing members.

In some cases, the system reads the final destination of the fixing members, attaches them robotically, controls the quality of the execution such as the exact 3d location or the strength of the attachments, possibly compensates unexpected defects of the supporting structure, corrects if necessary, and attaches the product on the fixing members, controls and verifies again, attaches the wires, the whole operation or parts of it being performed only by machines and the whole process being recorded (video recording, data recording, including record of the actions performed by the robots, test reports, etc.).

In some cases, a human can predesign a project and products online and then a 3d model of the host structure is made in a few minutes, the products are prefabricated with very little human intervention. The timesaving is considerable. Installation:

If a lifting system is to be used (405), it can be anything, for example: a crane, a truck-crane such as a boom truck, a mobile tele-handler, a transportable lifting system, a robotic tool, a flying carrier, an airship or a balloon, drones, a helicopter or any transportation system.

An example of robotized installation process is a follows:

The key geometric points (471) of a host structure (401) have been defined during the design phase using a laser positioning control system (490) or other tools (470, 480), or they are determined during the installation phase. In some cases, Fixing pods (419) or spreader beams (432, 434) have been pre-attached to the host structure, but this step is not compulsory. A lifting system (405) brings a FMU (403, 404) to the right location on the roof or the host structure. In some eases, it communicates with the positioning control system or with another positioning system, such as a flying drone (470) or other tools. The AComp (409), if any, and its "Spreader beams" (422, 423, 424) have been put on the roof or the host structure either by a manned tool or by automated tools. The AComp is held there either by the Fixing pods if any, or by any other temporary solution such as a robotic arm or other tools. In some cases, a robotic fixing machine or any other system is being brought to the AComp by a lifting system, may be guided by a laser positioning control system or other positioning tools, in order to attach to the structure the AComp or the "Spreader beams". In some cases, the robotic fixing machine that attaches the AComp is connected to the lifting system. It may be guided by a laser positioning control system, or other positioning systems, in order to attach to the structure the "Spreader beams". In some cases, the PComp (408) is brought by a lifting system (405) which may be guided by a positioning system and comes on top of the AComp, which has been previously installed on the host structure. In some cases, the PComp (408) and the AComp (409) are merged in a single mega component that is installed in one time by a machine that is able to lift the FMU, to locate the exact expected position on the host structure and to perform the fixing of the FMU onto the host structure; in some cases, flashing systems are performed automatically too, or need to be installed by crewmembers. Then, the FMU is installed and ready to use.

Figure 5:
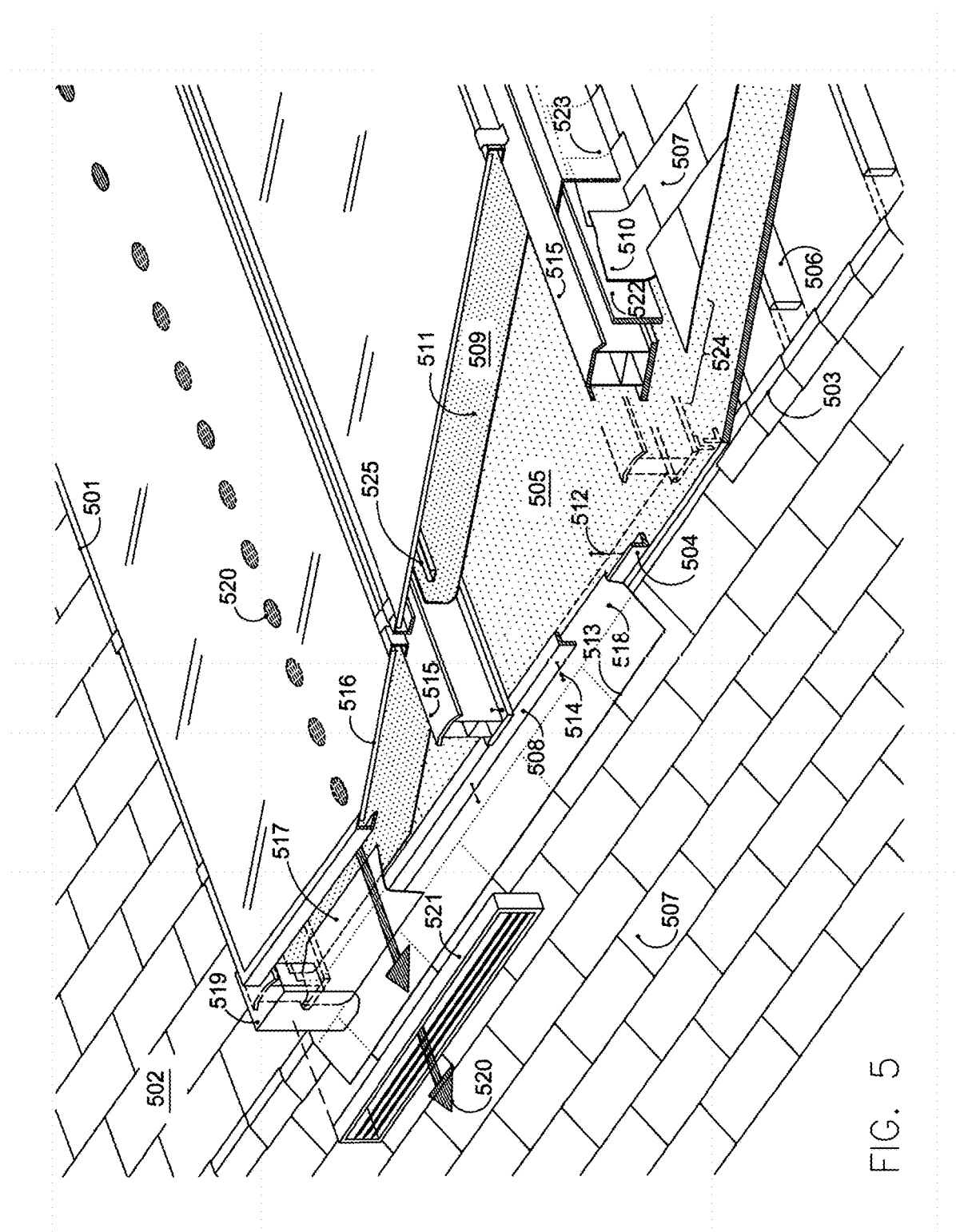
FIG. 5 illustrates a perspective view of a Finished MultiSensor Unit with solutions for installation, according to certain embodiments of the invention.

FIG. 5 is an exploded perspective view that illustrates an example of FMU installed on the ridge of a sloped roof. FIG. 5 also refers to elements that are described in FIG. 1A, 2, 3, 4 or in other figures.

In this example, a waterproof FMU (501) is installed on a roof (502), slightly overhanging the ridge line (503). The roof of this example includes "Structural members" (506) which support a plywood sheet (505) which supports a roofing complex (507) made of membrane and shingles, shakes, tiles or other material. Other embodiments of the invention could involve other types of roofs or other types of host structures. The FMU could be installed on other parts of the roof or on other types of structure.

The "Attachment part" has been installed first. It includes one or several "Spreader beams" (504), which can have any design, material or size. In this example, the "Spreader beams" (504) have an L shape which corresponds to the reversed L shape of the TBs (508) which rest on them. The "Spreader beams" (504) are affixed to the roof (502) by "Fixing members" (512), either affixed to the plywood sheet (505) or affixed to the underlying "Structural members" (506) through the plywood sheet. The up-hill "Spreader beam" (504) is affixed close to the ridge line, or it can be distant from the ridge line.

It is possible to get the area below the FMU (501) free of any water by preventing water from penetrating below the WB (509), which can be done by creating a "Waterproof curtain" at the WB's" perimeter. A "Waterproof curtain" can be created either on the ridge side façade of the FMU (501) or on the lateral sides if needed, or at the eave side, or several of these. When the FMU is not installed on a ridge, waterproof curtains can be created on some or all of the sides of the FMU. In some cases, a sloped flashing system like a "cricket system" is installed on the up-hill side of the FMU and guides flowing water to the sides of the FMU, or in a gutter installed between 2 FMUs.

On the ridge line, the water is rejected beyond the ridge, for example to the other side of the roof, like in this example. In other cases, depending on the roof's design, the water can be rejected elsewhere. Water is either channeled inside the waterproof "Ventilation channel" (511) or rejected outside the FMU (501).

On the lateral sides of the FMU (501), a "Lateral flashing system" (510) can be created when needed, but some embodiments do not use "Lateral flashing systems".

Waterproof Curtain and Ridge Waterproofing:

The AComp is attached first and it provides a first level of waterproof sealing: a flashing system (513) wraps the "Spreader beam" (504) on at least one face and connects to the roofing material (507) on the other side of the roof in order to push water away from the FMU and to prevent water from entering the space below the "Production component's" WB (509). Sealing is this way achieved up to the height of the "Spreader beam", which depends on the chosen design. If the solution was implemented on a different kind of roof or supporting structure, the design could vary.

The "Production component's" TB (508) is attached to the "Spreader beam" (504) using "Main fasteners" (514) which can for example be screwed, or glued, or riveted, or bolted from the outside, possibly robotically. The TB (508) has a reversed L shape, or any other shape, and can be long or short depending on the design. The TB could also have the shape of a reversed U profile in order to wrap around the "Spreader beam" and improve the waterproof junction between the 2 beams, for example using seals or as a W which could also be used as counter-flashing. The AComp is now waterproofed on its up-hill ridge side. The PComp is waterproofed using a WB (509), which in this embodiment is a folded aluminum sheet spanning from LSC (515) to LSC (515) that goes up along the lateral walls of the rails, thus creating a ventilation channel (511) between the LSCs (515), the panels (516) and the waterproofing sheet or membrane (509). However, if the PComp is constructed off-structure and needs to be fastened to the AComp, the "Main fasteners" might have to pierce the flashing system (513) and create leaks. Waterproof fasteners can be used. In order to prevent any water from going behind the waterproofing sheet (509), two additional flashing systems can in some cases be created either with wrapped or folded metal or with other waterproof materials:

A flashing system (517) overlaps the part of the waterproofing sheet (509) between the LSCs (515) at the end of the channel (511), it goes down in order to create a drip and to hide the junction between the TB (508) and the "Spreader beam" (504) so no water may come below the waterproofing sheet (509), even going through the "Fastening points" (518) or the "Main fasteners" (514).

A flashing system (519) wraps around the end of the LSCs (515) and comes into the channel (511), overlapping the waterproofing sheet (509) so no water may come behind the WB (509).

In some cases, the up-hill side flashing systems are made wider than the PComp in order to offer a better protection by deflecting the water away from the lateral sides of the FMU.

In some cases, the flashing system (517) is created using a longer WB sheet which is bent at its tip in order to create a flashing system similar to 517. In this case, elements 509 and 517 are the same part.

The air flow (520) goes out at the end of the ventilation channel (511). In some cases, "Dressing elements" such as protection or decoration grilles (521), or filters, can be installed at the end of the channel (511). In some cases, a cable tray (525) is created inside the channel (511) in order to circulate the cables or other elements.

Waterproof Curtain and Lateral Waterproofing:

In some particular embodiments, a "Lateral waterproofing system" (524) is added in order to prevent lateral water penetrations. A "Lateral shoulder" (522) such as a board is installed on the outer side of the outer LSC (515) of a FMU (501) or of a group of FMUs. It can be installed prior to, or in the same time as the AComp is installed, or later. A flashing system (510), appropriate for the type of surrounding roofing material for example step flashing, is installed on the shoulder (522). The flashing system can favorably be protected by a drip formed by the LSC or by another system. In some cases, a cover (523) or a "Dressing element" made of membrane or of folded metal or of other materials, overlaps the flashing system (510) as a drip former. Depending on the LSC's design, the cover (523) either fits below a drip former of the LSC (515) and overlaps the flashing system (510) or wraps around the LSC so water can only go either inside the channel (511) or on the roof (502) and water cannot go behind the flashing system and below the FMU. The cover can have any design or aspect. The "Lateral waterproofing system" (524) is inserted between the LSC (515) and the cover (523). In some cases, the cover (523) comes with the off-structure constructed FMU: the "Lateral waterproofing system" is installed first and the LSC with its cover (523) cap it when the PComp is craned down onto the roof.

Figure 6:
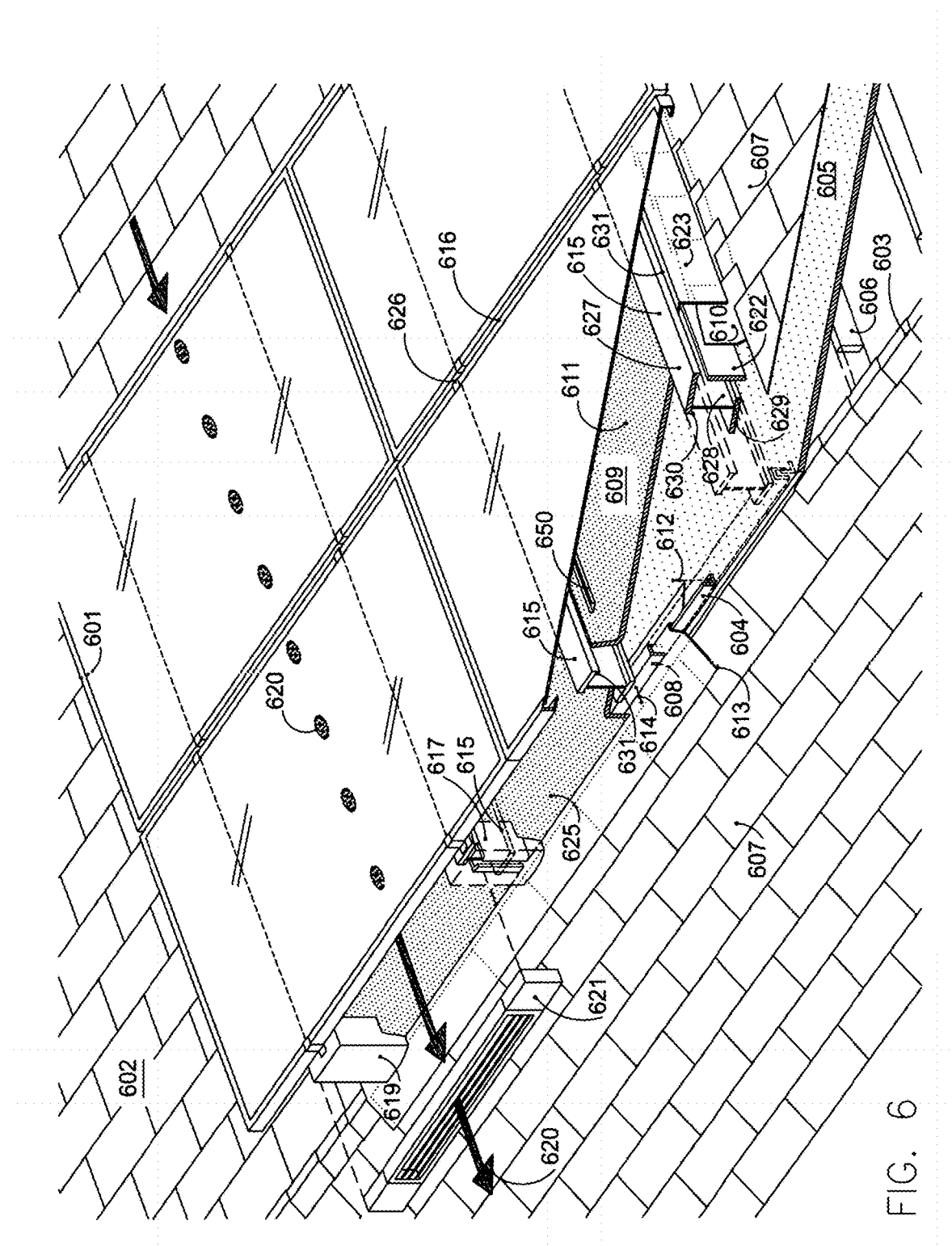
FIG. 6 illustrates a perspective view of a Finished MultiSensor Unit with solutions for installation, according to certain embodiments of the invention.

FIG. 6 is an exploded perspective view that illustrates another embodiment of FMU installed on the ridge of a sloped roof. FIG. 6 also refers to elements that are described in FIG. 1A, 2, 3, 4, 5 or in other figures.

In this example, a waterproof FMU (601) is installed on a roof (602), slightly overhanging the ridge line (603). The roof of this example includes "Structural members" (606) which support a plywood sheet (605) which supports a roofing complex (607) made of membrane and tiles or shingles, shakes or other material. Some of the solutions described in any figure can be used in other embodiments or in cases or configurations described in other figures. The FMU could be installed on other parts of the roof or on other types of structure.

The "Attachment part" has been installed first. It includes one or several "Spreader beams" (604), which can have any design, material or size. In this example, the "Spreader beams" (604) have an L shape on which rest the reversed U shape of the TBs (608). The "Spreader beams" (604) are affixed to the roof (602) by "Fixing members" (612), either affixed to the plywood sheet (605) or affixed to the underlying "Structural members" (606) through the plywood sheet. The up-hill "Spreader beam" (604) is affixed close to the ridge line.

In this embodiment of FMU, the panels (616) are attached to LSCs (615) by clamps (626). The LSCs are substantially parallel to each other and installed in the direction of the slope of the roof. The LSCs are not aligned with the edges of the panels: in this example, they are some distance inside the inside the width of the panels, as the panel makers sometimes require. In this example, the LSCs have substantially the shape of a Z profile, which includes a top portion (627) on which are attached the clamps (626) or the panels (616), a central portion (628), an attachment member (629) that allows attaching or screwing the LSC to the TB, and drip formers (630, 631) that cap flashing systems (610) and waterproof barriers (609).

It is possible to get the area below the FMU (601) free of any water by preventing water from penetrating below the WB (609), which can be done by creating a "Waterproof curtain" at the "WB's perimeter. A "Waterproof curtain" can be created either on the ridge side façade of the FMU (601) or on the lateral sides if needed, or at the eave side, or both. When the FMU is not installed on a ridge, waterproof curtains can be created on some or all of the sides of the FMU. In some cases, a sloped flashing system like a "cricket system" is installed on the up-hill side of the FMU and guides flowing water to the sides of the FMU, or in a gutter installed between 2 FMUs.

On the ridge line, the water is rejected beyond the ridge, for example to the other slope of the roof, like in this example. In other cases, depending on the roof's design, the water can be rejected elsewhere. Water is either channeled inside the waterproof "Ventilation channel" or rejected outside the FMU (601).

On the lateral sides of the FMU (601), a "Lateral flashing system" (610) can be created when needed, but some embodiments do not use "Lateral flashing systems".

Waterproof Curtain and Ridge Waterproofing:

The AComp is attached first and it provides a first level of waterproof sealing: a flashing system (613) wraps the "Spreader beam" (604) on at least one face and connects to the roofing material (607) on the other side of the roof in order to push water away from the FMU and to prevent water from entering the space below the "Production component's" WB (609). Sealing is this way achieved up to the height of the "Spreader beam", which depends on the chosen design. If the solution was implemented on a different kind of roof or supporting structure, the design might vary.

The "Production component's" TB (608) is attached to the "Spreader beam" (604) using "Main fasteners" (614) which can for example be screwed, glued, riveted, welded or bolted from the outside, possibly robotically. In this embodiment, the TB (608) has a reversed U shape, which caps the "Spreader beam" and improves the waterproof junction between the 2 beams, for example using sealing systems. The TB could also have the shape of a reversed L profile or as a W which could also be used as counter-flashing or any other shape or profile. The AComp is now waterproofed on its up-hill ridge side. The PComp is waterproofed using a WB (609), which in this embodiment is spanning from LSC (615) to LSC (615) and going up along the lateral walls of the LSCs thus creating a ventilation channel (611) between the LSCs (615), the panels (616) and the WB (609). In this embodiment, the WB is made of a formable material, such as molded plastic, formed or thermoformed plastic, resin, fiber glass, embossed metal, folded metal, cast material, membrane or other materials that allow to obtain complex shapes, in order to provide all the necessary flashings in one or several pieces that are easy to install:

In some cases, a flashing part (617, 619) wraps around the tip of LSCs (615) at the end of the channel (611), and goes down in order to create a drip and to hide the junction between the TB (608) and the "Spreader beam" (604) so no water may come below the waterproofing sheet (609).

In some cases, a formed cap (619) wraps around the end of the LSCs (615) and comes into the channel (611), overlapping the waterproofing sheet (609) so no water may come behind the "Waterproofing barrier" (609).

In some cases, the WB extends essentially vertically on the outer face of the TB in order to create a continuous WB even on the front face and to create a drip former (625) and counterflashing. This can be done in one piece or using several parts.

In some cases, the up-hill side flashing systems are made wider than the PComp in order to offer a better protection by deflecting the water away from the lateral sides of the FMU.

The air flow (620) goes out at the end of the ventilation channel (611). In some cases, "Dressing elements" such as protection or decoration grilles (621), or filters, can be installed at the end of the channel (611). In some cases, a cable tray (650) is created inside the channel (611) in order to circulate the cables or other elements.

Waterproof Curtain and Lateral Waterproofing:

In some particular embodiments, a "Lateral waterproofing system" is added in order to prevent lateral water penetrations. It includes a lateral shoulder and a flashing system. A "Lateral shoulder" (622) such as a board is installed on the outer side of the outer LSC (615) of a FMU or of a group of FMUs. It can be installed prior to, or in the same time as the AComp is installed, or later. A flashing system (610), appropriate for the type of surrounding roofing material, is installed on the shoulder (622). The flashing system can favorably be protected by a drip (631) formed by the LSC (615) or by another system. In some cases, a cover (623) or a "Dressing element" made of membrane or of folded metal or of other materials, overlaps the flashing system (610). Depending on the LSC's design, the cover (623) either fits below a drip former (631) of the LSC (615) and overlaps the flashing system (610), or wraps around the LSC so water can only go either inside the channel (611) or on the roof (602) and water cannot go behind the flashing system and below the FMU. The cover can have any design or aspect. The "Lateral waterproofing system" is inserted between the LSC (615) and the cover (623). In some cases, the cover (623) comes with the off-structure constructed FMU: the "Lateral waterproofing system" is installed first and the LSC and the cover cap it when the PComp is driven down onto the roof.

Figure 7:
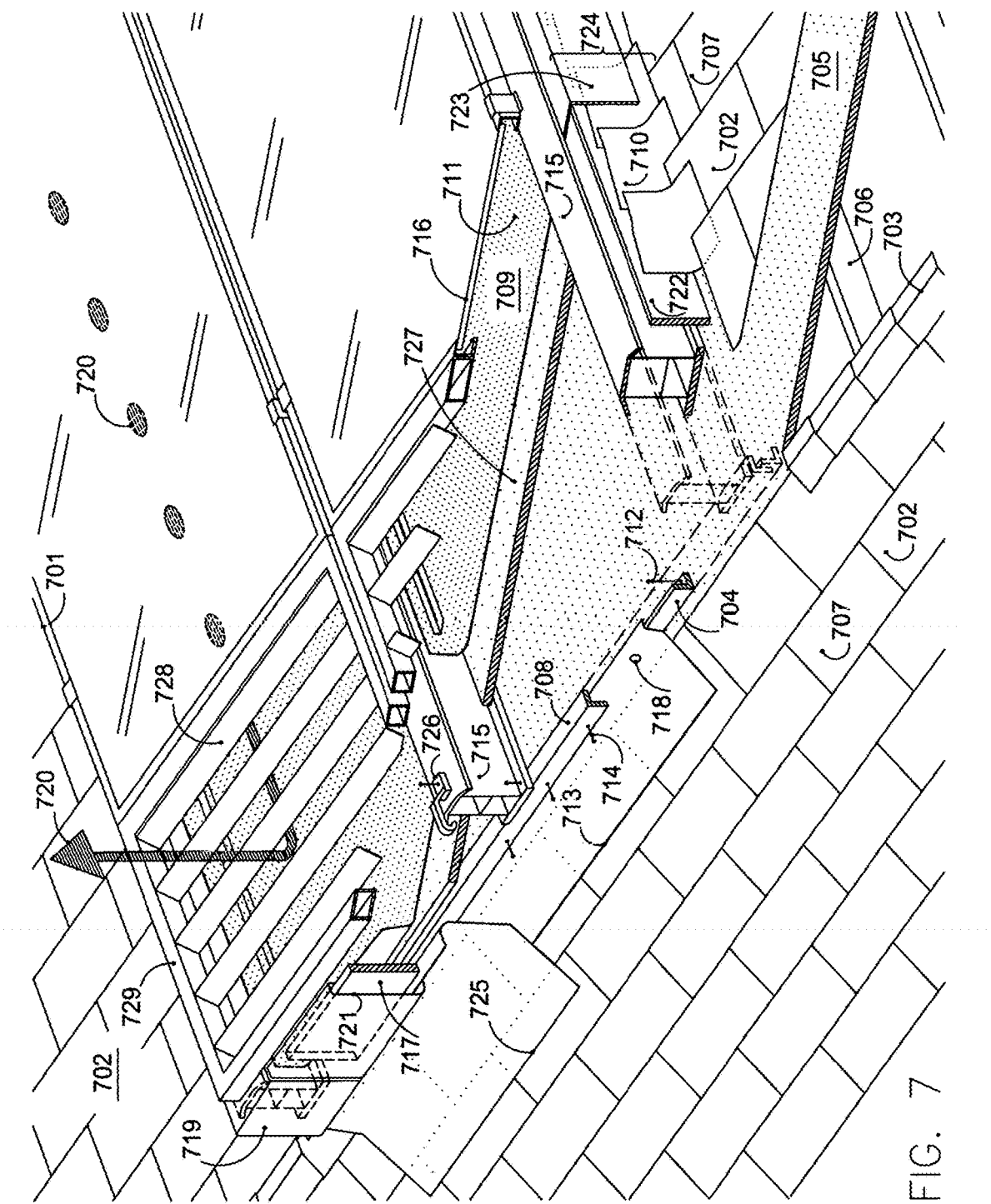
FIG. 7 illustrates a perspective view of a Finished MultiSensor Unit with solutions for installation, according to certain embodiments of the invention.

FIG. 7 is an exploded perspective view that illustrates another embodiment of FMU installed on the ridge of a sloped roof. FIG. 7 also refers to elements that are described in FIG. 1A, 2, 3, 4, 5, 6 or other figures.

In this example, a waterproof FMU (701) is installed on a roof (702), possibly slightly overhanging the ridge line (703). The roof of this example includes "Structural members" (706) which support a plywood sheet (705) which supports a roofing complex (707) made of membrane and tiles, shingles, shakes or other material. The FMU could be installed on other parts of the roof or on other types of structure.

The "Attachment part" has been installed first. It includes one or several "Spreader beams" (704), which can have any design, material or size. In this example, the "Spreader beams" (704) have an L shape which corresponds to the reversed L shape of the TBs (708) which rest on them. The "Spreader beams" (704) are affixed to the roof (702) by "Fixing members" (712), either affixed to the plywood sheet (705) or affixed to the underlying "Structural members" (706) through the plywood sheet. The up-hill "Spreader beam" (704) is affixed close to the ridge line. The PComp includes hooks (726) of any size, design or material that are attached to the LSCs or to other members. When transporting the off-structure constructed FMU, the lifting system can be fastened to these hooks. In some cases, a rigid bar or a beam spanning several LSCs, possibly the size of the FMU, can take several hooks so the PComp is transported without deflecting transversally, which allows for reducing the size of the TB or for avoiding having one. In some cases, hooks are not used but a jig, a bar, a beam or a lifting system connects to the LSC, the TB, the dressing elements, the panels or to structural elements and allow the PComp or the FMU to be moved or lifted.

The area below the FMU (701) can be made free of any water by preventing water from penetrating below the WB (709), which can be done by creating a "Waterproof curtain" at the "Waterproof barrier's" perimeter. A "Waterproof curtain" can be created either on the ridge side façade of the FMU (701) or on the lateral sides if needed, or at the eave side, or both. When the FMU is not installed on a ridge, waterproof curtains can be created on some or all of the sides of the FMU. In some cases, a sloped flashing system like a "cricket system" is installed on the up-hill side of the FMU and guides flowing water to the sides of the FMU, or in a gutter installed between 2 FMUs.

On the ridge line, the water is rejected beyond the ridge, for example to the other slope of the roof, like in this example. In other cases, depending on the roof's design, the water can be rejected elsewhere. Water is either channeled inside the waterproof "Ventilation channel" (711) or rejected outside the FMU (701).

On the lateral sides of the FMU (701), a "Lateral flashing system" (710) can be created when needed, but some embodiments do not use "Lateral flashing systems".

Waterproof Curtain and Ridge Waterproofing:

The AComp is attached first and it provides a first level of waterproof sealing: a flashing system (713) wraps the "Spreader beam" (704) on at least one face and connects to the roofing material (707) on the other side of the roof in order to push water away from the FMU and to prevent water from entering the space below the "Production component's" WB (709). Sealing is this way achieved up to the height of the "Spreader beam", which depends on the chosen design. If the solution was implemented on a different kind of roof or supporting structure, the design might vary.

The PComp's TB (708) is attached to the "Spreader beam" (704) using "Main fasteners" (714) which can for example be screwed, or glued, or riveted, or bolted from the outside, possibly robotically. The TB (708) has a reversed L shape, or any other shape, and can be long or short depending on the design. The TB could also have the shape of a reversed U profile in order to wrap around the "Spreader beam" and improve the waterproof junction between the 2 beams, for example using seals or as a W which could also be used as counter-flashing. The AComp is now waterproofed on its up-hill ridge side.

The PComp is waterproofed using a WB (709), which in this embodiment is a folded aluminum sheet resting on a "MFB" (727) spanning from LSC (715) to LSC (715) that goes up along the lateral walls of the rails, thus creating a ventilation channel (711) between the LSCs (715), the panels (716) and the waterproofing sheet or membrane (709). In the embodiment of FIG. 7, the ridge side tip of the channel (711) is blocked in a waterproof manner in order to provide a high flashing system. The air flow (720) exits the channel (711) by vents (728) in "Top dressing elements" (729), louvres or grilles.

However, if the PComp is constructed off-structure and needs to be fastened to the AComp, the "Main fasteners" (714) might have to pierce the flashing system (713) and could create leaks. In order to prevent any water from going behind the waterproofing sheet (709), two additional flashing systems can in some cases be created either with wrapped or folded metal or with other waterproof materials:

A board (717) caps the channel (711) either between 2 LSCs (715) or in front of the LSCs. The WB (709) goes up the channel side of the board (717), which then becomes a waterproof basin closed on the bottom and 3 sides. A Flashing system (721) wraps the board and goes down the in-channel face of the board (717) in order to overlap the WB (709), and goes down the external face of the board (717) in order to create a cover or a drip that hides the junction between the TB (708) and the "Spreader beam" (704) so no water may come below the waterproofing sheet (709), even going through the "Fastening points" (718) or the "Main fasteners" (714). In some cases, an additional flashing system (725), or it may be done by extending the flashing sheet (721), extends to overlap the roofing material (707) beyond the ridge (703) on the other side of the roof.

A flashing system (719) wraps around the end of the LSCs (715) and comes into the channel (711), overlapping the waterproofing sheet (709) so no water may come behind the "Waterproofing barrier" (709). In some cases, this flashing function is accomplished by an extended version of the flashing system (721).

In some cases, the up-hill side flashing systems are made wider than the PComp in order to offer a better protection by deflecting the water away from the lateral sides of the FMU.

Waterproof Curtain and Lateral Waterproofing:

In some particular embodiments, a "Lateral waterproofing system" (724) is added in order to prevent lateral water penetrations. A "Lateral shoulder" (722) such as a board is installed on the outer side of the outer LSC (715) of a FMU or of a group of FMUs. It can be installed prior to, or in the same time as the AComp is installed, or later. A flashing system (710), appropriate for the type of surrounding roofing material, is installed on the shoulder (722). The flashing system can favorably be protected by a drip formed by the LSC or by another system. In some cases, a cover (723) or a "Lateral dressing element" made of membrane or of folded metal or of other materials, overlaps the flashing system (710) as a drip former. Depending on the LSC's design, the cover (723) either fits below a drip former of the LSC (715) and overlaps the flashing system (710) or wraps around the LSC so water can only go either inside the channel (711) or on the roof (702) and water cannot go behind the flashing system and below the FMU. The "Lateral waterproofing system" (724) is inserted between the LSC (715) and the cover (723). In some cases, the cover (723) comes with the off-structure constructed FMU: the "Lateral waterproofing system" is installed first and the LSC and the cover cap it when the PComp is craned down onto the roof.

Figure 8:
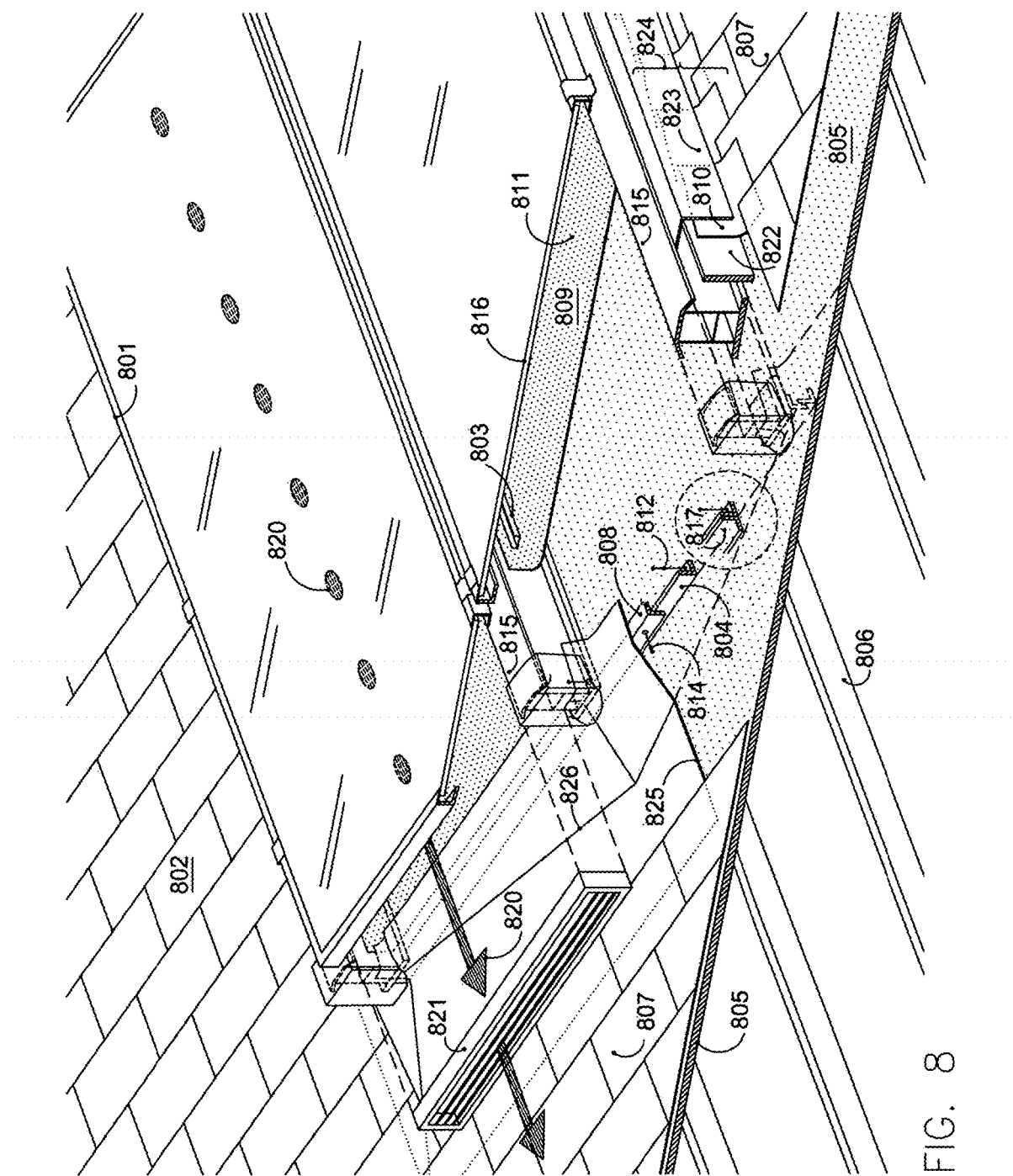
FIG. 8 illustrates a perspective view of a Finished MultiSensor Unit with solutions for installation, according to certain embodiments of the invention.

FIG. 8 is an exploded perspective view that illustrates an example of FMU integrated into a portion of a sloped roof that is not the ridge. FIG. 8 also refers to elements that are described in FIG. 1A, 2, 3, 4, 5, 6, 7 or other figures.

In this example, a waterproof FMU (801) is installed on a roof (802). The roof of this example includes "Structural members" (806) which support a plywood sheet (805) which supports a roofing complex made of membrane and tiles, shakes, shingles (807) or other material. The FMU could be installed on other parts of the roof or on other types of structure.

The "Attachment part" has been installed first. It includes one or several "Spreader beams" (804), which can have any design, material or size. In this example, the "Spreader beams" (804) have an L shape which corresponds to the reversed L shape of the TBs (808) which rest on them. The "Spreader beams" (804) are affixed to the roof (802) by "Fixing members" (812), either affixed to the plywood sheet (805) or affixed to the underlying "Structural members" (806) through the plywood sheet.

The area below the FMU (801) can be made free of any water by preventing water from penetrating below the WB (809), which can be done by creating a "Waterproof curtain" at the "WB's perimeter. A "Waterproof curtain" can be created either on the ridge side façade of the FMU (801) or on the lateral sides if needed, or at the eave side, or both. When the FMU is not installed on a ridge, waterproof curtains can be created on some or all of the sides of the FMU.

In this embodiment, the FMU is integrated into the roof, it is part of the building's waterproofing system. Water flowing on the roof above the FMU either reaches an "Up-hill side flashing system" (825), possibly shaped as a cricket system (826) that guides water either to the sides of the FMU or to a gutter installed between 2 FMUs, or to the channel (811) that guides it to an exist at the down-hill side of the channel.

On the lateral sides of the FMU (801), a "Lateral flashing system" (810) can be created when needed, but some embodiments do not use "Lateral flashing systems".

Waterproof Curtain and Up-Hill Side Waterproofing:

The "Production component's" TB (808) is attached to the "Spreader beam" (804) using "Main fasteners" (814) which can for example be screwed, or glued, or riveted, or bolted from the outside, possibly robotically. The TB (808) has a reversed L shape, or any other shape, and can be long or short depending on the design. The TB could also have the shape of a reversed U profile in order to wrap around the "Spreader beam" and improve the waterproof junction between the 2 beams, for example using seals or as a WB which could also be used as counter-flashing. The PComp is waterproofed using a WB (809), which in this example is a folded self-standing impervious sheet spanning from LSC (815) to LSC (815) that goes up along the lateral walls of the rails, thus creating a ventilation channel (811) between the LSCs (815), the panels (816) and the waterproofing sheet or membrane (809). In order to prevent any water from going behind the waterproofing sheet (809), an "Up-hill side flashing sheet" (825), made of one or several components or sheets of impervious material, is installed such that it drives any water flowing from the upper part of the roof either to the sides on the FMU or inside the waterproof channel (811). This "Up-hill side flashing sheet" (825) is slipped below the upper covering/roofing material (807) like a classical flashing system, goes inside the channel (811) and wraps around the LSC's tips. In order to prevent water from getting behind the WB (809), the "Up-hill side flashing sheet" (825) overlaps the WB both in the bottom of the channel and where the WB is going up on the sides on the LSCs. In order to guide water away from the FMU, the "Up-hill side flashing sheet" (825) may have a cricket style shape (826). In order to prevent water from penetrating laterally below the FMU, the "Up-hill side flashing sheet" (825) overlaps the "Lateral flashing system" (824), if any.

The air flow (820) goes out at the end of the ventilation channel (811). In some cases, "Dressing elements" such as protection or decoration grilles (821), or filters, can be installed at the end of the channel (811).

Waterproof Curtain and Lateral Waterproofing:

In some particular embodiments, a "Lateral waterproofing system" (824) is added in order to prevent lateral water penetrations. A "Lateral shoulder" (822) such as a board is installed on the outer side of the outer LSC (815) of a FMU or of a group of FMUs. It can be installed prior to, or in the same time as the AComp is installed, or later. A flashing system (810), appropriate for the type of surrounding roofing material, is installed on the shoulder (822). The flashing system can favorably be protected by a drip formed by the LSC or by another system. In some cases, a cover (823) or a "Dressing element" made of membrane or of folded metal or of other materials, overlaps the flashing system (810) as a drip former. Depending on the LSC's design, the cover (823) either fits below a drip former of the LSC (815) and overlaps the flashing system (810) or wraps around the LSC so water can only go either inside the channel (811) or on the roof (802) and water cannot go behind the flashing system and below the FMU. The "Lateral waterproofing system" (824) is inserted between the LSC (815) and the cover (823). In some cases, the cover (823) comes with the off-structure constructed FMU: the "Lateral waterproofing system" is installed first and the LSC and the cover cap it when the PComp is craned down onto the roof.

In an alternative embodiment, "Spreader beams and TBs are combined in 1 component (817). In the example of FIG. 8, the combined component has a reversed T shape: one leg of the T is attached below the LSC like the TB (808) and the other leg Is to be affixed to the roof like the "Spreader beam" (804). If the transversal rigidity provided by the combined component (817) is not sufficient for lifting the FMU, a lifting beam can be used and attached to hooks connected to the FMU, thus preventing deflection. The "Up-hill side flashing sheet" covers the "Fixing members" that affix the combined component (817) to the roof. This way, the gap between the roof and the FMU is reduced and the FMU is lower. PComp and AComp may be combined and installed in the same time, which in some cases, allows for an even simpler installation process in 1 step only. In this example of embodiment, a cable tray (803), located in the ventilation channel, circulates cables, fluids or information.

Figure 9:
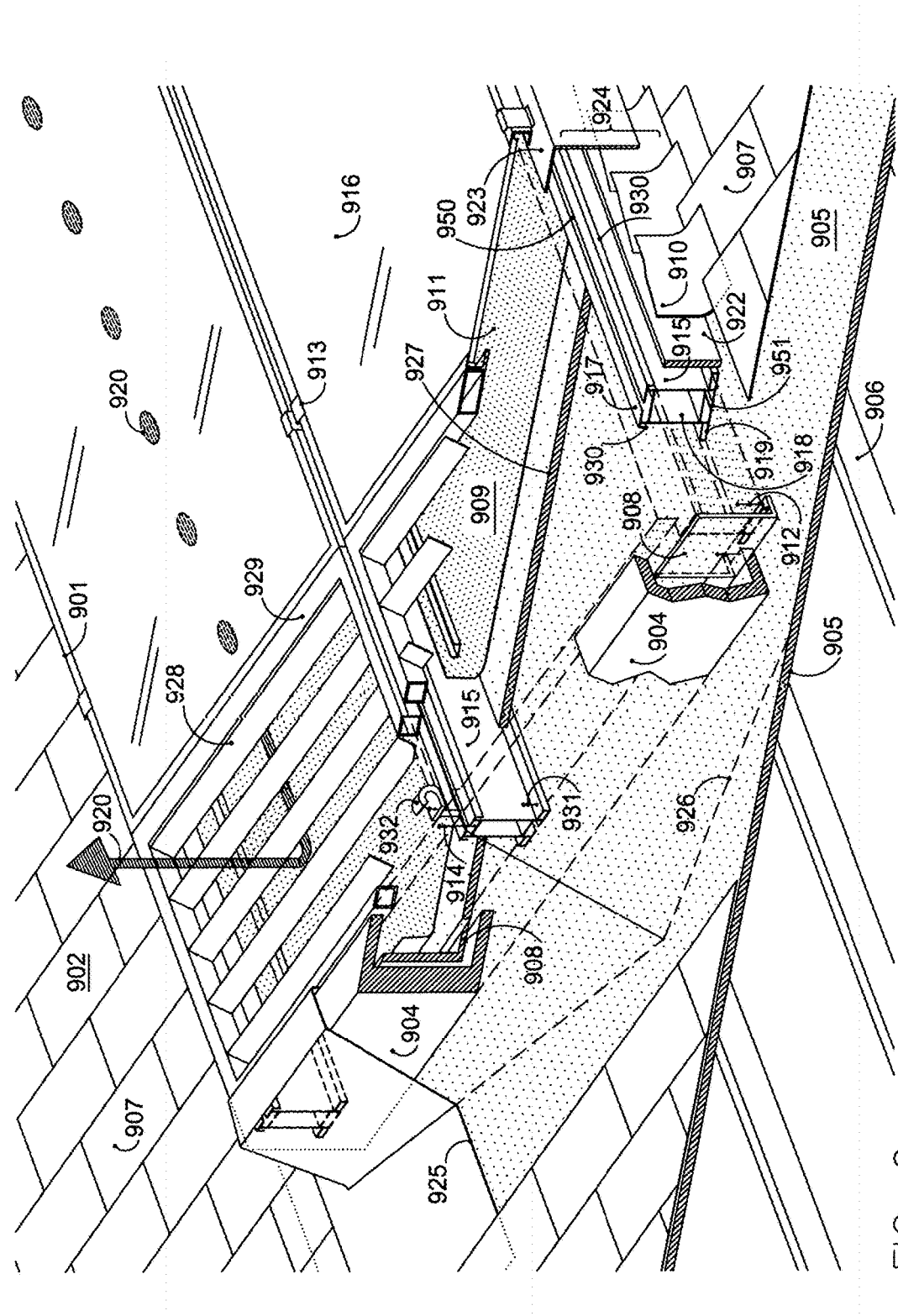
FIG. 9 illustrates a perspective view of a Finished MultiSensor Unit with solutions for installation, according to certain embodiments of the invention.

FIG. 9 is an exploded perspective view that illustrates another example of FMU integrated into a portion of a sloped roof that is not the ridge. FIG. 9 also refers to elements that are described in FIG. 1A, 2, 3, 4, 5, 6, 7, 8 or other figures.

In this example, a waterproof FMU (901) is installed on a roof (902). The roof of this example includes "Structural members" (906) which support a plywood sheet (905) which supports a roofing complex (907) made of membrane and tiles, shingles, shakes or other material. The FMU could be installed on other parts of the roof or on other types of structure.

The "Attachment part" has been installed first. It includes one or several "Spreader beams" (904), which can have any design, material or size. In this example, the "Spreader beams" (904) have a rotated U shape which corresponds to the L shape of the TBs (908) which fit in them. The "Spreader beams" (904) are affixed to the roof (902) by "Fixing members" (912), either affixed to the plywood sheet (905), possibly using "Spreader legs", or affixed to the underlying "Structural members" (906) through the plywood sheet.

In this embodiment, the LSCs (915) comprise a top portion (917) on which are attached the clamps (913) or the panels (916), a central portion (918), an attachment portion (919) that allows for attaching the LSCs to the TB, as well as a top groove at the top of the LSC (950) and a groove at the bottom or on the side of the LSC (951), both grooves where a nut or a fastener can slide in order for a screw to secure loads or objects as well as drip formers (930).

In this embodiment, the L shaped TB (908) is attached at the tip of the channel (911) and of the LSCs (915) in order to provide transversal rigidity to the PComp and to provide a vertical support on which the WB (909) can go up as a flashing system at the tip of the channel. The substantially horizontal leg of the TB goes below the LSCs and is attached to the substantially horizontal member of the LSCs by "attachment members" (931). In some embodiments, hooks (932) are attached to the LSCs. When the PComp is driven down to be installed, the up-hill side is driven down first until the L shaped TB (908) fits in the hollow part of the substantially U shaped "Spreader beam" (904) and the hook (932) gets hold of the upper part of the "Spreader beam". Then the PComp is driven down, which causes it to hinge around the hook. This way, positioning the PComp is easy: once the hooks (932) are connected to the TB and work as a hinge, the PComp rotates around the axis formed by the edge of the TB and remains perfectly aligned. When the PComp is in place, it is fastened to the "Spreader beam" (904): "Main fasteners" (914) screw the top part of the "Spreader beam" (904) to the top of the LSCs (915) or of the hooks (932), which is easy to do from the top and can be done by crews or automated machines.

The "spreader beam" (904) is higher than the PComp so it can be used as a support for flashing systems.

It is possible to get the area below the FMU (901) free of any water by preventing water from penetrating below the WB (909), which can be done by creating a "Waterproof curtain" at the "Waterproof barrier's" perimeter. A "Waterproof curtain" can be created either on the up-hill side façade of the FMU (901) or on the lateral sides if needed, or at the eave side, or both. When the FMU is not installed on a ridge, waterproof curtains can be created on some or all of the sides of the FMU.

In this embodiment, the FMU is integrated into the roof, it is part of the building's waterproofing system. Water flowing on the roof above the FMU either hits an "Up-hill side flashing system" (925), which rises as high as the "Spreader beam" (904), and overlaps it, which means in this case the "Up-hill side flashing system" goes higher than the PComp. As the WB (909) goes as far as the end of the LSCs (915) which are overlapped by the "Spreader beam" a drop of water falling on the top of the "Up-hill side flashing system" could only go either in the waterproof channel (911) or on the up-hill side of the "Up-hill side flashing system" and be guided away. The "Up-hill side flashing system is shaped as a cricket system (926) that guides water to the sides of the FMU or to a gutter installed between 2 FMUs. This up-hill flashing system (925), with or without cricket (926), can be used in other configurations wherein the spreader beam (904) and TB (908) have a different design.

On the lateral sides of the FMU (901), a "Lateral flashing system" (910) can be created when needed, but some embodiments do not use "Lateral flashing systems".

Waterproof Curtain and Up-Hill Side Waterproofing:

The PComp is waterproofed using a WB (909), which in this example is a folded impervious sheet, resting on a MFB (927) spanning from LSC (915) to LSC (915) that goes up along the lateral walls of the LSCs and up along the TB, thus creating a ventilation channel (911) between the LSCs (915), the panels (916), the TB and the waterproofing sheet or membrane (909).

The "Up-hill side flashing sheet" (925) is made of one or several components or sheets of impervious material, is installed such that it drive any water flowing from the upper part of the roof either on the sides on the FMU or inside the channel (911). This "Up-hill side flashing sheet" (925) is slipped below the upper covering material (907) like a classical flashing system, goes over the "Spreader beam" (904) and in some cases covers the "Main fasteners".

In order to guide water away from the FMU, the "Up-hill side flashing sheet" (925) may have a cricket style shape (926). In order to prevent water from penetrating laterally below the FMU, the "Up-hill side flashing sheet" (925) overlaps the "Lateral flashing system" (924), if any.

The air flow (920) exits the channel (911) by vents (928) in "Top dressing elements" (929), louvres or grilles.

Waterproof Curtain and Lateral Waterproofing:

In some specific embodiments, a "Lateral waterproofing system" (924) is added in order to prevent lateral water penetrations. A "Lateral shoulder" (922) such as a board is installed on the outer side of the outer LSC (915) of a FMU or of a group of FMUs. It can be installed prior to, or in the same time as the AComp is installed, or later. A flashing system (910), appropriate for the type of surrounding roofing material, is installed on the shoulder (922). The flashing system can favorably be protected by a drip formed by the LSC or by another system. In some cases, a cover (923) or a "Dressing element" made of membrane or of folded metal or of other materials, overlaps the flashing system (910) as a drip former. Depending on the LSC's design, the cover (923) either fits below a drip former of the LSC (915) and overlaps the flashing system (910) or wraps around the LSC so water can only go either inside the channel (911) or on the roof (902) and water cannot go behind the flashing system and below the FMU. The "Lateral waterproofing system" (924) is then inserted between the LSC (915) and the cover (923). In some cases, the cover (923) comes with the off-structure constructed FMU: the "Lateral waterproofing system" is installed first and the LSC and the cover cap it when the PComp is craned down onto the roof.

Figure 10:
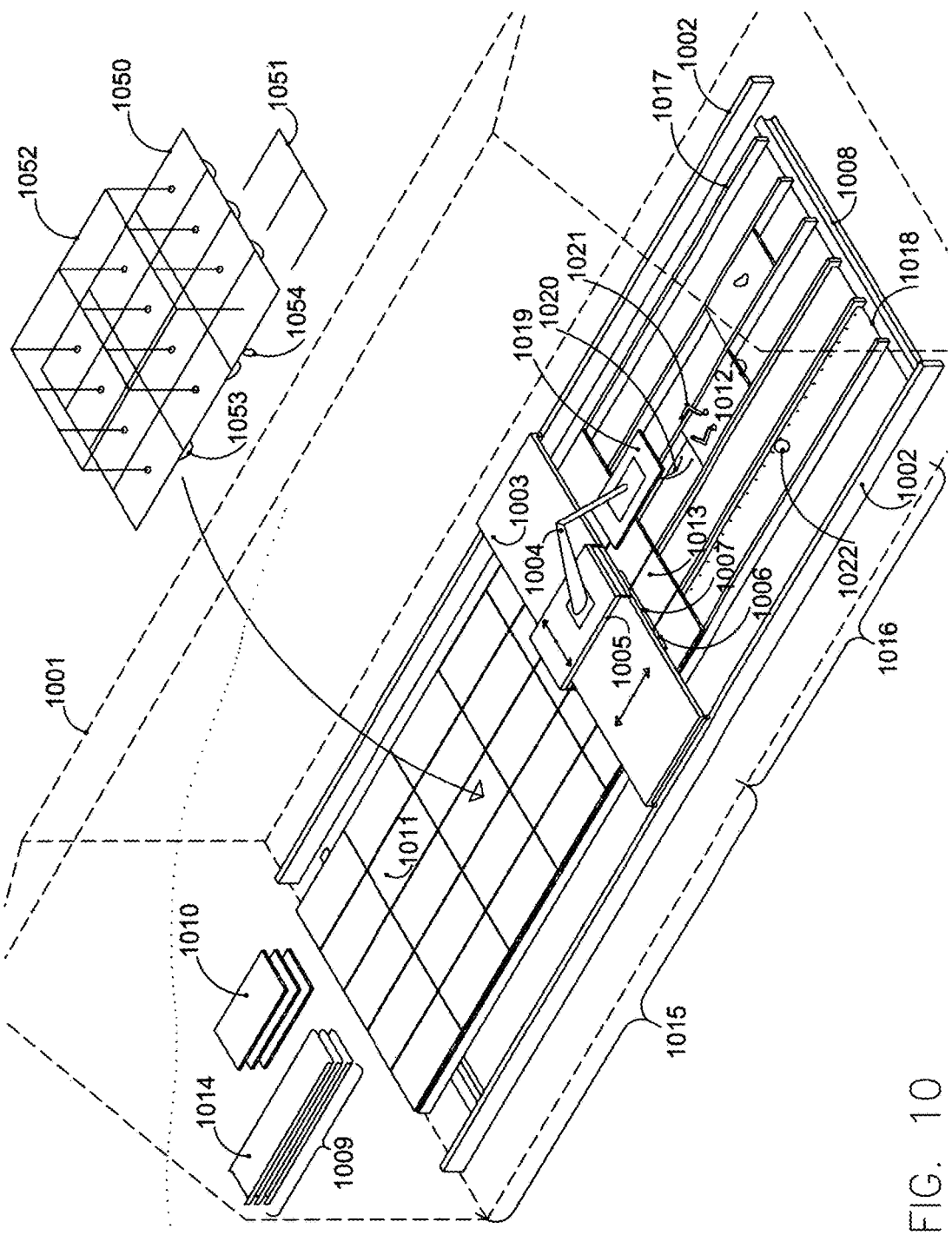
FIG. 10 illustrates a perspective view of a Finished MultiSensor Unit construction bench, according to certain embodiments of the invention.

FIG. 10 is a perspective view that illustrates an example of off structure FMU construction bench, which can be fixed or transportable for use in the shop or on site. FIG. 10 also refers to elements that are described in FIG. 1A, 2, 3, 4, 5, 6, 7, 8, 9 or other figures.

Various embodiments of the system and process of FIG. 10 can be designed and used for various types of FMUs and products, including FMUs, rooftop FMUs, canopy tops, FMU canopies, Canopy Top Carports and other designs.

In some cases, FMUs can be constructed in a shop or in a factory distant from their final installation location or they can be constructed close to the installation location using a portable version of the tools and machinery described in FIG. 9 or using portable tools.

It is more efficient to build the FMU in a workshop or in a convenient site than on the host structure such as on a roof or on a solar farm structure. It is cheaper, quicker, less dangerous, the quality is much better achieved and controlled, and adaptations are easier.

In some cases, FMUs (1011) use LSCs (1017) or rails that make off-structure construction easy since they generate a repetitive construction system and they are structurally rigid which allows for transportation and manipulation and thus easier mounting.

The off structure construction bench may be off-site or on-site, possibly in a permanent shop, or in a temporary shop such as a tent (1001), or outdoor, or on a mobile platform such as a truck or a train, or portable. Some embodiments of off structure FMU construction benches can be quickly installed on a site and dismounted after reuse.

Two parallel tracks or rails (1002) are installed and their level and height adjusted using height adjustment systems. One or several mobile pathways (1003) roll on the tracks (1002). The FMU (1011) is built between the tracks. In some embodiments, the mobile pathway directly supports robotic or manual tools (1004). In some embodiments, the tools are installed on one or several carts (1005), which can move transversally on the mobile pathway (1003) in order to come closer to the area they work on. In some embodiments, another set of carts (1006) is installed below the mobile pathway in order to carry tools (1007) that perform other tasks. In some embodiments, lower carts (1012) or in-channel carts, also carrying tools, are below the level of the panels (1013) in order to perform specific tasks. Embodiments of off structure FMU construction benches can have various levels of automation. In some cases, all the tasks are performed by crewmembers. In some cases some or all of the tasks are performed automatically. The off structure FMU construction bench may include lifting tools, suckers, drillers, screw driving tools, welding tools, riveting tools, gluing tools, robotic hands and arms, testing tools, measurement tools, tools for making electric connections, and any other tool that is needed.

The mobile pathway (1003) rolls above the FMU (1011) to be built. The FMU is built layer after layer in some cases starting from the bottom. Depending on the to-be-built FMU's design, the steps to be performed may differ. In some cases, some jobs need to be done from below as well as from above the FMU.

In an example of embodiment, the TBs (1008), if any, or components of the AComp, if any, or the transportation frames, if any, or other underlying components, if any, are installed first on the bench. Positioning the elements on the bench can be done robotically or manually using computer driven positioning or simple mechanical methods. The accessories (such as waterproofing, insulation, rigid boards, sensors or other equipment or accessories), dressings or finishing elements can be installed at various steps of the process. The wiring, if any, can be made during the off-structure construction phase. In some cases, a transport framework or protections can be added. Additional steps can be performed depending on the specifications of the product. In some cases, the products can be tested at the end of the prefabrication process.

In another example of embodiment, the set of panels (1050) is prepared separately. The panels are placed in their correct position relative to each other, using jigs (1051), markings or electronic positioning, and held in this position. This can be done anywhere, including away from the LSCs, for example above of on the side. In case of electric panels, for example solar panels, the wires (1053) can be connected at this step. The panel set is held either by supporting systems placed underneath the panels or the panels are suspended to a system above located (1052), which can for example use magnetic systems, suction systems or mechanical systems to hold the objects. The set of panels therefore become a movable object which can be placed in a convenient location for work to be done, by humans or machines, such as fastening, wiring, connecting, testing, installing accessories (1054), sensors, or other components or performing any other task. Once the panel set is ready, it is moved as a whole to its destination, for example moved to the top of a prepared set of LSCs using an aerial transportation system, and fastened or connected thus connecting 2 sub-ensembles of the FMU. The set of panels is then fastened to the LSCs (1017) either manually or robotically for example using one or more automated drill-presses that move to the location of each fastener and screw, drill, weld or fasten as needed. This assembling process can be performed by crewmembers or it can be partly or completely automated.

The necessary components are prepared before the assembling starts and they are stored in a storage area (1009) close to the bench. Preparing the components can be done manually or automatically. It involves tasks such as unpacking the panels (1010), cutting the LSCs, TB's, "Spreader beams, cutting or forming the WB (1014), pre-piercing, painting, or other tasks.

In the example of FIG. 10, a FMU is being constructed on the bench. A part of the FMU (1015) is already complete. Another part (1016) is being built. The LSCs (1017) have been carried from the storage area and positioned precisely where they need to be. In this case, the LSCs are installed on TBs (1008). An example of process is as follows (the process may change with the embodiments of FMU and other processes are possible):

- If the FMU includes underlying components such as TBs or others, the mobile pathway (1003) or crewmembers helped by the mobile pathway or crewmembers go get them in the storage area and position them in the right place.
- If the FMU includes LSCs (1017), the mobile pathway (1003) or crewmembers or crewmembers helped by the mobile pathway go get them in the storage area and position them in the right place either on their supporting structure such as the TBs or on an ad-hoc supporting member of the off structure FMU construction bench.
- The LSCs (1017) are attached them to the TBs, either manually by crewmembers or using the mobile pathway (1003) rolling above the attachment location and carrying a driller or a screw driver. The mobile pathway can carry several tools (1004) in the same time or it can work row by row, or it has one or several carts (1003), which roll on the mobile pathway in order to reach all the width of the to be built FMU. In some embodiments, an automated tool (1004) is able to perform the attachment of the LSC onto the TBs without human intervention.
- If the FMU includes lower level accessories, some of them can be installed at this time
- If the FMU includes a WB, the mobile pathway (1003) or crewmembers go get it in the storage area and position it in the right place (in this case, the WB (1018) sits between the LSCs). In some cases, boards, structural systems, insulation or other systems are also installed. In some cases, this step occurs earlier or later in the process for example the WB or boards can be prepositioned first and then installed afterwards or other solutions.

If the WB (1018) needs additional labor such as attaching it, performing flashing jobs, verifying its position or other tasks, it can be done either manually by crewmembers standing close to the WB, or by crewmembers installed on the mobile pathway, or by automated or remote controlled tools carried by one of the mobile pathways or one of the carts, or it can be by a robotic hand carried by in-channel lower carts (1012)

If in channel accessories, such as sensors (1022) or other elements, are to be installed below the panels (1013), they can be installed at this time.

The mobile pathway (1003) or crewmembers go get one or several panels (1010) in the storage area and position the panel (1019) in the right place (in this case, the panel sits on LSCs). If the panels are electric or carry fluids, a connection may need to be made.

Connecting the panel's (1019) cables (1020) can be done by crewmembers or by robotic hands while the panel is lifted like in FIG. 10, or it can be by a robotic hand (1021) carried by in-channel lower carts (1012)

If accessories, dressing elements or other components or finishing jobs need to be added, it can be done at any step of the process. For example, if "FMU canopies" are being built, several additional steps are required to install the accessories, the columns and other components.

The FMU can be tested while it is still on the bench. For example its electrical performance, its waterproofing, its aspect can be assessed.

The completed FMU can now roll out of the bench or be lifted out of the off structure FMU construction bench, possibly after installing protection systems, transportation frames, hooks or other elements. In some cases, small FMUs are to be shipped to remote locations, in some cases, especially for the large units, FMUs can be used on site, for example be craned out of the bench and directly installed on site.

Off-structure construction may include customization as described above. The FMU may be designed to use a certain number of determined components as well as a large number of additional components or some of these components can be adjusted or modified using a certain range of variation or can be replaced by a number of alternative options. Accessories or additional components or features can be added. The FMU's variations may be framed by the off-structure construction possibilities, such as size, materials, technical compatibility, requirements, as well as by the shipping restrictions or other parameters.

The off-structure construction tools may be driven by Computer Numerical Control (CNC) systems and may in some cases use data provided by the 3d modeling software or be integrated in a fully computerized supply chain management system. Off-structure construction may be manned or automated: installing the components in the right place, attaching them, wiring, testing and verifying may be automated tasks. A software system may also control the components stock or the fabrication tools or the control systems or the transportation systems. The CNC system may be connected with the computer design system. In some cases, all the construction process, as well as the test results may be recorded and the data stored in a database in order to provide long term tracking of the FMU and its components. Mounting data or instructions can be implemented in the product or supplied with it.

The described off structure FMU construction benches can be used for FMU or for any other purpose.

Figure 11:
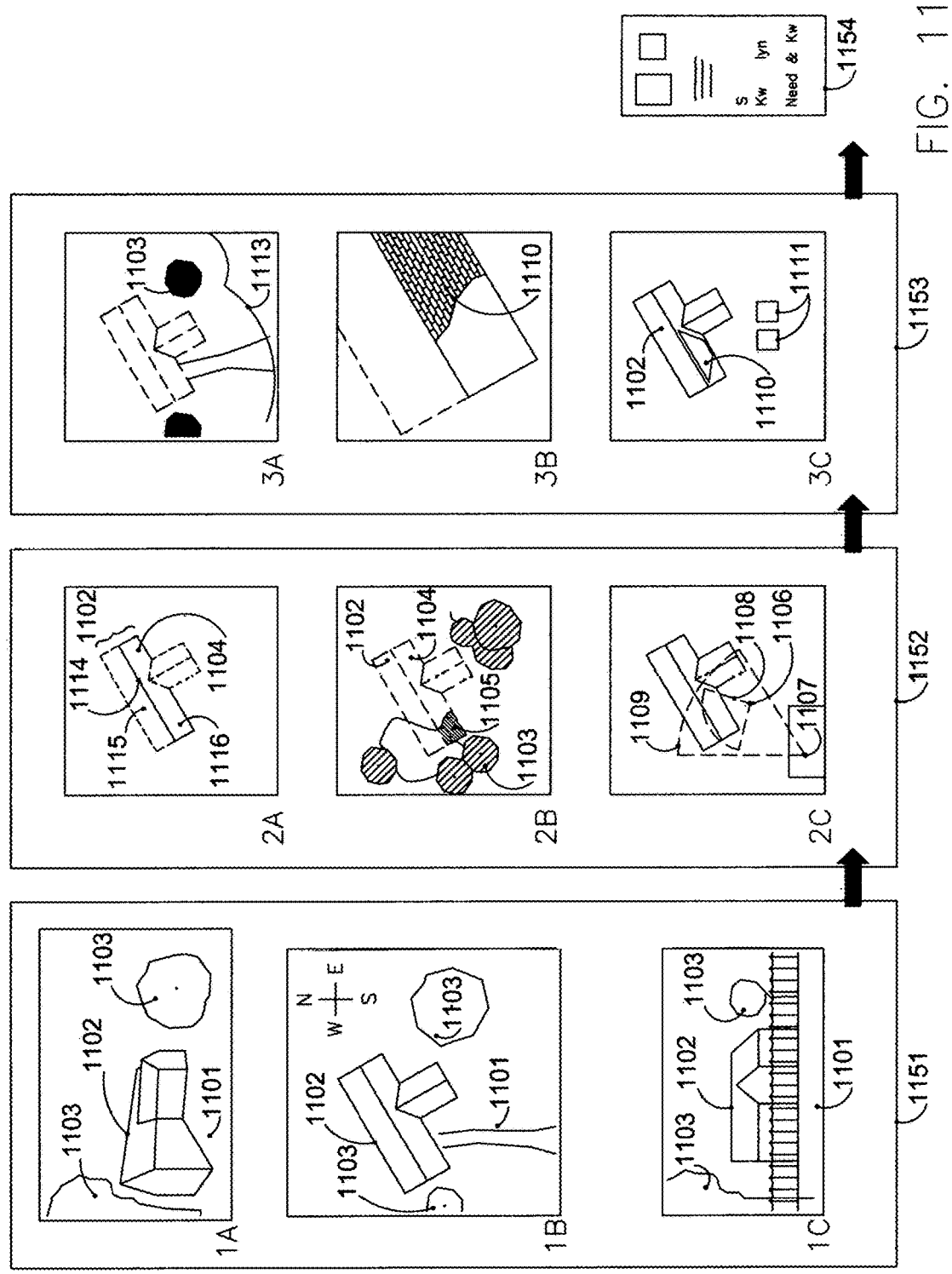
FIG. 11 illustrates an example of flow chart for site information analysis, according to certain embodiments of the invention.

FIG. 11 is a flow chart that illustrates an example of flow chart for an automated or facilitated "site information analysis" process that can be used for site assessment jobs including for the evaluation of sites' solar potential. The example of process is summarized in 4 steps (1151, 1152, 1153, 1154), each step is illustrated by examples of screenshots of a computer system. FIG. 11 also refers to elements described in FIGS. 1 to 10 or other figures. FIG. 11, 12, 13, 14 describe steps of processes and technologies which can be combined if needed. All of them may refer to elements described in other figures.

FMUs change completely the way projects are conceived and executed. Since FMUs are designed like modules that can have almost any shape, size or function, a response can be tailored for any case. Since FMUs are constructed off structure, they can be marketed as a line of products clients can choose from or can customize to their needs. Since FMUs sometimes use precise site data, it is possible to assess quickly what project fits in what site and for what result. Since FMUs are sometimes built off structure by automated processes out of a library of components, they can be automatically designed and constructed by crew or machines. Since they can be installed automatically, since the client scan be selected automatically, FMUs in some cases allow for a completely computer driven automated process including client, project or site assessment, sale, design, construction, installation and maintenance.

FIGS. 11, 12, 13, 14 describe these innovations. Design and evaluation processes are illustrated using examples of screenshots, graphic designs, user interfaces, types of displayed information and other considerations that can have many embodiments. Examples of embodiments are described but adapting the processes to specific needs may lead to create different embodiments.

FIG. 11 focuses on quick project assessment. Performing a "site information analysis" allows assessing how suitable the site is to installing FMUs. A checklist of points to be assessed is built. In the case of solar, it includes for example shading, roof orientation, roof slopes and size, roof material and condition, trees, chimneys, ease of access, power lines, free ground space, slope and shading, etc., or any relevant criteria. This analysis can be performed using available or custom-made data such as photographic information (for example Google Earth, Google Street View, or other information providers) or 3d information or other information, or manned site visits, etc.

In some cases, the "site information analysis" process is automated: a computer program or an operator performs shape recognition, 3d information or intelligent data mining or other relevant jobs in order to analyze a site or a project opportunity and to find out how suited it is for a project, or it can answer a list of questions or rate opportunities using specific criteria. The system can be fed data such as aerial views or other information such as 3d information or other measurements. For example, a computer system using image processing programs analyzes an aerial view or a 3d database and determines where the buildings are, what their shape is, what their roofs are, with their slopes, orientations, shadings, materials, etc. or assesses the ease of access, the obstacles, wires, trees, etc. and assesses how good it is for solar product installation. Such a process can be performed case by case on demand, or it can be run systematically on large areas: for example a computer using Google earth information, or any other source of information such as data bases or customer provided information such as pictures or descriptions, could analyze systematically hundreds of lots of a neighborhood and provide relevant information, sorting, ranking, etc. A set of buildings or locations is measured in the same time. For example a street, a part of a street or of a neighborhood can be analyzed, for example using a drone system, manual or automated, or vehicles manned or unmanned. The computer system is then able to identify each structure or property and to package a set of information about it. It may cross-reference the measured data with other available data such as satellite views, aerial imaging, street level views or others, data about energy consumption, about energy costs, about policies, incentives, about trends or public statements or opinion, shading or other information, other types of pictures or measurements, personal data, etc., data from external sources such as social media, information database, public or private databases, etc., in order to help determine which cases are the most interesting to be worked on. A marketing approach can then be devised. Any other kind of use can be made with this data, such as maps, reports, information databases, etc. the data can be shared or be kept private. This analysis may be run in advance in order to make the information available when needed or be run upon demand. The result can be utilized to direct the customer acquisition efforts or be fed to the online evaluation system that is described below.

FIG. 11 illustrates 4 steps. In step 1 (1151), a site to be studied is identified; in step 2 (1152), the main characteristics are revealed; in step 3 (1153) a project is drafted; in step 4 (1154) the proposed project is assessed.

Not all these steps have to be taken at each time, and this is only an example of embodiment of a process that can be used in many other ways or purposes. In some cases, some of the steps can be taken with human supervision; in some cases, the process can be entirely automated. The steps and screenshots presented are only examples aiming at illustrating what kind of approach is proposed, but other embodiments are possible.

In step 1 (1151), a potential project's site, a house (1102) in this example, is showed and characterized. In some cases, the computer system is able to analyze images or other data and to identify a property, describe its limits, its buildings, its address, or to cross this information with data from other sources of information. The same process can be run using 3d models if available or other data.

Computer screenshot 1A illustrates an example of street level picture or perspective view of the site. The computer system finds, identifies and shows a house (1102), a yard (1101), 2 trees (1103).

Computer screenshot 1B illustrates an example of top view of the same site, taken for example from Google Earth or other databases. The computer system identifies and shows a house (1102), a yard (1101), 2 trees (1103) with another point of view.

Computer screenshot 1C illustrates an example of another street level image taken for example from Google Street View or any other source. Information can also be provided by clients, crewmembers or other players. It shows a house (1102), a yard (1101), 2 trees (1103). The computer system has identified its target and starts assessing the project's value.

In step 2 (1152), the main characteristics of the site relative to the project's goal are identified and quantified by the computer, which has analyzed the images and other data available.

Computer screenshot 2A illustrates how the system identifies key elements that make sense for the analysis it is running (for each target applications, specific key elements or identification priorities should be selected). In this example with a solar project target, the system has identified the building (1102) on the top view. In this example, it has identified the roofs ridge (1114) and slopes (1115, 1116) and selected the sun-facing root (1104) and it has measured it.

Computer screenshot 2B illustrates the trees (1103) the system has identified and identified. The system has calculated the shading (1105) they cause on the south facing roof (1104) of the house (1102).

Computer screenshot 2C illustrates how the system has analyzed the site, the trees, the accesses and obstacles, has studied various types of lifting systems such as cranes or trucks or other lifting systems available, calculated their range (1108, 1109), and it has proposed two locations (1106, 1107) that enable a crane access to the target roof. The system may then propose a type of equipment to be used depending on a choice of information such as the location, the height and weight, the nature of the ground, the cost, the availability or other factors.

Other steps or different steps could be taken if they are needed by a specific type of project.

In step 3 (1153), the conclusions of step 2 are used to draft and assess project proposals.

Computer screenshot 3A illustrates how the system has identified the obstacles to the considered process, such as trees (1103), power lines (1113), fences, or other obstacles to the use of cranes, drones or other tools.

Computer screenshot 3B illustrates how the system has determined the usable area (1110) of the roof, which in this example is the area that is south facing, not shaded by the trees, accessible to the crane, and it has tried to determine the roof's materials or structure or other technical information.

Computer screenshot 3C shows the usable area (1110) of the building's (1102) roof the system has determined and what models of FMU (1111) can be used, and or other characteristics. In the case of a solar project, knowing the location, the azimuth, the pitch, the shading and the environment, the computer system can estimate the output, the investment and the profitability.

In step 4 (1154) the system compares the results of the "site information analysis" performed in steps 1, 2, 3 with the results of a "statistics analysis", if available. If it is not available, this analysis can be performed manually. Since Step 3 has identified or designed one or several design options, the system estimates the cost and compares what can be done technically and for what cost (result of "site information analysis") with what should be done (result of "statistics analysis"): for example, how much power is needed for this home, can the owner afford it, what the building or fire code requires, what the owner thinks about solar, etc. In some cases, an estimate of the investment cost and profitability is made. In some cases, the system is able to propose ways to reach out to the target client, to help define a personalized sales pitch, search for optimal channels to reach out to him, for referents he could trust, friends that could talk to him, etc, or to find ways to help him feel like discovering about the products and processes. In some cases the system is able to reach out to the potential customer automatically.

In this example, this is the end of the "site information analysis". The result is an assessment of the solar potential of this house: what FMUs or product can be used and how much power can be installed is known, as well as the ease of the process, the efficiency, energy output, profitability, and many other things. Any other assessment relevant to the goals or the target application can be determined by a similar kind of process. This project assessment, when done by crewmembers visiting sites traditionally takes hours and it can be done in a few minutes using these technologies and processes. If the project was to be ordered, the fabrication and installation processes described in other figures would start at this point.

This example can be used on a case-by-case basis. The same type of process can also be used to scan an entire region in order to provide a selection of targets to be approached and hopefully some information about how to approach them. This will greatly improve the efficiency of marketing efforts. It can also be used to review methodically potential opportunities (sites, people, businesses, etc.) revealed by database analysis or "statistics analysis": the cases can be assessed automatically or semi automatically. For example for installing a solar system, if electrical or revenue data is available for a list of cases, for example using automated data exchange with the utility, these cases can be systematically assessed before any action is taken.

In some cases, one or more of the following processes is performed automatically or by users:
  Automated scanning of an entire neighborhood's data ("statistics" analysis)
  Automated selection of the best sites as determined by "statistics" analysis
  Automated roofs detection, sizing, and assessment (slopes, shading, access, etc.)
  Automated design of the project, including product or FMU selection, based on available information such as energy consumption and financial possibilities
  Automated reach out to potential customer
  Automated online sale process, including paperwork, contract and payment
  Automated permitting
  Automated sourcing and prefabrication of the product
  Automated shipment
  Automated installation
  Automated maintenance and monitoring Another way to use this system is the other way around: starting with a case: a site or a potential client has been identified by various techniques, or a person wants to know what can be done: a personalized profile is built, and some or all of the above processes are run to provide the needed answers. In other cases, a general study is performed on a region or a country or a category of cases, etc. This system also enables online interaction, as we shall see below.

Figure 12:
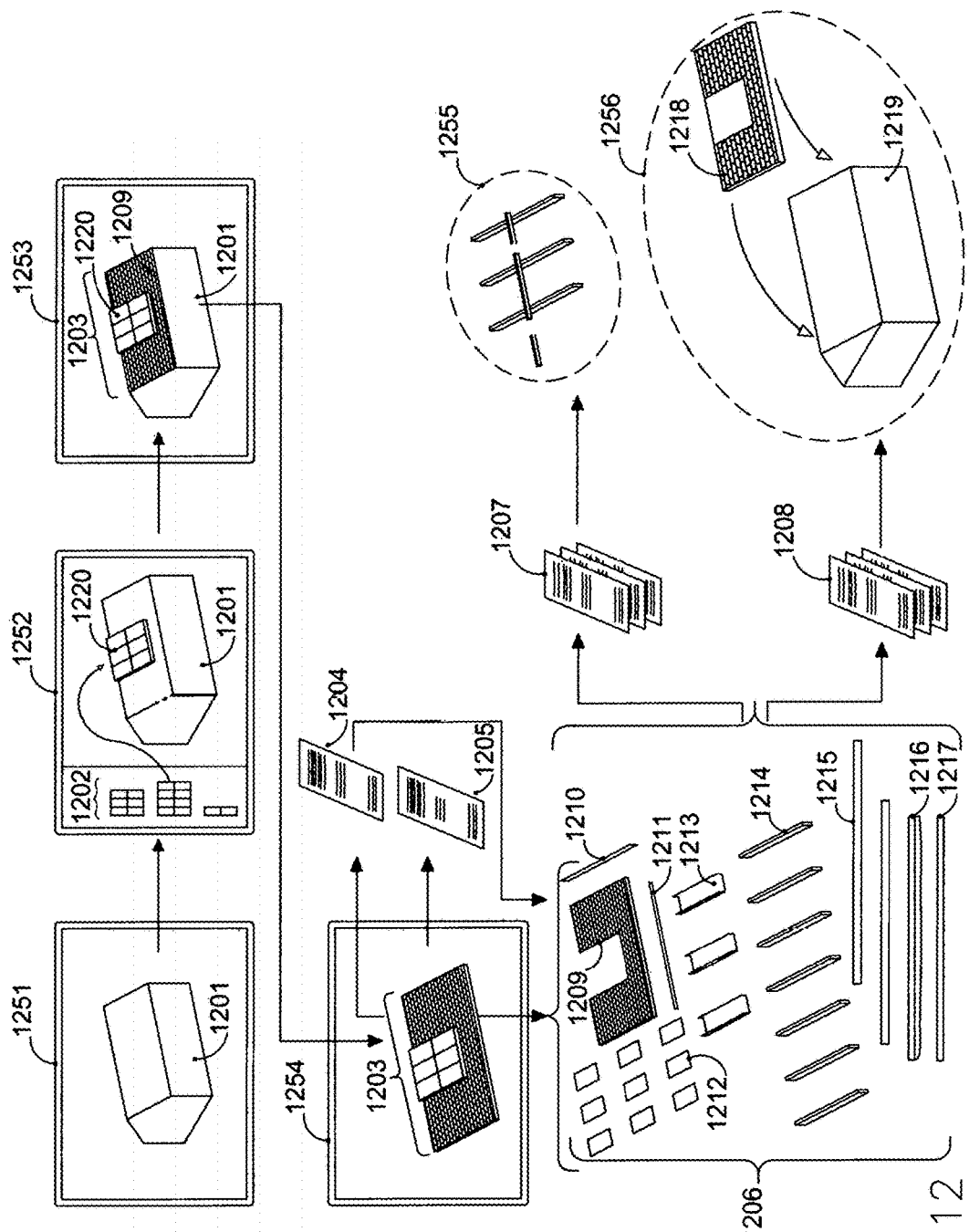
FIG. 12 illustrates an example of flow chart for automated FMU design, construction and installation process, according to certain embodiments of the invention.

FIG. 12 is a diagram that illustrates an example of steps for a simplified or automated FMU design, construction and installation process. The example of process is summarized in 6 steps (1251, 1252, 1253, 1254, 1255, 1256). FIG. 12 also refers to elements described in FIGS. 1 to 11 or other figures.

In specific cases, this process occurs after an assessment process such the ones described in FIG. 11. The starting point of this process can be a human input or it can he the result of processes described in other figures.

Not all these steps have to be taken at each time, and this only illustrates an example of embodiment of a process that can be used in many other ways or for other purposes. In some cases, some of the steps can be taken with human supervision; in some cases, the process can be entirely automated. The computer programs can in some cases be run locally or online. Running it remotely or online enables in some cases online design and online sales.

The steps presented are only examples aiming at illustrating what kind of approach is proposed, but other embodiments are possible. The process is illustrated with an example of project on an existing buildings but many other cases of application are possible.

Steps 1 (1251), 2 (1252), and 3 (1253), illustrated by examples of screenshots can be computer driven or run manually.

In Step 1 (1251), the computer displays a 3d model (1201) of a host structure. This 3d model has been built previously, possibly using one of the methods described in other figures, or using other methods. The project may have been selected using one of the methods described in other figures, or it may have been proposed by users. In some cases, this host structure has been selected using a "statistics+site information analysis" as described in other figures.

In step 2 (1252), an example of screenshot shows both the 3d model (1201) and a library of available 3d models (1202) of FMUs, which a user or an automated computer system can drag over the 3d model: the selected virtual FMU (1220) is installed virtually on the 3d model (1201) of the host structure in order to assess the feasibility and to virtually preview the FMUs onsite, to choose what product fits better if there is a choice of FMUs, or to design special products or systems.

In step 3 (1253), an example of screenshot shows how the 3d model of a chosen FMUs (1220) is installed on the 3d model of a host structure (1201). The 3d model can then be customized on the computer to become a new customized FMU (1203). In this example, the new FMU (1203) is customized with "Dressing elements" (1209) so that the customized FMU matches the size and color of the roof.

In step 4 (1254), the 3d model (1203) of the FMU selected, designed or customized on the computer in step 3, is translated into a quote (1204), a technical description (1205), a list of parts (1206), instructions or data for fabrication (1207) and instructions or data for installation (1208) and maintenance, which can be used in manual or automated processes. Questions, options or validations can be needed at each step.

In some cases, the 3d model describes the exact configuration: for example, model, type, number, size, description, specifications of the top dressing elements (1209), lateral dressing elements (1210), end dressing elements (1211), panels (1212), WB (1213), LSCs (1214), TBs (1215), flashing systems (1216), adjustment systems (1217) or other components.

In some embodiments, the computer system generates instructions for procuring the components and for the whole prefabrication process: how the components are selected, prepared, cut, attached, processed, tested, etc. Using this method enables a complete computer driven fabrication system that allows for a wide range of customization. If the customized product has been designed and prefabricated to fit precisely the host structure, the product may be designed and built to fit in the exact configuration of the host structure, for example it can be made at a specific length, width or shape to match exactly the planarity defects of a roof, or other specific requirements, based on the information collected on site, either manually or using one of the improved methods described herein. In this case, the product is supplied with a set of data and mounting instruction (1208), part of the "Data component", such as methods and tools, key geometric points, localization instructions, wiring, access, etc.

In step 5 (1255), the components are procured, manufactured, prepared, possibly tested, shipped. Components are assembled, possibly on an off structure FMU construction bench as described in other figures. This off-structure construction phase can be manual or automated and can be in some cases entirely automatic.

In step 6 (1256), the completed FMU (1218) is installed on the host structure (1219). In some cases the installation process is manual or partly automated and in some embodiments it is entirely automated.

As a result, all the steps from the inception of the design to the completed installation can be almost 100% automated with very few human interventions such as validations, choices, and a few jobs to be performed on site by crewmembers.

Figure 13:
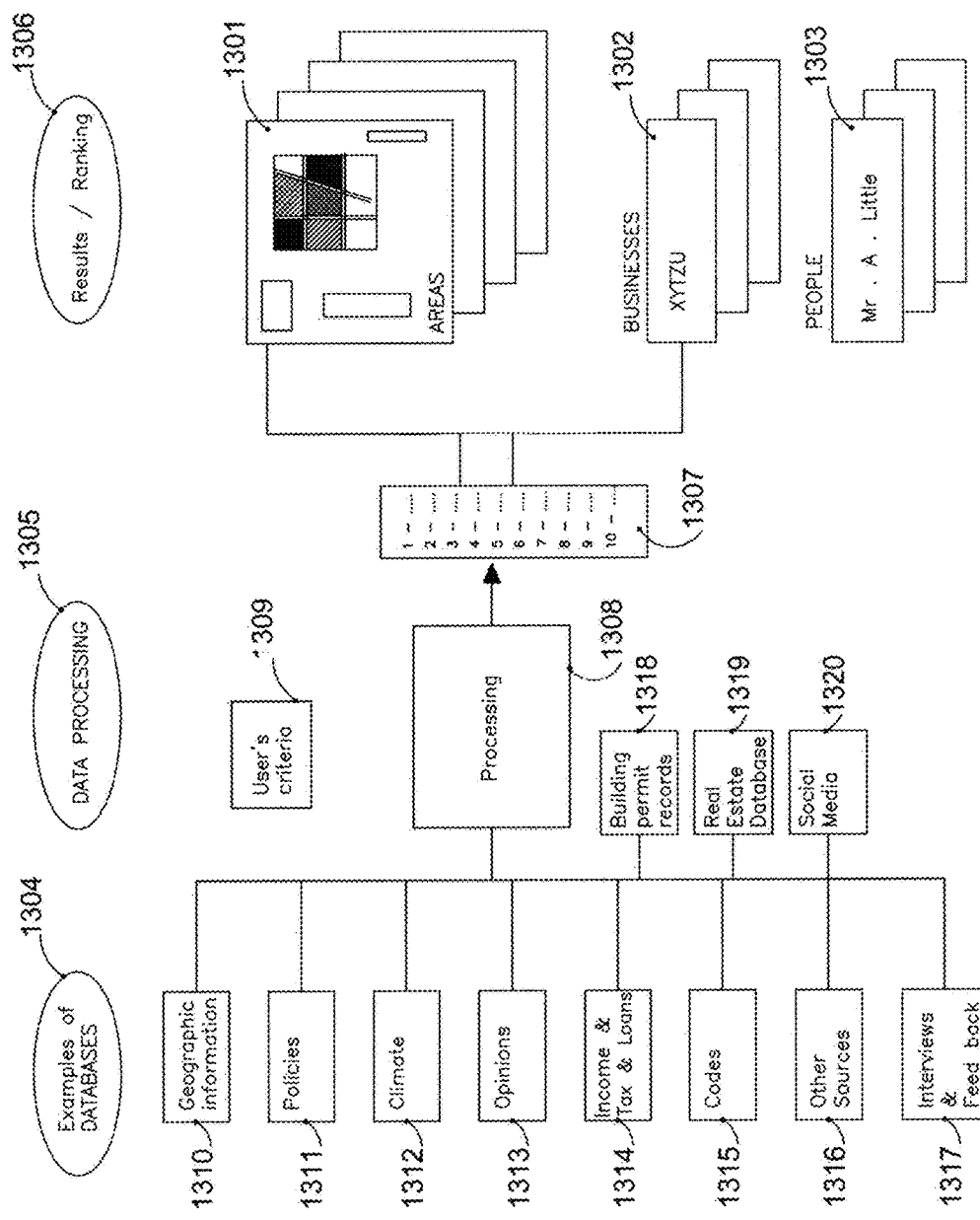
FIG. 13 illustrates an example of flow chart for statistics analysis, according to certain embodiments of the invention.

FIG. 13 is a flow chart that illustrates an example of embodiment of a "statistics analysis" method, which allows for quickly selecting project opportunities. FIG. 13 refers to elements described in FIG. 11, 12, 14, 15 or other figures.

A lot of information about sites is publicly available, for example using Google Earth, Google street view, satellite imagery, 3d measurement information, other geographic databases, etc. This information can be completed with local pictures or measurements or by ad-hoc built databases or information provided by users. An analysis of the site's potential can be run using this information, as described below. This analysis is also referred to as "site information analysis".

Evaluating quickly a site's or a customer's potential has downward and upward advantages: downward, herein called "statistics analysis", it enables teams to efficiently select their targets and to point their efforts in the best direction: they can use data analysis to determine the best targets for their product. Upwards, herein called "site information analysis", it enables to provide relevant information to a potential customer or a crewmember wanting to evaluate the potential of a specific case. For example one may want to check if a home or a location or a person is a good fit for a solar product or any other offer. It is possible to estimate the potential of a site much quicker than before. The processes described in this chapter can be used either to provide a quick service to the public or to enable professional teams to be more efficient in their marketing or design processes.

"Statistics analysis" and "site information analysis" are described below. They can be performed in any order or in the same time.

"Database Information" (1304)

Other types of information may be used: information about the location and the economic landscape, information about clients, information about the site, or other types of information . . . . Data is available in various databases (1304), or it can be built on purpose. Social media and many publically available sources of data can also be used. This data can be collected, cross-referenced and analyzed to determine the best potential cases. This analysis will be referred to as "statistics analysis".

For example if information is collected on subjects such as:
Geographic general information (1310) such as climate (1312), energy costs, rates, policies (1311) and solar resource, financial data, shadows, access, labor cost, distance, local buildings codes (1315), local fire codes, etc;

Personal information such as energy consumption and bills, information about the site's occupant such as income (1314), taxation level, electric car ownership, consumer's profile, political or religious opinions (1313), friends network and profile, memberships, etc., Information about the site such as: who owns the site, the land or the building, who manages it, what is known about them, information about the land's or the building's status, about permitting and scheduled works, about the building's condition, about the rent, the renter, the renters financial situation, opinions, etc.

Or other information (1316)

This information can be processed in order to sort the best potential areas, clients, sites or scenarios, to build typologies and prioritize marketing efforts by building opportunity analysis tables and maps. In some cases, it is also able to give indications about how to interact (1317) with this potential client. This mapping, sorting or ranking can be as precise as the data is, hopefully as specific as lot per lot, person per person or business per business. This analysis is referred to as "statistics analysis".

"Statistics Analysis"

A "statistics analysis" can be performed in order to create maps or tables showing very precisely where and who are the best potential targets. This analysis can be performed independently or on demand for a specific request.

As an example, such a system can determine the areas where exist in the same time renewable energy policies, solar resource, high power rates, wealthy and green-minded inhabitants and favorable building codes. The system can determine areas (counties, cities, blocks, streets, buildings, etc.) on maps or tables, in some cases building per building, lot per lot or person per person, and in some cases go as far as pre selecting sites, people or businesses as potential targets to be looked into. The system can build profiles of customers, sites or businesses and information about the way and channels to approach them. The system, provided it has access the right data, can for example determine the clients whose energy consumption profile, or political opinion, financial status, education, interests, profession, friends network or any other criteria which make their more likely to be interested in the solutions proposed. For example, if the electricity consumption records of the clients in an area can be accessed, the analysis can easily determine the best targets, and cross reference this information with other criteria to sort and rank the best potential opportunities. In another example, this analysis can be performed in response to a request about a site that is being assessed or that has been selected for any reason.

FIG. 13 shows an example of process for solar project applications. This example of process is in 3 steps: databases (1304), data processing (1305), results and ranking (1306). Examples of databases (1304) are illustrated: in this example: geographic information (1310), policies (1311), climate (1312), opinions (1313), incomes (1314), taxes and loans, codes (1315), building permit records (1318), real estate data bases (1319), social media (1320), interviews and feed back (1317), other sources. Other databases can be used for specific jobs. Examples of data processing either manually or using computers, possibly according to criteria input by the user of the system, are illustrated in FIG. 13.

Examples of results and ranking (1306) presentation are illustrated. The system makes sense of this data, sorts the information and ranks the opportunities according to criteria. The information is then translated either graphically or in charts. The information, once it has been processed (1308)

can be displayed in any possible way or sorted (1307) according to any criteria. In the example illustrated, the results are presented as:

Maps of regions or of neighborhoods (1301), which sort the areas per level of each criterion (1309) or propose representations of mixed information, Tables and charts (1302), in this example, they show information about businesses, Information about people (1303). In other cases, other sources of information can be used and they can be processed differently or for other purposes.

Other sorting or categories can be used and many embodiments are possible. But this information does not always indicate if a site or a building, even located in a pre-selected area, is optimal for solar energy (or for other purposes or target applications): is it shaded, accessible, cluttered by power lines, is there free space, available well oriented roofs, or does it meet other requirements? A site or a customer may have the ideal set of climate, politics and income and be unsuitable for solar for example be shaded or have bad roofs (or have other problems for the target applications). In the case of solar, it is easy to use aerial photography to verify these points.

In some cases, the "statistics analysis" results and the "Site information analysis" results described in other figures need to be crossed in order to select the best opportunities. These analysis are performed manually or automatically.

Crossing "statistics analysis" and "site information analysis" allows to quickly select targets and evaluate their potential. In some cases, more detailed reporting such as site visits, automated measurements (for example drones as described above or other methods) can be required. The information may need to be regularly updated and the automatic process to be run again from time to time.

Figure 14:
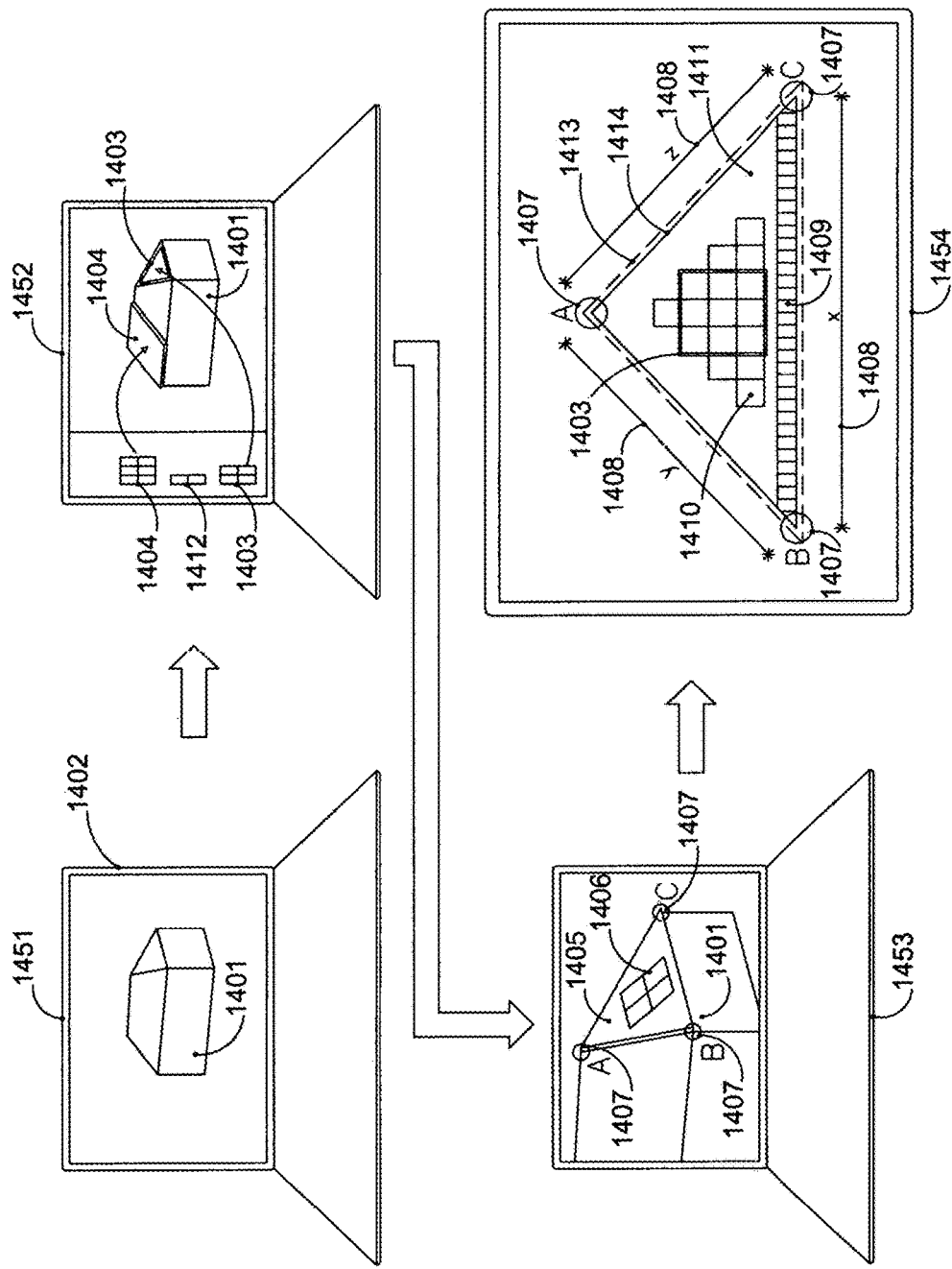
FIG. 14 illustrates an example of flow chart for automated design process, according to certain embodiments of the invention.

FIG. 14 is a flow chart that illustrates an example of steps for an automated or facilitated design process. The example of process is summarized in 4 steps (1451, 1452, 1453, 1454), each step is illustrated by an example of screenshot of a computer system's screen. FIG. 14 also refers to elements described in other figures.

In step 1 (1451), a 3d model (1401) of a structure is displayed on the computer screen (1402). It may have been created earlier.

In step 2 (1452), various examples of 3d models (1403, 1404, 1412), taken from a library of FMU 3d models, or other objects, are virtually placed and are tested on the 3d model (1401) of the building. This allows for picking, out of a library of products or FMUs, the product or FMU that works best for a specific project, or for defining a new product or FMU, or a customized product or FMU for a specific case, and for testing the results of its implementation on site.

In step 3 (1453), in this example, a triangular part, or any other portion, of the roof (1405) of the building (1401) or structure has been selected as well as a model of FMU (1406). Key geometric points (1407), such as A, B, C in this example, are selected and characterized on the 3d model (1401) in order to provide data for positioning properly the FMU (1406) on the actual roof (1405) when installed automatically or manually. In this example, it is however decided to design a customized FMU with a triangular shape that matches the shape of the roof.

In step 4 (1454), using the key geometric points A, B, C (1407), a customized FMU (1414) is designed to match the exact dimensions such as x, y, z (1408) of the roof (1413). In this example, the new to-be-created customized FMU (1414) is based on a standard FMU (1403) that is extended with more panels (1410) and 2 types of "Top dressing elements" (1409, 1411) and possibly other dressing elements or accessories. A 3d model of the customized FMU is made and can be virtually tested on the 3d model of the host structure (1401), possibly modified as much as needed, and the data sent for fabrication. Several scenarios can be tested and many other designs can be made.

The overall process can be run by crewmembers or users or automatically by computer systems. Once the project is approved, the 3d model is constructed as described in other figures.

Figure 15:
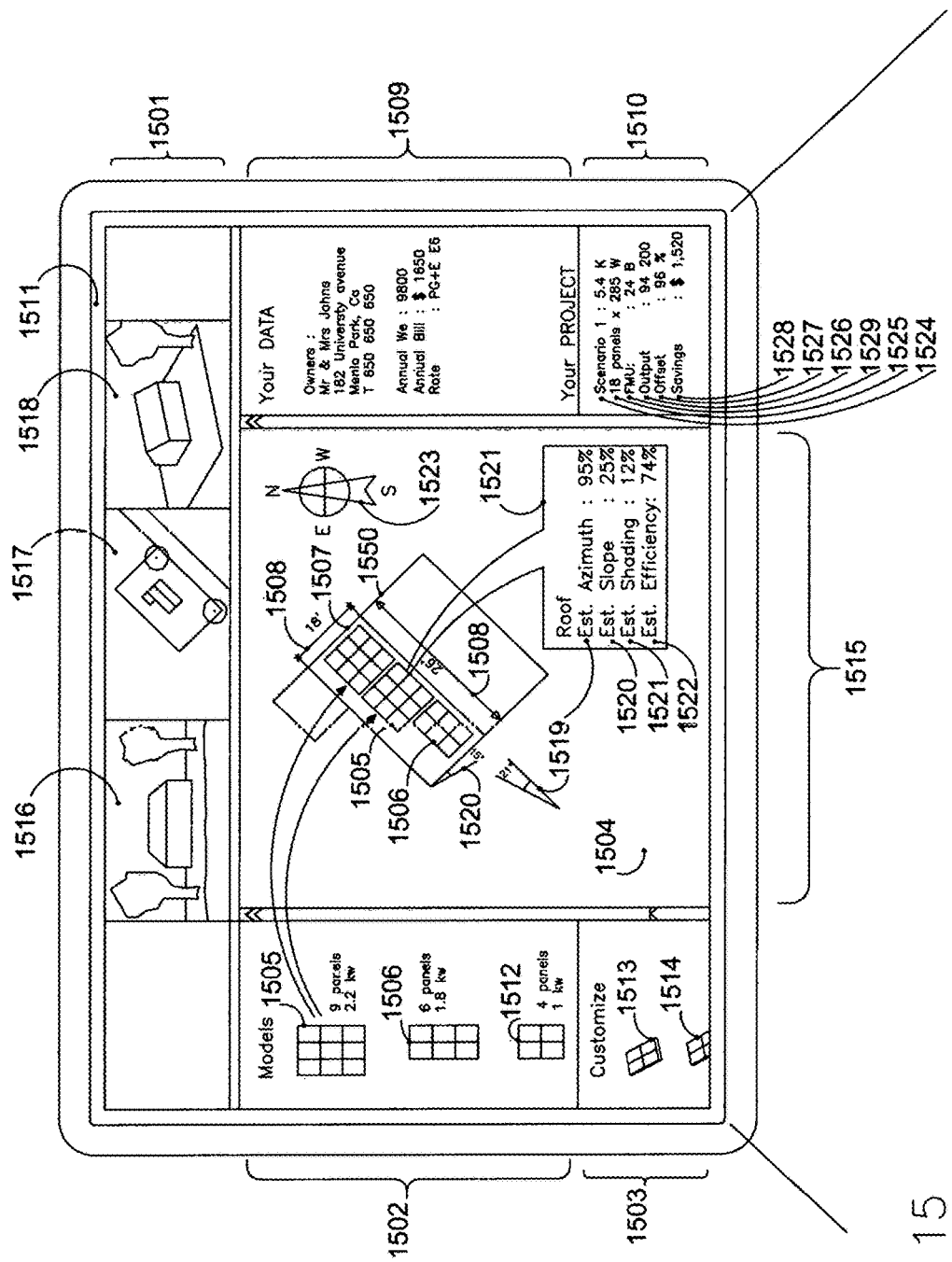
FIG. 15 illustrates an example of implementation or design process, according to certain embodiments of the invention.

FIG. 15 illustrates an example of a computer screen (1511) that displays an example of FMU implementation design process. FIG. 15 also refers to elements described in other figures.

The screenshot illustrates an example of site assessment and design program that can be proposed on a website or in the computer program users could use. Clicking on any element may display more details about it. The drawings aim at showing examples of functions, logics and processes but other designs and layout can be implemented and functionalities can be added.

On a part of the screen (1511) are showed views (1501) or information about the site, such as eye level view (1516), aerial view (1517), perspective view or 3d model (1518), either provided automatically by the system (for example extracted from databases or from public sources like "Google Street View", "Google earth", satellite photographic databases or other sources), or uploaded by the teams or the visitor, or resulting from some calculation. On a part of the screen (in this example, on the left) is illustrated a library (1502) of FMU models (1505, 1506, 1512) to choose from. Scrolling down, a "customize" window (1503) may show more styles, customization possibilities or specific products (1513, 1514) or more information. More information on each product can be obtained by clicking on it or hovering over it, or in any other way.

On another part of the screen, in this example the center window (1515), is displayed a top view (1504) of a host structure (1550) (this is a 2D example, but it could also use 3d models if available) onto which FMUs (1505, 1506) are being dragged from the library (1502) so the roof (1507) is being virtually equipped with FMUs (1505, 1506) that are displayed with the slope and angle taken into account. If 3D models can be used, many other views can be provided, alternatively or simultaneously. This part of the screen may show various information the system can provide or calculate and may in some cases be customizable too by the user: in this example, is displayed information (1521) such as the dimensions of the roof (1508), the azimuth (1519) and slope (1520), and the resulting efficiency (1522), the estimated shading (1521), as well as a compass (1523), or other information.

Another part of the screen shows data. In this example, a "Your Data" (1509) section shows information such as the visitor's personal data (but it can be an alias) such as address, energy usage and cost, but other data can be displayed. This information may have been collected previously or automatically (as described in other figures) or it may be entered by the user. A "Your Project" section (1510) shows the main facts about the simulation currently being conducted or about a previous project. Several projects can be tested and saved. Other information or views can be displayed with a different screen design. In this example, the data include several saved scenarios; scenario 1 (1524) is illustrated, displaying info about the panels (1525), the selected FMUs (1529), the resulting efficiency, the estimated yearly output (1526), the percentage of offset consumption (1527), the expected annual savings (1528), etc. Other sets of information can be displayed and be customized. Other part of the screen can show other views of the site, or display other information. Somewhere on one of the screens a button could propose to contact the company for more information or to take action such as launching the sale process, the permitting process, the fabrication, or any other process.

If the visitor does not decide to become a client at this time, he can be kept updated and become a member of a virtual community. Once the visitor has become a client, he has the opportunity to become a member of the community and can perhaps monitor his system's performance on line, track the data, compare to others, compete, optimize, decide to upgrade his system, make it bigger, or to refer friends or neighbors, etc. If the system is used by crewmembers, they can store projects or variations for execution, presentation or further review, or they can launch downstream processes.

This design process allows for very quickly evaluating or designing proposals or for designing personalized solutions and, in some embodiments, it can also be used either by crewmembers or registered users, by designers such as architects, developers, engineers, etc., or it can be offered online to a larger audience. A feature of the system allows designers to enter in the system a 3d design of a project (for example a future building or a ground mounted solar farm project), instead of a model of an existing potential host structure, and to have it assessed with the proposed solutions and products. Some design advice or guidance can be automatically provided by the system or the case can be referred to human teams for advice.

NB: The same processes can also be used in an offline version, for use by the teams only.

Using the 3D Model

Once the measurement is done and a 3d model (1518) of the host structure is built, the design process can begin. 3D models of the FMUs can be virtually installed on the host structure and the project discussed with the client, several versions can be tested, customization can be considered and the project pre-viewed. In some cases, 3D renderings can be produced as well possibly as estimates.

If working with solar FMUs as described above, a computer system can easily help quickly test various scenarios of implementation of the FMU configuration on a building, site or structure. As described above, the computer system uses a recognizable view of the host structure, for example an aerial vertical view, finds its scale, size and orientation and virtually implements the product: an image or a 3d model of the product is used, put at scale, slope and angle and positioned at the right location.

Driven by Operator

This way, an operator can test in real time, in a few seconds, the various possibilities of a site with various combinations of products. In the case of a FMU, the computer system may, in some cases, have access to information as described above and know about the site's energy data (ex: consumption, rates, solar resource, etc.) and determine the best set of products to reach a production target or to match the site consumption. This operation can be manually performed by an operator or it can be automated: the system needs to be fed with a 3d model of the host structure, or other information, and It can then test any combination of products using a set of design rules; design rules are implemented in advance in the software. One or several versions or proposals can be drafted even if the potential client is not involved. If a marketing initiative is to be taken, it may now be done only on selected opportunities. The more information is available, the more relevant the process. The system allows for assessing individual projects or to batch process series of potential host sites either manually or automatically.

Driven by the Public

This wealth of information can also be used reverse way: instead of being run by crewmembers, the computer system can be made available to the public via the internet. This process is very efficient because members of the public may spend their own time assessing their own project and finally decide to become a client without even needing to be reached by marketing crews. They select themselves, assess their own project and decide or not to make contact with the marketing teams. This saves long hours of useless marketing efforts directed to uninterested targets.

This allows for online sale of solar products or projects or of any construction related project, and for widely accessible personalization. It also allows for online design of any project. It works as follows. The process is online. An example of process is described below.

- A visitor connects to a website and either navigates in views or representations (1501) such as Google Earth or other geographic information systems or types in an address.
- The visitor may be proposed to provide information (1509) or personal data such as energy consumption reports, financial statements or tax status, etc. As described above when describing "statistics" and "site information analysis", the system may also, in some cases, have access to information about the site, the client or the opportunity. The system will perform its job using the information it has, if possible.
- The computer system will try to provide a preview (1515) of a solar system installed on a host structure. Products or FMUs may be used as the system or as part of the system. 2D pictures with geographic information such as Google Earth's may be used. In some cases 3d information such a 3d models of buildings may be available and be used directly. The system may have a lot of pre-recorded information about the location (see chapter about information). The system may be able to perform a "site information analysis" and detect automatically for example the roof's location, size, orientation (1523) and slope (1520), shading and accesses, or the system may ask the visitor to help with the information it needs such as roof identification, size, slope, shading, materials, structural information, ease of access, etc.
- The visitor can review the line of products or FMUs (1502) and test implementing on an image of the site (often it will be on a roof, pictured by Google Earth) an image of the FMU adapted in size, scale, scale, color, etc, or implementing a 3D model of the FMU on a 3D model of the host structure, depending on the available technology and information as shown in FIG. 14. The system may automatically adapt the image of the FMU to the scale of the view and to the estimated slope of the roof (may be estimated by the website's visitor or may be calculated automatically or may be available using databases) in order to provide an accurate 2D or 3D view of the project: the FMU on the host structure. Depending on the information available, this pre-design process can be performed in 2D or in 3D.

The system may be able to calculate in real time information about the configuration being tested, such as the products or FMUs used (1529), the amount of power thus virtually installed with the scenario (1524), or the system's output (1526), cost or profitability or savings (1528), or the home's or homeowner's corrected energy or financial profile (1527), any other relevant information so the visitor can make informed choices.

Several versions can be easily tested, saved and compared.

The system may provide some feedback or propose advice and improvements in order to manage an efficient interactive process. Some level of customization (such as described above) can be described online too, as well as a number of options.

The visitor may be constantly guided by the system through the whole process.

The visitor may be offered to pick an architectural style out of a line of styles of products or FMUs (1502) or to define his own. He may be able to customize (1503) or define personal settings, personal choices, personal colors, dressings and personalize its products as described above. The FMU's flexibility enables to design solar systems as real architectural assets and to give this power to designers, contractors or investors, but also to the visitor or the client himself.

In some cases, the configuration may go as far as selecting the technical components or the attachment to the building systems for example.

Other fields may be assessed in some cases, such as a building's energy efficiency or improvement strategies, or personal energy/carbon footprint or strategies.

When a project configuration is displayed, an estimation of the power production can be displayed (1526), as well possibly as a financial estimate or a return estimate or payback time estimate. Financial offers can be provided here too, as well as financing options. The more information the visitor provides, the more accurate the model is. Some level of detail of the projects can be saved, updated or printed. The visitor can set target price or profitability or monthly payment, or size or power, etc., for the system to calculate solutions within this range. When the visitor is ready he can choose to contact the marketing teams or to schedule a site visit, in which the above described measurement/ reporting can be performed. This process has been described for a solar system as an example or for anything else.

As described above, once a configuration has been designed, may be using regular products (1502) or customized products (1503), the system may know exactly what these products are, how they are made, what components they include, how they are to be installed and all the specifications. So, if the information needed is complete, the fabrication of the chosen products may be launched as described in FIG. 12 or any other way: the 2D or 3d model of the system may include all the information needed (Data Component described in FIG. 1A and other figures), The visitor may then decide to order the FMUs and become a client. He can then perform most of the paperwork online, may be including payment or financing.

Depending if more information is needed, the client can order online or request a site visit during which other task can be performed such as 3d measurement, design, customization, site preparation or other jobs.

Run Automatically

Mass product marketing can be automated using the technologies described herein: the automated design and assessment described can be utilized automatically on targets selected by "Statistics analysis" as described in other figures or the system can batch process a large neighborhood, a city or multiple opportunities selected by the system or by crewmembers or users. The best opportunities can be selected and entirely assessed and described. In some cases, contact with the potential user can be made automatically, or the lead can be shared with marketing teams, or the fabrication can be automatically launched.

Figure 16:
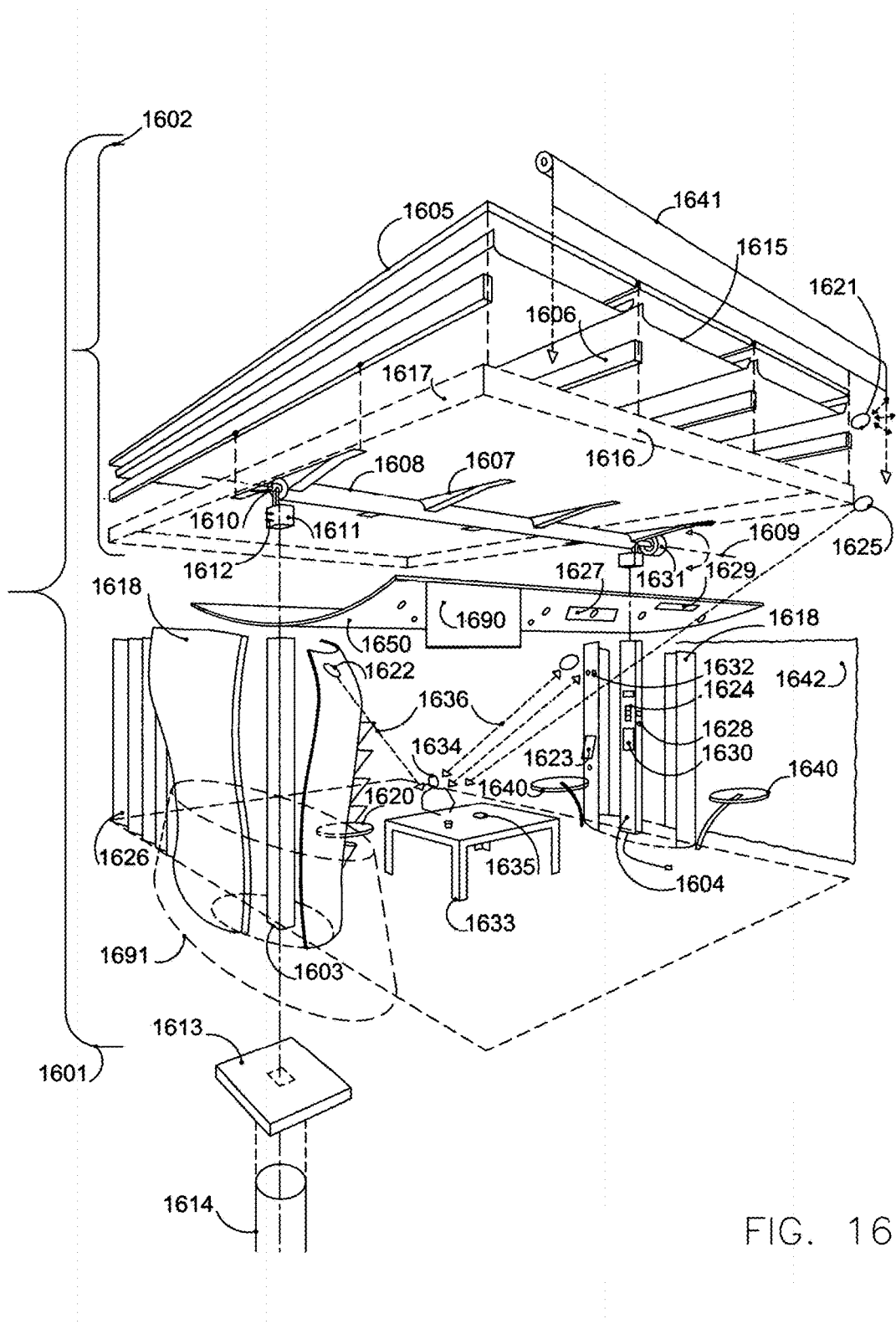
FIG. 16 illustrates a perspective view of a FMU Canopy, according to certain embodiments of the invention.

FIG. 16 is an exploded perspective view that illustrates an example of FMU in a "FMU canopy" embodiment. This description also refers to elements described in FIGS. 1 to 15 or other figures.

"FMU Canopies" are specific embodiments of FMUs. They are self-standing FMUs such as domestic canopies, solar carports, transportable buildings or other structures of any scale wherein the FMU (1601) includes most of the components needed to create the structure and connect it. In some cases, they are Plug & Play devices.

In FIG. 16, an example of "Photovoltaic domestic FMU canopy" embodiment includes an off-structure built PComp (1602), also referred to as "Canopy top" in the case of "FMU canopies", mounted on 2 legs or columns (1603, 1604), thus creating either a self-standing solar array, a sun-tracking solar array, a roof, a domestic canopy, a domestic size carport, a shelter, an outdoor room, a closed room, or other volumes of any size or function or a mix of functions. In other embodiments, FMUs can be customized or configured as buildings, structures, commercial size carports, ground mounted solar plants or other embodiments of any size or function. Several "FMU canopies" can be combined in a larger project. "FMU canopies" can be fixed, mobile or transportable. "Canopy tops" or other "FMU canopy" components can be fixed or mobile and can move or rotate on 1 or 2 axis in order to track the sun or for any other purpose.

In the example of embodiment of FIG. 16, a "Canopy top" (1602) comprises solar panels (1605) or other finishing material, as well as an optional WB (1615), "Dressing elements" such as "Front or end dressing elements" (1616) or "Lateral dressing elements" (1617), a "Lower face" (1650) and could be equipped with a wide range of accessories or features. The "Canopy top" can be waterproof or not, transparent or opaque, have any size, design, function or feature and be made of various materials, or customized. In this example, the panels (1605) and some of the other elements such as WB or "Dressing elements" are supported by LSCs (1606), which are attached to a "Main pipe" (1608) either directly or using supporting brackets (1607). The "Canopy top" can include preinstalled systems for lifting or for supporting loads such as hooks or grooves and sliders in the LSCs, or loads can in some cases be attached to the "Lower face", the "Main pipe" or other members. An embodiment of "Transversal beam", the "Main pipe" (1608) is a beam (in the embodiment of FIG. 16, the "Main pipe" is a tube of circular hollow section, but other designs are possible) or a shaft that spans between the 2 columns (1603, 1604) and provides rigidity to the PComp. The "Main pipe" is fastened to the columns or the supporting structure by "fastening pads" (1611) and "Main fasteners" (1612). The columns can be at the end of the "Main pipe" or the "Main pipe" can overhang beyond the columns. The "Main Pipe" can have any length, diameter, material or function.

"FMU canopies" can be created with 1, 2, 3, 4 or more columns or legs, which can have any design, shape, material, functions, specifications, or in some cases dressing elements. In some embodiments, the "FMU canopy's" legs are substantially aligned with the axis of the canopy. In some embodiments the legs or columns are close to the perimeter of the canopy or have other geometries. In some embodiments, walls or other members are used in lieu of columns and in some cases can be folded for shipping: when 4 walls are used, the "FMU canopy" creates a room; the walls and other components can include any accessories or features such as doors, windows, technical gear, appliances, devices or functions. In the example of FIG. 16, the columns carry optional dressing elements (1618) or shells, which can give them any shape, material of function.

The optional column shells (1618) can be flexible, textile or rigid such as plastic, metal or wood shells of any size, material or aspect, and they can include, host or shelter features such as buttons, keyboards, screens or display devices, sound systems, ventilation systems, lighting systems, technical gear, fixed or mobile curtains or walls, or any other feature. In some embodiments, the shells are sealed, waterproof, locked, secured or have opening parts or active components or may include technical stuff, utilitarian gear or any other feature behind a protective shell. In some embodiments, columns (1603, 1604) can be equipped as plant racks, sound system racks, light system racks, or can be dressed as or turned into inert or living statues, look like humanoid robots or take any other aspect. "FMU canopies" can also be equipped with service elements such as fixed or mobile tables (1640), foldable tables (1620), fluids distribution, robotic arms, lateral curtains (1641), end curtains (1642), fixed, mobile, transformable or active furniture (1691), or other features.

Depending on the project's design and requirements, the columns footing can be of several types: the columns can be anchored in concrete foundations, or they can comprise a foot plate (1613), which connects using bolts or anchor bolts to a concrete or metal foundation (1614) or the columns can stand directly in the foundation hole before the concrete is poured or in some cases, the "FMU canopy" does not need underground foundation and can connect to existing structures. In some embodiments, the "FMU canopy" stands up without foundations, resting either on larger foot plates (1613) or on wheels or on ballasted systems, or resting on other footing systems. Some embodiments of canopy or FMUs are mobile or become mobile to facilitate their fabrication, transportation or installation.

When "FMU canopies" or the PComps are entirely or partially constructed off-structure, the long and expensive labor of installing structures, panels, wires and other features for the system is not done at height but in a more convenient place such as on the ground or in a workshop and, in some cases, can be partly or totally automated. In some cases, the "FMU canopy" is constructed off-structure and is transported to its final location partly or completely finished, either in 1 piece or in several pieces. In some cases, components such as the supporting components, wiring or other components need to be installed first or to be constructed locally or on site. In some cases, all or some of the components are delivered as a kit to be mounted on site. Favorably, most of the components are constructed off-structure, delivered as a kit and only have to be erected, mounted or connected, which is done in a short time. For example, a 16 solar panels embodiment of the "FMU canopy" can have a PComp entirely built, wired and installed off-structure that is to be attached to the supporting structure in only 2 or 4 points and to be connected, in a Plug and Play mode, after only tying a few cables or "Super plugs".

In some embodiments, the FMU Canopy is delivered complete and finished with many or all of its features and accessories. In some cases, its supporting members, columns (1603, 1604) or walls come folded to facilitate transportation with the FMU Canopy and only have to be unfolded at the time of installation.

With embodiments wherein "Canopy tops" are rotating or wherein components are mobile, drive, control and safety systems may have to be used: "FMU canopies" can undergo high external forces such as wind, seismic or others, which could overwhelm the drive or control systems and cause the "Canopy top" to rotate abnormally or to generate safety issues. Therefore several drive and control solutions including electric motors, hydraulic motors or actuators, braking systems, pin systems, shock absorbers, rotary dampers, or gravity drive systems are described in other figures. For safety purposes, the rotation angle can be mechanically limited to a certain range so that, if the drive or the control systems fail, the "Canopy top" can't rotate more than allowed.

In the example of embodiment illustrated in FIG. 16, the "Main pipe" (1608) plays a structural role: it supports the LSCs (1606) and keeps them aligned using brackets. In some cases the "Main pipe" rotates on a horizontal axis (1609), and is to be fastened to bearings (1610), hinges or joints, which are connected to fastening pads (1611) that are fastened to columns (1603, 1604) or to a supporting structure using "Main fasteners" (1612). In some cases, the rotating part (canopy top) is connected to the fixed supporting parts using industrial components such as car wheel hubs: the columns are attached in lieu of the cars chassis and the pipe is attached in lieu of the car's wheel. In some cases, automotive or vehicle brakes and electronics can be used. An example of utilization of vehicle components involves using a vehicle brake rotor and vehicle brake calipers and brake pads. The brake rotor is connected to the Main Pipe or to the rotating part and it rotates around the same axis as the moving part of the FMU. In some cases, the brake rotor can be replaced by another component that brake pads can press instead of a brake rotor. Some vehicle brake systems use calipers and brake pads that are activated by hydraulic systems and electronic controls. Such a system can be used with one or several sets of brake calipers and brake pads applied pressing one or several brake rotors. In some cases, vehicle brake systems using electric motors to push the brake pads are used, the electric motor being computer controlled, as main brake for the FMU's moving parts. Other vehicle brake system can be used in some cases, such as air brakes as on trucks or trains. The rotation of the "Main pipe" drives or synchronizes the rotation of the whole "Canopy top". The "Main pipe" the "Canopy top" or other components may rotate or move or change settings for sun-tracking purposes or for any other purposes. A mechanical blocking system can also be implemented. It uses pins, connected to a rotating part connected to the Main Pipe or to the moving top and rotating united with it. The 2 pins, or legs of any design, are placed symmetrically on each side of the rotation axis. When the FMU parts rotate, the pins rotate too. They slide in slotted holes and when the movement reaches the allowed amplitude, the pins hit the slotted hole's limit, or any other blocking part, and cannot move any further. Thus systems ensures that the FMU's moving part cannot move beyond the authorized amplitude. Systems can be added for the pins to be blocked or slowed when they reach the limit point so that they do not swing backwards. The opposite design can be used too: the pins are fixed and the slotted hole moves. The slotted hole can be replaced with any part with a design allowing a pin or a leg to move up to a predetermined position.

In some embodiments, the "Main pipe" (1608) is not part of the PComp and is installed first on the columns like an "Attachment component". In the example of FIG. 16, the "Main pipe" (1608) comes as a part of the off-structure built "Canopy top" (1602). In the example of FIG. 16, the "Canopy top", including the "Main pipe" is to be craned or driven onto the previously erected columns.

In some embodiments, the "Main pipe" is attached to the columns (1603, 1604) before the "FMU canopy" is shipped or lifted to its installation location: the columns (1603, 1604), possibly finished with their dressing elements (1618), wiring and accessories, are attached by hinges, joints, connectors or bearings (1610) to the "Main pipe" (1608) or to the "Canopy top" (1602) and folded under the "Canopy top" in order to be shipped with it. An embodiment of on-site installation process thus consists in lifting the "Canopy top", unfolding the columns, possibly stripping the protection material off from the canopy, locking the columns in a vertical position and driving the assembly down so the columns' feet reach the previously constructed foundations (1614), if foundations are used, fastening the columns to the foundation and connecting the wires or the "Super plugs"; an adjustment system may be used in case the preinstalled foundation is not exactly in the right position. In some cases, footing elements are also attached to the columns before lifting. In some embodiments, the columns are split in 2 parts: a lower part is affixed to the ground and the upper par is affixed to the pipe part of the Canopy Top. This allows for installing the drive, control and brake systems, as well in some cases as some of the electronic and electric systems, lighting systems or other systems or features in the shop or on the ground prior to installation on site. Then, when the Canopy Top is craned on to the pre-installed lower part of the columns, the attachment essentially consists in fastening the 2 parts of the columns to each other. In some cases, a full Plug & Play system can be achieved and the Canopy Top comes alive a few minutes after installation.

Examples of embodiments of FMUs, "FMU canopies", columns or dressing elements can include any component such as sensors, cameras (1622), 2d or 3d vision systems, infrared or sonar systems or other volume sensors (1625), sensors (1621), such as light sensors, wind sensors, azimuth sensors, hygrometry sensors, location sensors, movement sensors, person detectors (1632), or other components such as light systems (1627), sound systems, buttons (1628), motors (1631), heating or cooling systems (1629), blowing systems, water systems, gutters, other liquid systems, various kinds of loads, screens (1690), displays, computer systems (1630), radio or communication systems, computer interface devices such as tablets or screens or command pads (1623), inverters (1624), micro-inverters, storage systems, curtains, awnings (1641), robotic arms, fixed or mobile sculptural, architectural or decoration elements, any type of actuators, electrical panels, control systems, connection systems, accessories, devices or other systems. "FMU canopies" can also include fixed, mobile, active or controllable objects such as tables (1633, 1640), chairs, plants, furniture components, curtains, finishing components or other objects. Some controllable or active elements are actuators. "FMU canopies" can also be customized by adding components and changing technical or architectural features. Designers or users can also add components, for example by attaching objects, plants, devices, furniture, accessories to the columns, the "Canopy top", to the ground or to other members.

In some cases, "FMU canopies" can include a flooring, which can also include active elements, such as heating/cooling, lighting systems, mobile systems, watering systems, plants, devices, technical gear, embedded storage or other features.

Volume, sound, temperature, air flow, hygrometry, views, furniture accessories configuration and other parameters can be similarly controlled in order for the "FMU canopy" to be able to generate a large range of different space settings, ambiances and productivity settings.

"FMU canopies", "Canopy tops", devices, accessories or features can be controlled manually or using local or remote control systems or they can be controlled by local or remote computer systems. In some cases, furniture or other compatible accessories or devices such as robots can be controlled by the system or can interact with the system.

In some embodiments, "FMU canopies" can also share information, settings or data with other systems, or exchange or learn from them. In some cases, "FMU canopies" and their systems can also be connected or remotely controlled or updated or they can send information to remote data bases. In some embodiments, FMUs are connected to the internet or to other networks and can exchange information, with surrounding systems, with other intelligent systems, with other FMUs or with central systems. In some embodiments, the FMU Canopy's computer system is used as the control system for the home or the building, or it interacts with the building's management system.

In some cases, FMU Canopies may be implemented using elements described in FIGS. 11 to 15 or can use the type of information described in FIG. 11 et 13, FMU Canopies can be created using elements described in other figures such as FIG. 10, 12, and FIGS. 1 to 9.

"FMU canopies" can also, in some embodiments, communicate, synchronize or interact with other intelligent devices, actuators, robots or systems present in the local environment or remote. In some embodiments, the "FMU canopy's" computer system is based on a robot operating system.

"FMU Canopies" can be part of larger systems such as energy systems, technical systems, architectural systems or other systems or can be their brain or center. They can also coordinate or control other intelligent or active space systems, technical systems, other devices or systems, activatable furniture, walls or external objects, or robots. "FMU canopies" can also have robotic members such as robotic arms, or other active members. In some embodiments, the "FMU canopy" can work as a robotic space system. FMU Canopies can have their own computing system or they can be connected to remote computer systems, or both.

In some embodiments, the computer system can analyze data in real time, either data obtained from external sources or from dialog with other systems or data collected by analyzing local sensors' data flows (1636) or it can have data analyzed by remote systems, in order to recognize people or language or sets of circumstances called "Situations".

In some embodiments, "FMU canopies" are able to tune up themselves: for example analyze their location, or their orientation, or some specifics of the environment, determine automatically the position of the sun or other parameters and adjust the programs that control the "Canopy top's" or the solar sensors' rotation and angle or other features. In some embodiments, FMUs are able to measure the wind speed or to get information from external sources in order to trigger safety systems. In some cases, FMUs or "FMU canopies"

can select the best parameters for each actuator based on information they have been given or on their own analysis of the "Situation".

In some embodiments, "FMU canopies" can be used to generate indoor or outdoor spaces. A "Solar sun-tracking domestic FMU canopy" can for example be installed in a home's yard and create an outdoor room like an outdoor dining room or covered patio. A "canopy top" can be seen as the roof or the ceiling of a space, and in some embodiments it can move or rotate: the "canopy top" can move in any direction or rotate on a horizontal axis (1609) or in several axis in order to better track the sun or for any other reason such as providing shading, protecting or benefitting from the rain or the wind, operating its sensors or actuators, opening or closing some views, perspectives or viewpoints, changing the aspect or technical settings of the canopy, commutating, improving the energy efficiency, changing the volumes and the space characteristics or the space feeling for the users, interacting with local or distant users or other players or "Situations".

"FMU canopies" (1601) can also include walls, partitions, awnings, shades (1641), flexible or rigid curtains or panels (1626) or other types of fixed or mobile components. For example mobile walls or curtains (1642) can slide or fold in and out of columns shells (1618), awnings or curtains (1641) can roll in and out the "Canopy top" (1602), thus creating screens or walls that can take many configurations and change the space definition. This allows for example to switch easily from a closed volume defined by a horizontal ceiling, peripheral curtains or walls, specific light, sound and heating settings to a limitless outdoor open space with a sloped ceiling opening views to the sky and natural light and temperature. The qualities of this space, such as for example volume (height, horizontal limits, vertical limits, shape, views, transparency, meaning, and other parameters), light (color, intensity, direction, blinking, or other settings), air (temperature, wind, hygrometry, and other parameters), sound or other parameters, are defined by the setting of each component. These settings can be preset when the "FMU canopy" is designed, or in some cases they can also be changed, tuned or controlled afterwards or in real time thus changing some of the parameters that define this space. In other words, "FMU canopies" have in some cases the ability to modify the aspect, feel, meaning, functionalities, efficiency or features of a space by changing parameters also called "Space settings". "Space settings" can be controlled manually or intelligently.

In some embodiments, "Space settings" can be created by the designer of by the user in order to provide pre-determined "Template settings" or ambiances for specific cases: for example, a designer can define a "Breakfast space setting", which describes the "FMU canopy's" expected space configuration or behavior for "1 person eating outdoor in the morning" with for example predetermined temperature, volume settings (position of the roof, degree of opening of the curtains or shades, location of plants or furniture), sound settings, light settings (for example by setting the color, intensity or direction of every available light), temperature settings, etc., as well as predefined styles of real time interactions; a user can personalize or refine this "template setting" and create a "User 1's breakfast Space setting" variation or create a new one by specifying other values to some parameters. All these parameters can be controlled manually or by a computer system, which can record the selected "Space settings", their variations or the circumstances of these variations.

In some cases, the user can declare himself or declare "Situations" (such as breakfast for User 1, barbecue party in a sunny afternoon, dinner party at night, kids doing homework, maximum solar output efficiency or any other) that the computer system can remember in order to recreate at will the specific "Space settings" for these "Situations". Then, when for example the "Breakfast" "Situation" happens again, User 1 (1634) can use local or remote control systems or direct interaction such as voice control to call back its personalized setting and the computer system will restore the recorded actuators configuration, possibly with some adjustments due to external changes such as the weather or others.

In some embodiments, the computer system is able to analyze facts and recognize "Situations" and to restore automatically the corresponding "Space setting". For example, when the computer system, using its sensors, detects or recognizes that User 1 (1634) is arriving in the "FMU canopy" environment on a Sunday morning with food (1635) on the table (1633), the computer system can assume this is a "User 1 Breakfast" "Situation" and recreate the corresponding "Space settings". The human or the technical reaction (for example: no reaction=approval, the user modifies the settings=update the recorded "Space settings" or understand why the user needed a change, the user changes the parameters to another preset setting=error in "Situation" recognition, etc.) teaches the computer system if it is right or not or what is wrong, and the computer system will learn from the experience. The computer system can also learn how to improve the "Space settings" by analyzing the user's reactions. In some cases, the users can manually change some settings (for example open a curtain), save the new setting or not, or an external player can have an action (for example the wind can open a curtain), which changes the space's configuration. In some embodiments, the computer system can recognize these changes and interact with them or learn from them.

In some embodiments, the computer system can learn from experience and recognize that in a given "Situation" a given user prefers a given "Space setting" and recreate the settings automatically when the user/"Situation" combination occurs again. The computer system can also work based on "Template settings" or on user created "Space settings", but it can also create its own "Space settings", test and assess them.

In some embodiments, the computer system can recognize if the space or the technical functions are being used and modify the settings consequently, for example by switching off all the comfort settings when nobody is using the space and focusing on energy production efficiency or safety settings. For example, the computer system can switch off energy consuming devices such as lights, sounds or heaters or store fragile components such as curtains, or set the "Canopy top" to a safe angle or set it to an optimized angle for solar output, or take other actions. The system can also, for example, arbitrate between differing orders or possibilities, for example use a user preferred "Space setting" although the energy efficiency program request another setting.

In some embodiments, the computer system can interact with the users, recognize natural language, orally or in writing, receive orders from people or talk with people as freely as possible. In some embodiments the computer system can learn from the users' interactions and propose "Space setting" modifications or test new "Space settings" and analyze their effects. For example, the computer system can test a "Space setting" different from the "Space setting"

the user or the "Situation' would normally have triggered, see if the users accept the new "Space setting" or if they change it manually. The computer system can then learn from their reactions and refine its models and patterns of interactions.

In some embodiments, the computer system is able to recognize people (1634) by their silhouette, or their face, their gesture or their voice or other parameters, and to automatically adapt to their presence. In some embodiments, the system recognizes people by their phone or other devices, or people have declared themselves to the system. When it has recognized User 1 (1634), the computer system can pull its preferred parameters. If the computer system has also recognized a "Situation" X, it can pull "User 1" "Situation X" "Space setting. If it someone else, it can pull other previously learnt or preset parameters and implement or test them or start learning a new person. When several people are present, new settings or combined settings can be used.

In some embodiments, the system is able to read people's feelings, for example by analyzing their facial expression, their gestures, their voice or their words or using other techniques, and to understand how they feel or how they react to the implemented setting. This allows the computer system to evaluate the settings it has implemented and to improve them.

After several iterations, the computer system may, in some cases, be able to learn from experience until it is able to understand what makes sense and what needs to be done in every circumstance. In some embodiments, the computer system is able to react to the users' moods or to "Situations" by proposing disruptive "Space settings", for example by changing space parameters to change people's moods or give them ideas or wake them up, or to interact and dialog with people.

In some embodiments, the computer system can be connected to other machines via a network so they share experience and learn better by working of larger volumes of data. The computer system can be upgraded directly or remotely, for example with new versions of operating systems, new applications, new connections, new data bases, new features or abilities, etc. Some of the calculations can be performed onsite by the machine but in some cases the calculations are performed in a centralized location, for example in order to have more computing power or larger data bases. A large artificial intelligence based on multiple "FMU canopies" or other compatible systems sharing some information can thus be built as well as large data bases, which allows improving the programs. A network of FMU Canopies can also act together or jointly, although distant, and provide sets of users with coordinated experiences.

In some embodiments, the computer system can connect to a building and use its knowledge to manage the settings of the buildings. For example a "FMU canopy" installed in home's yard will learn about the users, the circumstances and the location, and can then start running or testing configurations elsewhere in the house. Same is true for an office building, a store, or other types of spaces.

The knowledge, technologies and space control experience developed for "FMU canopies" can, in some cases, be used for other fields such as intelligent or parametric buildings, architectural design, computer design, robot interactions, robot design or other applications.

Figure 17:
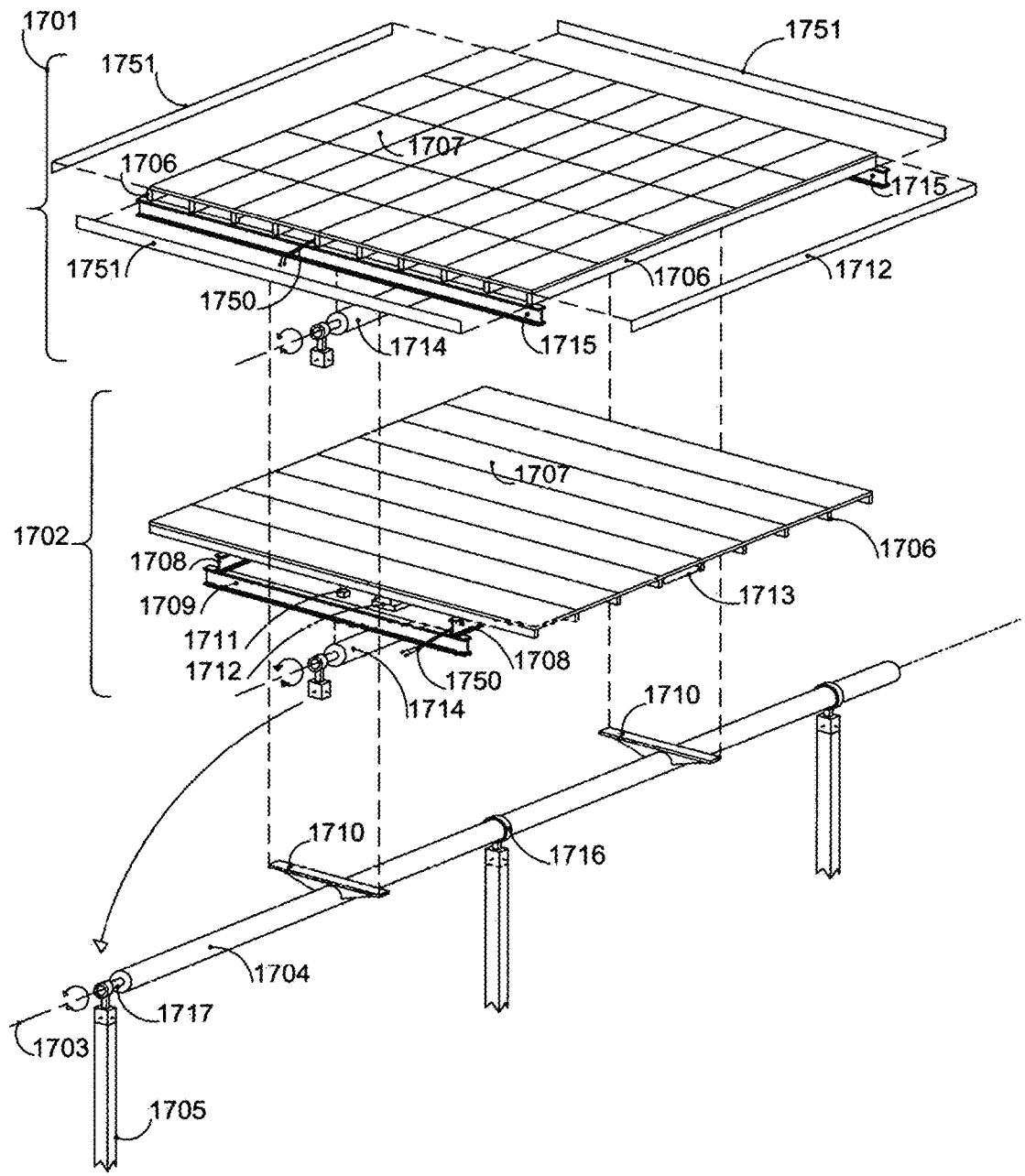
FIG. 17 illustrates a perspective view of a FMU CC, according to certain embodiments of the invention.

FIG. 17 is an exploded perspective view that illustrates several examples of FMUs in "FMU Carport Canopy" embodiments. FIG. 17 also refers to elements described in FIGS. 1 to 16 or in other figures. In some cases, FMU Carport Canopies can be implemented, designed, built using elements described in FIG. 1-16, in FIG. 18-19.

"FMU Carport Canopies" are special embodiments of "FMU Canopies" that can be used for large applications such as carports, solar carports, ground mounted solar arrays, roof top projects, or other large structures.

"FMU Carport Canopy", also referred to as FMU-CC can be designed in any size, design or function. FMU-CCs can be used unit per unit or several FMU-CCs can be grouped in order to create larger applications.

FMU-CCs use an embodiment of "Canopy top" and PComp referred to as "Canopy top carport" (CTC). Since the FMU-CC embodiment is often used to create large structures, such as large solar arrays, several FMUs may be grouped to form large structures that, in some cases, share supporting structures or pipes.

As FMU-CCs can be made in various sizes or structural systems, 2 embodiments are illustrated in FIG. 17: 2 CTC are illustrated. A project would use either a CTC like 1701 or a CTC like 1702, but not superpose them on top of each other.

FMU-CCs can be fixed or have sun-tracking CTCs that rotate on a sensibly horizontal axis (1703), in order to track the sun or for any other purpose.

In the example of FMU-CC embodiment illustrated in FIG. 17, CTCs are supported by "Main pipes" (1704) that can be beams of any shape design or material. In the example of FIG. 17, the "Main pipe" is a hollow circular beam. FMU-CC's "Main pipes" are supported by aligned columns (1705) or other types of supporting structures. FMU-CCs can be used in some cases to create long lanes of roofs or solar arrays that are supported by several columns or supporting structures installed on a line. FMU-CCs allow for installing large CTCs above the ground with very few points supporting points on the ground.

In some cases, CTCs are not supported by the Main Pipe (1704) but by the columns (1705). These CTCs may be larger than the distance between columns and overhang beyond the columns. If they are rotating, they are affixed to the column using any kind of articulated mechanism such as hinges, bearings, wheel hubs or simple frictional systems, which connect the Transversal Beam (1715, 1708) or the rail (1706) to the column or to another structure. In some cases, a pipe, a beam or any other type of connector spans between 2 CTC/column connection points, or between 2 Transversal Beams in order to keep both sides of the CTC parallel and rotating in a synchronized manner.

FMU-CC can be built in place or they can use off-structure constructed components: FMUs, CTCs, "Main Pipes", columns, and other components are, in some cases, be constructed off-structure, either on the site or elsewhere, and installed on site. In some cases, CTCs are constructed separately and fastened to pre-installed "Main pipes" (1704). In some cases, the "Main Pipes" (1714) are attached to the CTC (1701, 1702), which is to be fastened to pre-installed columns. In some cases, CTC, "Main pipe" and columns are constructed off-site together and attached as a unit so they only have to be affixed to their footings on the ground. In some cases, the components are not constructed off-structure and are assembled on their final location.

In some cases, like for the FMU Canopy of FIG. 16, the columns are split in 2 parts, in order to have 1 part pre-attached to the CTC so that the CTC to column connection can be made prior to the installation. The 2 parts of the column only have to be reconnected at the time of installation.

In some examples of FMU-CC embodiments, the "Main pipe" can be designed in 2 ways: there is either 1 "Main pipe" per CTC, or the "Main pipe's" dimension is independent from the CTC's dimension If there is 1 "Main pipe" per CTC, the "Main pipe" is supported by at least 2 columns or supporting structures, which are either at the tips of the "Main pipe", or not. The "Main pipe" may overhang beyond the columns such that the columns can be anywhere along the "Main pipe", which allows for having a column spacing different from the size of the "Main pipe" or of the CTC. This embodiment of FMU-CC creates self-standing units comprising at least 2 columns, 1 CTC and a pipe. In this case, the "Main pipe" is often part of the CTC that is to be craned to the top of the columns. These self-standing FMU-CC embodiments can be independent or installed in lanes or rows of FMU-CCs that can, in some cases, be connected. For example, their "Main pipes" may be connected in order to provide better stability or to transmit rotational drive or rotational control.

When the "Main pipe" is not part of the CTC, it is installed first on a lane of columns or of supporting structures in order to provide a long supporting line on which CTC can be installed anywhere on the "Main pipe". The long "Main pipe" embodiment renders the CTC's design and sizing independent from the column spacing and the ground level constraints.

In embodiments where the "Main pipe" is rotating, the "Main pipe" drives the CTC to rotate too and controls them.

Like with any other "Canopy tops", "FMU Canopies", PComps or FMUs, CTCs (1701, 1702) can include any kind of accessories (1712), features, dressing elements, WB (1713), sensors (1711), and can have any aspect, function, design, size or feature. CTCs can be assembled on site or constructed off structure and arrive on site finished, wired or tested so they only have to be fastened to a supporting structure by a few "Main fasteners" and connected to networks by a few cables (1750) or "Super plugs".

CTC (1702) is an embodiment wherein panels (1707) are attached to LSCs (1706) that are substantially perpendicular to the "Main pipe's" axis. The LSCs are attached to TBs (1708) that are to be either directly fastened to the "Main pipe" (1704 or 1714) or fastened to brackets (1710) attached to the "Main pipe's" brackets or to intermediate beams (1709) that are fastened to the "Main pipe" or to the brackets (1710). In this example, TBs are wide flange beams or can have any other design.

CTC (1701) is an embodiment wherein panels (1707) are attached to LSCs (1706) that are substantially parallel to the "Main pipe's" axis. The LSCs are attached to TBs (1715) that are to be either directly fastened to the "Main pipe" (1704 or 1714) or fastened to brackets (1710) attached to the "Main pipe".

When the "Main pipe" (1714) is part of the PComp and comes with it, it is to be attached to the columns (1705) and installing the CTC consists essentially in fastening the "Main pipe" (1714) to the top of the columns with a few "Main fasteners" and to connect the wires (1750).

CTCs can be fixed and immobile. CTCs can also be mobile or rotating.

CTCs (1701, 1702) can be fixed. In the example of FIG. 17, the CTCs rotate on a horizontal axis (1703) in order to track the sun and optimize the energy collection. Similar systems can also be used for other purposes, such as systems that enable a CTC to move for any reason and in any way or non-solar systems. A series of at least two aligned columns (1705) support a longitudinal "Main pipe" (1704 or 1714) that can rotate on an axis (1703) parallel to its greater length. This "Main pipe" is connected to the columns by bearings (1717), ring bearings (1716) circling the "Main pipe", industrial systems such as vehicle wheel hubs, or other systems enabling to hold the pipe and to let it rotate, sometimes in a controlled manner. The bearings (1716, 1717), or other connectors, are attached on top of the columns. Drive systems, blocking systems or safety systems can be added as described in other figures. The "Main pipe" (1704) can be very long and be made of several components connected together. The "Main pipe's" rotation allows the CTC to rotate united to the "Main pipe". The rotation can be motorized or not. When the "Main pipe" is made of several pipes connected together, the torque may be transmitted from a pipe to another, so it suffices to drive any part of the pipe to rotate the whole system, even very long arrays made of several components united by the same pipe. In some cases, "Main pipes" are independent and CTCs are powered and controlled individually. Spacing between the columns (1705), height of the columns, size of the CTC, type of drive and angle of rotation may vary depending on the project. FMU-CCs can be made in several ways depending on the configuration. In some cases, the "Main pipe" is a beam that holds loads such as weight or wind instead of torque, or that holds loads and torque altogether. In some cases, there is no Main Pipe and the CTC is supported and the CTC is supported by 2 or more columns and drive and control systems ensure a coordinated movement of the CTC at each column connection point in order to reduce the risk of deformation of the CTC.

CTC (1701, 1702) can be mounted on location or constructed off-structure. If it is mounted on site, the supporting columns (1705) and the "Main pipe" (1704) are erected first. Then, the rails, Longitudinal Supporting Components (1706), beam or other structures are attached to it and then the panels (1707) or any other top layers are attached to this supporting structure.

CTCs (1701, 1702) can also be constructed off-structure, possibly using some of the techniques described in other figures, as an embodiment of FMU. Off-structure construction allows for preparing FMUs before mounting them, which allows for better quality, lower price, faster execution and reduced risk. CTCs can be constructed off-structure and lifted onto the supporting structure. This way, most of the labor (such as preparing, adjusting, attaching, connecting, wiring, inverters, grounding, painting, finishing parts and accessories, verifying, etc.) is not done at height on top of the supporting structure or on scissor lifts but it is done elsewhere in better conditions, and can involve high levels of automation or robotization. Attaching the CTC is then easy and quick. In some cases, the CTC can include both the PComp and the "Main pipe" (1714) with its bearing and fastening pads; they can be connected together and then moved to the final destination on top of the supporting columns. In this case, installing the CTC onsite consists essentially in connecting the CTC to the column, which can be very quick and easy. In some cases in which the size of the CTCs does not match the distance between columns and there is a continuous Main Pipe as illustrated in FIG. 17, the CTCs can be installed on several segments of the "Main pipe" regardless of the columns' position. This way, the sizing of the CTC and the columns' spacing are independent, which allows for greater design liberty and better cost reduction. In some cases, each CTC is attached to the supporting structure by only a few "Fastening pads": for example when each end of the CTC is to be attached to each side of a bracket (1710), which means there are, for example, 4 "Fastening pads". CTCs can be fastened to each "Fastening pads" by welding or screwing one or several "Main fasteners".

In some cases, the CTC comes pre-mounted with its drive system or its control system, and the CTC only needs to be connected to its 2 or more supporting columns.

An example of efficient use of FMU-CCs is as follows, although many other embodiments are possible: A large scale commercial carport is to be built on an existing parking lot. Columns are installed on central parking lines with a regular 27 feet spacing and electrical connections are prepared. CTCs in this example are designed as 90 panels (25 KWp) units with one inverter. CTCs are constructed off-structure, for example, in a local shop or in a tent or anywhere a fixed or mobile off structure construction bench is installed. Most tasks are performed on the bench, such as preparing, attaching solar panels, connecting, wiring, grounding, adjusting, installing inverters if they come with the CTC (not always the case), "Dressing elements" (1751) and accessories, finishing, testing, etc. In some cases, most of the construction tasks can be automated as described in other figures, which makes the process much faster. "Main pipes", if any, are attached to the CTC, as well as drive systems and safety systems. The CTCs are transported to their final destination and craned on top of the columns. The "Main pipe's" or the CTC connectors' bearings carry "fastening pads" that have to be attached on top of the columns. In some cases, 6 or 8 bolts per column are sufficient to fasten securely the CTC to the columns and they can be fastened in a few minutes. Electrical connections are done by connecting only a few wires. The onsite installation took only a few minutes instead of hours or days with traditional processes. If the CTC has been constructed off structure with automated process, the total cost of labor is much lower than with traditional processes. The drive and safety systems are attached in a few minutes and they allow for sun tracking, which increases the solar system's output. Favorably, the sun-tracking solar carport starts working shortly.

Figure 18:
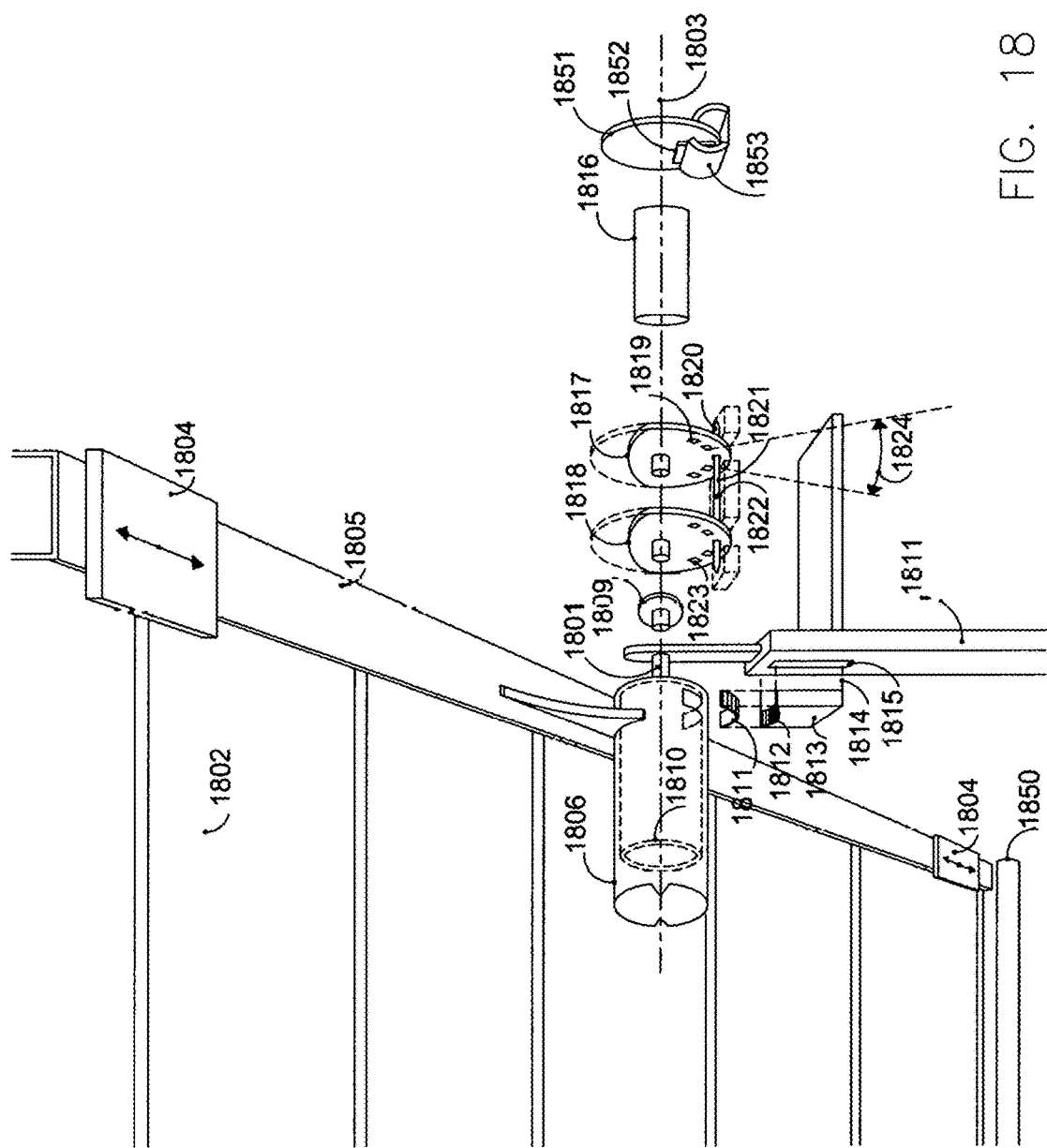
FIG. 18 illustrates a perspective view of FMU drive, control or safety systems, according to certain embodiments of the invention.

FIG. 18 is an exploded perspective view that illustrates 3 examples of drive, control or safety systems for a rotating canopy top. FIG. 18 refers to elements described in FIGS. 1 to 19 and particularly FIG. 16 and FIG. 17.

Not all of these systems are to be used in the same time. This figure Illustrates a range of solutions.

Rotating a mobile object such as a roof or a solar array or any kind of object requires both to generate the movement and to control it. In cases such as a canopy, a domestic canopy, a carport or a roof, a "FMU Canopy", a FMU-CC, or other FMU embodiments, a "Canopy top", also referred to as rotating object (RO), be they solar or not, the rotation is often expected to be very slow or to require extreme force. The solutions described can in some cases be used for any system or for all the FMU embodiments described in the figures. And for other systems.

It also often needs to be controlled: if the RO is subject to external forces such as wind or seismic, these external forces may result in moving the object beyond its owner's desire. For example the wind could submit a carport's roof to extreme loads and cause it to move in uncontrolled manner. Therefore, for some cases of embodiment, a strong and permanent blocking system may be needed in addition to the rotation control system.

It is necessary to make sure the object is being controlled all the time, when it is moving and when it is not. The drive and control can be obtained by mechanical means such as fixed blocking systems, rotation control systems, or with a gravity drive system. These systems can be combined.

A computer system controls the drive system and in some cases the blocking systems or the brake systems. The computer system uses programs that give the expected status of the mobile components or the RO at each time and uses sensors to get information about the current status of the RO, the mobile components or the system's components. In the case of a RO, the current angle can be determined by sensors such as tilt sensors, accelerometers, or other sensors.

Gravity Drive Systems:

When the RO (1802) is mounted on low friction systems such as bearings (1801), very little effort is needed to cause the RO (1802) to rotate a few degrees. The RO is rotating on a central axis (1803) and is naturally balanced if it has equal weight on each side of the rotation axis.

Gravity drive is based on the idea that changing this balance will cause the RO to tilt in the direction of greater load. In some cases, a heavy object (1804) attached to the rotating canopy and moving along an axis substantially perpendicular to the axis of rotation (1803), for example a mass moving along the TB (1805) or another perpendicular to a "Main pipe" (1806) or to the axis of rotation, will cause the RO to tilt. Moving the heavy object this way will cause the RO to tilt backwards. Setting the exact angle the RO tilts is done by setting the location of the mobile heavy object (1804).

Therefore getting the RO to rotate is very simple: a mass has to be transferred from side to side or to any location along the transversal path. This can be done using a liquid flowing from side to side in a system of reservoirs or it can be done with a heavy object moving from side to side. An example involves using one or several blocks of heavy material such as metal that rolls on a rail, for example suspended to a TB, from one side to another. Another example involves using 2 lateral reservoirs (1850), one on each side of the axis of rotation (1803) and placed at any distance from the axis, and a pump system that allows to move a liquid from a reservoir to the other or from a common reservoir to each lateral reservoir. One or more hose system connects the 2 reservoirs or the lateral reservoirs and the common reservoir. One or more valves can be used to open or close the one or more hose. The liquid can be any liquid including water, possibly with additives. A computer system controls the liquid movement system, the pumps and the valves, or the heavy object movement system based on the tilt information provided by sensors and the expected angle provided by a program, as well in some cases as sensors giving information about the status of the moving element such as liquid sensors giving the level of liquid in the reservoirs or position sensors giving the position of the moving heavy object.

In order to prevent the RO to move unexpectedly under external forces such as the wind or seismic forces, a damper system can be added, such as shock absorbers, rotary dampers (1809), frictions system, brake system or other systems. Rotation and control can also be achieved using hydraulic or electric actuators. Brake systems are also described in other figures.

In some cases, the RO is requested to come back naturally to a neutral position, such as a horizontal position. In this case, a spring system is added: the balance point of the spring system is the horizontal position and even if the movement is slowed by a damper system, the RO will in the end come back to horizontal. An embodiment of this system is using a torsion bar that is on one side attached to a fixed structure such as column (1811) and on the other side to the RO: for example, a torsion bar (1810) is inserted in the "Main pipe" (1806) and attached to it. A torsion bar can also be attached to any of the moving parts. When a force causes the RO to tilt, the torsion bar twists and pushes back the RO back to horizontal or to its balance position.

The components and loads can be calculated so they balance each other. For example, if a wind load torque is expected to be applied to the RO and to rotate the RO, a torsion bar or a spring system, or any type of backward force, can be calculated to match this maximum force. When the wind torque is applied, the spring system (1810) cancels it out and makes the RO is stable. When the wind torque decreases, the RO is pushed back to horizontal. An exceptionally strong wind gust would only increase the torque and cause the RO to rotate slightly more for a time; it would then come back. All the movements can be slowed by a damper (1809) system of corresponding power. Then, the mobile mass or heavy object (1804) only has to be sized to it creates a gravity force slightly superior to the backward force of the spring. In case of strong wind or other external force, the RO will slowly oscillate, slowed by the damper system, and come back to the expected position, which is dictated by the position of the moving weight. If the mobile mass is centered, the RO will come back to a horizontal position. If the mobile mass is positioned to cause the RO to tilt a certain angle, the RO will come back to this tilt angle after the wind gust is over. A mechanical blocking system can be added.

Drive and Control Systems

Mechanical systems:

Two levels of mechanical rotational control are described:

A fixed blocking system

A rotation control system

Drive systems that can be combined with the blocking systems or the rotation control systems are described too. Drive systems, blocking systems and controls systems can be used separately or they can be combined depending on specific applications. For example, damping systems can be used alone or combined with brake systems or control systems or with any drive system.

Fixed Blocking System:

The fixed blocking system can be used in any case that requires the rotation to be completely blocked mechanically for example in case of expected strong loads such as wind, snow, displacement or other external forces or in case the primary control systems such as the rotation control system described below or other systems are disabled for any reason, for example for maintenance. When the blocking system is out of order, or when it needs to be removed for example for maintenance, the RO is no longer secured and an additional system is needed.

This RO is built so it can rotate on a horizontal axis or any other axis. It rotates either manually or motorized. This "Main pipe" is equipped with a system that allows to block it in a given rotation angle whenever it is needed. In some embodiments, an inner gear (1811) is united to it. A complementary system is designed to block the rotation of the inner gear. The system is made of an outer gear (1812) complementary to the inner gear. The outer gear can be lifted using a screw or any other system that pushes the outer gear, attached to its supporting plate (1813), so its slider (1814) slides in a guiding system (1815) until it connects to the inner gear and blocks it so it cannot rotate. The rotational torque is then transmitted from the mobile object such as a pipe to the inner gear and to the outer gear and to the guiding system and to a fixed support. This guiding system is favorably attached to a fixed support such as a column or any other strong stable member.

This system can be used for any case, including when a drive system is missing for any reason.

The RO can also be blocked in any position by a system where a simple pin locks a hole connected to the pipe. Mechanical blocking elements, such as bumper, are also installed to make that, whatever happens, the RO will not rotate more than a pre-determined angle.

Rotation Control Systems:

Rotation control is achieved by any of the three following solutions, or any combination of them:

systems including drive and brake systems gear systems using worm mechanical blocking systems Drive and Brakes:

For cases of application wherein the motion is provided by an electric motor (1816) or by gravity, the system may be free to move without control when the motor is not running. Brake systems can be added either at the drive level or anywhere on the mobile object in order to control the rotation or to block it during non-rotation times. If the expected forces are greater than the brake's capacity, another blocking system may be needed such as the fixed blocking system described above.

In some cases, a mechanical drive system uses an electric motor to rotate the "Main pipe" or the RO and can use gear systems to reduce the speed and the torque. However, if the canopy is turning very slowly, such as when it is used to track the sun, it may be running only from time to time and be idle the rest of the time, which means the RO's movements are not always under proper control.

In some cases, automotive or vehicle brakes and electronics can be used. An example of utilization of vehicle components involves using a vehicle brake rotor (1851) and vehicle brake calipers (1853) and brake pads (1852). The brake rotor is connected to the Main Pipe or to the RO and it rotates around the same axis as the moving part of the FMU. In some cases, the brake rotor can be replaced with another component that brake pads can press instead of a brake rotor. Some vehicle brake systems use calipers and brake pads that are activated by hydraulic systems and electronic controls. Such a system can be used with one or several sets of brake calipers and brake pads applied pressing one or several brake rotors. In some cases, vehicle brake systems using electric motors to push the brake pads are used, the electric motor being computer controlled, as main brake for the FMU's moving parts. Other vehicle brake system can be used in some cases, such as air brakes as on trucks or trains.

Gear Systems Using Worms:

An example of embodiment is described wherein a worm system is used as a drive. Two kinds of worm systems can be used:

One way worms: driving the worm results in rotating the object, but the worm system does not allow an external force such as the wind to rotate the mobile object. The object moves only when the drive rotates the worm. When the worm is idle, the object does not move even if an external load is applied to it. So, the worm is used both as a drive system and as a brake system and it gives good control over the rotational movement.

Two way worms: in other embodiments, the worm system is designed so it does not prevent an external force from driving the worm. An external force can move the mobile object and no rotation control or a limited rotation control is provided par the worm system.

In both cases, a mechanical blocking system may be needed in some cases of application:

When the worm is designed to prevent the object from rotating, the loads applied to the object may exceed the gears' strength and damage them; in such cases a safer control or blocking system may be needed.

When the worm is designed to let the object rotate, a mechanical blocking system may be needed.

Blocking Systems:

The rotation can be controlled using braking systems. The rotation can also be controlled using worm gear systems which can be designed to rotate only when the motor drives it but not, or very little, when "Main pipe" is subject to external forces. However, the forces could in some cases, exceed the worm system's strength and brake it. In this case, a mechanical blocking system can be used.

Several types of mechanical blocking systems, based on a pin driven in a hole in the "Main pipe" or in a wheel united to the "Main pipe" and that blocks the "Main pipe's" rotation, can be used:

Exceptional single pin system that is triggered manually when the loads are expected to be high such as in the case of a wind alert, Permanent single pin that locks the "Main pipe" every time it is not supposed to be rotating and liberates it only when the motor is supposed to run, Permanent double pin wherein 2 pins alternatively block 1 or 2 wheels with a degree of allowed rotation so the canopy is always under control.

A double pin permanent blocking system is illustrated in FIG. 18 and with more details in other figures.

2 wheels, a "Main wheel" (1817) and a "Safety wheel" (1818) are united to the "Main pipe" (1806). These wheels have holes (1819, 1823) for pins to go through. A "Sliding pin" (1820) and an "Articulated pin" (1821) are attached by a hinge (1822). The "Sliding pin" can only slide longitudinally and locks the "Main wheel" (1817) most of the time so the RO is locked. When the RO needs to rotate, the "Sliding pin" slides out of the "Main wheel's" hole (1819) and liberates the wheel and the RO. When coming out of the "Main wheel's" hole, the "Sliding pin" pushed the "Articulated pin" into a hole (1823) in the "Safety wheel" (1818). The "Articulated pin" (1821) is hinged and has room for rotating a few degrees before it blocks the "Safety wheel". When the maximum allowed rotation (1824) has occurred, the "Sliding pin" slides back into a hole (1819) in the "Main wheel" (1817) (the wheels have turned and another hole is now aligned with pin), thus drawing the "Articulated pin" out of the "Safety wheel's" hole.

The RO is allowed to rotate a predefined angle, but remains under control at all times.

In some cases, a mechanical blocking system can also be implemented. It uses pins, connected to a rotating part connected to the Main Pipe or to the moving top and rotating united with it. The 2 pins, or legs of any design, are placed symmetrically on each side of the rotation axis. When the FMU parts rotate, the pins rotate too. They slide in slotted holes and when the movement reaches the allowed amplitude, the pins hit the slotted hole's limit, or any other blocking part, and cannot move any further. Thus systems ensures that the FMU's moving part cannot move beyond the authorized amplitude. Systems can be added for the pins to be blocked or slowed when they reach the limit point so that they do not swing backwards. The opposite design can be used too: the pins are fixed and the slotted hole moves. The slotted hole can be replaced with any part with a design allowing a pin or a leg to move up to a pre-determined position.

Figure 19A:
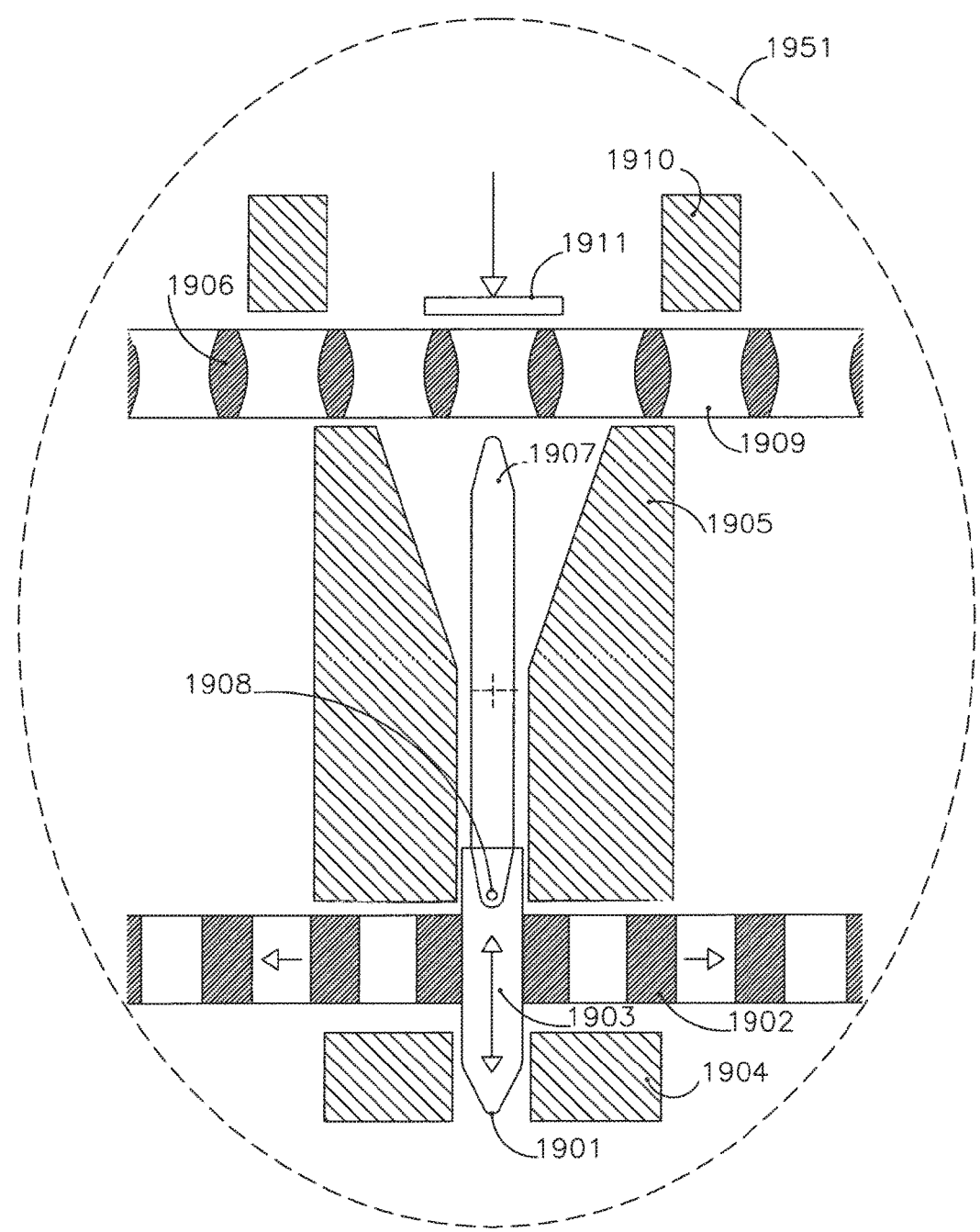
FIGS. 19A-19C illustrate a top section view of a blocking system, according to certain embodiments of the invention.
Figure 19B:
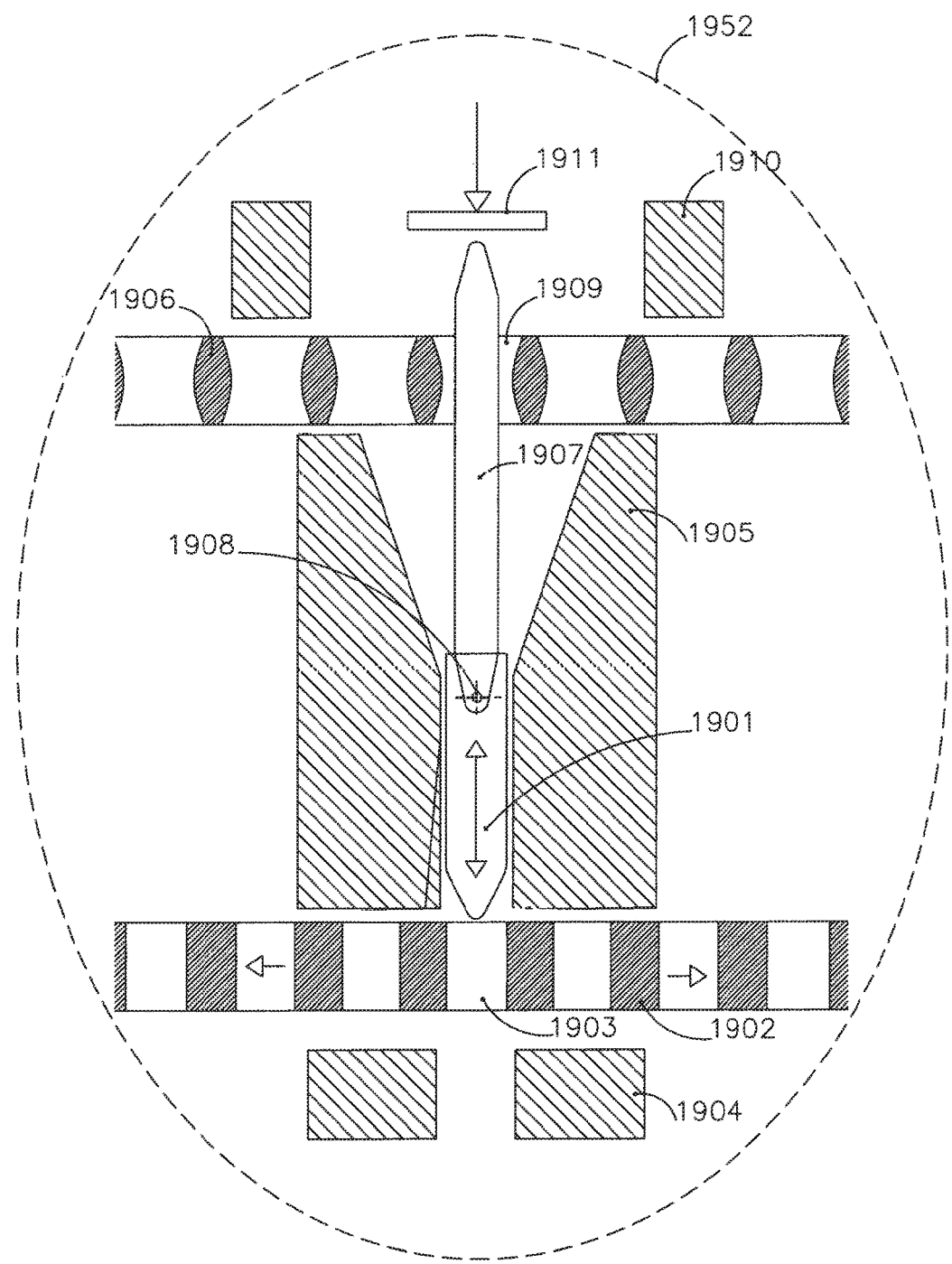
Figure 19C:
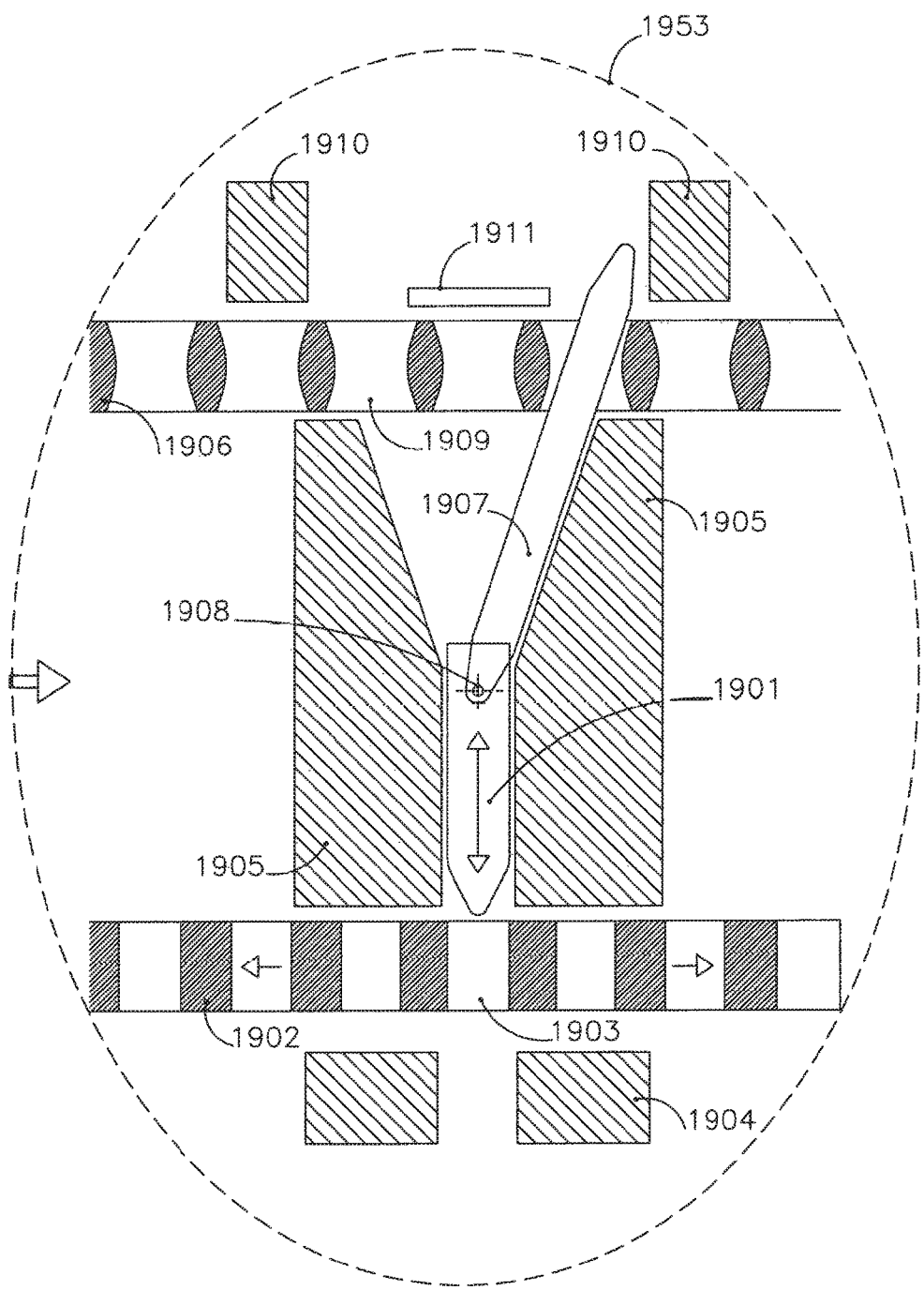

FIGS. 19A-19C include 3 top section views illustrating an example of double pin blocking system as described in other figures. 3 steps (1951, 1952, 1953) of the blocking process are illustrated side by side. FIGS. 19A-19C also refer to elements described in other figures, and particularly in FIG. 16-18.

In FIGS. 19A-19C, the rotating system is active and secured as follows:

Step 1 (1951) is illustrated in FIG. 19A. A sliding pin (1901) blocks the "Main wheel" (1902) by going through a hole (1903) in this wheel. The pin slides between guides (1904, 1905) on each side of the wheel (1902). It can only slide longitudinally but it cannot move transversally due to the guides. As it goes through the wheel and cannot move the same direction as the wheel, it is able to prevent the wheel from rotating, thus blocking the rotating members the wheels are connected to such as the safety wheel (1906) and the "Main pipe". The articulated pin (1907) is attached to the sliding pin (1901) by a hinge (1908) so when the pin (1901) slides longitudinally the articulated pin (1907) moves too. In Step 1 position, the main wheel (1902) is blocked and the articulated pin (1907) is not necessarily engaged in any wheel.

Step 2 (1952) is illustrated in FIG. 19B: the main wheel (1902) is about to start rotating but it has to be unlocked before it can rotate. The sliding pin (1901) and the articulated pin (1907) slide longitudinally between the guides (1905) so the sliding pin (1901) is drawn out of the main wheel's (1902) hole (1903) and the articulated pin (1907) goes through the safety wheel's (1906) hole (1909). Since the sliding pin (1901) no longer blocks it, the main wheel (1902) is now free to rotate. The safety wheel's hole (1909) is now crossed by the articulated pin but is not blocked either because the articulated pin is able to pivot on his hinge (1908) in order to allow some lateral movement. The wheels are now able to rotate a few degrees.

Step 3 (1953) is illustrated in FIG. 19C: the wheels (1902, 1906) have rotated a few degrees and have drawn the outer end of the articulated pin (1907) a few degrees laterally. The articulated pin could not slide laterally since it is articulated to the sliding pin (1901), which is blocked laterally by the guides (1905), but it can pivot using its hinge (1908) as an axis. Its inner end is attached to the sliding pin by a hinge so the inner end can only move longitudinally (sensibly parallel to the wheel's axis of rotation) and it cannot move transversally (sensibly perpendicular to the wheel's axis of rotation). The outer end of the pin (1907) can move any direction. So, the articulated pin (1907) can have a pivotal movement: it can angle around its articulation so its outer end follows the wheel when the wheel rotates.

The articulated pin's (1907) rotation is limited to a predetermined angle by at least one of two ways:

the guides (1905, 1910) set a limit to the articulated pin's (1907) rotation amplitude;

the articulated pin (1907) goes through one of the safety wheel's holes and both the articulated pin and the hole (1909) have a special shape which allows the articulated pin to go through the hole only up to a predefined maximum angle. When this angle is reached, the articulated pin is mechanically blocked in the hole due to angle and geometrical design, and it blocks the wheel (1906).

When the safety wheel (1906) is blocked, it also blocks all the elements it is united to such as the main wheel (1902), the gears, the pipe, the RO and all other united components.

This Mechanical Blocking System allows the wheels to rotate a certain angle but prevents them from going any further. This limitation system can be used whether the wheel rotates clockwise or anticlockwise. In some cases, like in this example of embodiment, the articulated pin's angle is also limited by the guides (1905, 1910). The system is to be designed so the wheel is only allowed to rotate a certain number of degrees and no more. The designer can set his own geometrical parameters such as the design of the articulated pin and of the holes, the design of the hinge and the sliding pin, the design of the supporting surface and the guides in order to obtain various patterns of control and accomplish the goals of a particular project. So the holes or other elements can vary in order to provide different reactions depending on the angle or other parameters.

Another problem needs to be solved: the angled articulated pin is able to limit the wheel's maximum rotation angle but this does not prevent the wheel from rotating backwards. As a consequence the wheels are not completely locked. To solve this problem, an anti-backing system (1911) is added. A pad (1911) can only move longitudinally. It is permanently pushed towards the wheel (1906). In step 1, the pad is close to the wheel. In step 2, the articulated pin pushed the pad (1911) back. When the articulated pin (1907) rotates, it gives room for the pad to come back close to the wheel. The pad now prevent the articulated pin from coming back to a smaller angle, thus blocking the wheel and making sure it cannot turn backwards.

I claim:

1. A system comprising:
   a rigid multi-sensor unit that is constructed off a destination host structure and that can be moved and connected to the destination host structure, the rigid multi-sensor unit comprising:
   two or more panels;
   two or more longitudinal beams, the two or more longitudinal beams having a rigidity capable of supporting, without additional structure, a load of the two or more panels during moving of the rigid multi-sensor unit to the destination host structure and after connection of the rigid multi-sensor unit to the destination host structure;
   two or more transverse beams, the two or more transverse beams having a rigidity capable of supporting, without additional structure, a load of the two or more longitudinal beams and the two or more panels during moving of the rigid multi-sensor unit to the destination host structure and after connection of the rigid multi-sensor unit to the destination host structure, the two or more transverse beams including:
   a first transverse beam, wherein a first top point of the first transverse beam is attached to a first bottom point of a first longitudinal beam of the two or more longitudinal beams at a first junction point, wherein a second top point of the first transverse beam is attached to a first bottom point of a second longitudinal beam of the two or more longitudinal beams at a second junction point, wherein a first bottom point of the first transverse beam at or near the first junction point is capable of being attached to a first connection point of the destination host structure, and wherein a second bottom point of the first transverse beam at or near the second junction point is capable of being attached to a second connection point of the destination host structure; and
   a second transverse beam, wherein a first top point of the second transverse beam is attached to a second bottom point of the first longitudinal beam of the two or more longitudinal beams at a third junction point, wherein a second top point of the second transverse beam is attached to a second bottom point of the second longitudinal beam of the two or more longitudinal beams at a fourth junction point, wherein a first bottom portion of the second transverse beam at or near the third junction point is capable of being attached to a third connection point of the destination host structure, and wherein a second bottom point of the second transverse beam at or near the fourth junction point is capable of being attached to a fourth connection point of the destination host structure;
   the rigid multi-sensor unit capable of being lifted at or near the first junction point, the second junction point, the third junction point, and the fourth junction point, and subsequently being placed on the first connection point, the second connection point, the third connection point, and the fourth connection point, thereby causing at least a majority portion of each of the first transverse beam and the second transverse beam to float over the destination host structure, the floating allowing water to flow between a channel bounded by the first junction point, the second junction point, the third junction point, and the fourth junction point; and
   a plurality of panel attachment mechanisms capable of:
   attaching a first end of a first panel of the two or more panels to the first longitudinal beam of the two or more longitudinal beams;
   attaching a second end of the first panel of the two or more panels to the second longitudinal beam of the two or more longitudinal beams;
   attaching a first end of a second panel of the two or more panels to the first longitudinal beam of the two or more longitudinal beams; and
   attaching a second end of the second panel of the two or more panels to the second longitudinal beam of the two or more longitudinal beams.

2. The system of claim 1 wherein the multi-sensor unit comprises a plurality of longitudinal supporting components.

3. The system of claim 1 wherein at least one panel of the two or more panels is a solar panel.

4. The system of claim 1 wherein the multi-sensor unit comprises at least one of a waterproof barrier, a rail, a clamp, beam, a transversal beam, a spreader beam, a spreader leg, a load spreader, a column, a dressing element, a finishing element, a panel, a solar panel, an active panel, a structural component, a sheathing system, a sensor, a thermal insulation layer, a lower face, an actuator, a grille, a board, a drip former, a fastener, a fixing member, an attachment component, a production component, a data component, a data set, a longitudinal supporting component, a ventilation channel, a cable, a cable tray, a flashing system, a waterproof curtain, an intelligent system, a drive system, a control system, a brake system, and a communication system.

5. The system of claim 1 wherein the multi-sensor unit is installed in lieu of a roof or a facade of a structure.

6. The system of claim 1 wherein the multi-sensor unit is affixed to a fixed structure.

7. The system of claim 1 wherein the multi-sensor unit is affixed to a mobile structure.

8. The system of claim 1 wherein the multi-sensor unit includes a fixed or mobile supporting structure.

9. The system of claim 1 wherein the multi-sensor unit is installed on an existing roof or facade or structure.

10. The system of claim 1 wherein the multi-sensor unit includes intelligent systems that allow the multi-sensor unit to interact with people, an environment, or other systems.

11. The system of claim 1 wherein the multi-sensor unit comprises at least one mobile part.

12. The system of claim 1 wherein the multi-sensor unit creates a space that can be modified by actuators or active components.

13. The system of claim 1 wherein the multi-sensor unit comprises a rotating top that moves to track the sun.

14. The system of claim 1, wherein the destination host structure comprises a building.

15. The system of claim 1, wherein the destination host structure comprises a carport.

16. The system of claim 1, wherein the two or more panels comprise at least two or more solar panels.

17. The system of claim 16, wherein the two or more panels comprise any of one or more heating panels and electrical panels.

18. The system of claim 1, wherein the two or more longitudinal beams comprise substantially parallel beams.

\* \* \* \* \*

UNITED STATES PATENT AND TRADEMARK OFFICE
CERTIFICATE OF CORRECTION

PATENT NO. : 10,277,159 B2  
APPLICATION NO. : 14/970431  
DATED : April 30, 2019  
INVENTOR(S) : Alain Poivet Page 1 of 1

It is certified that error appears in the above-identified patent and that said Letters Patent is hereby corrected as shown below:

On the Title Page

On page 2, Related U.S. Application Data item (60):
"Provisional application No. 61/789,607, filed on Mar. 15, 2013, provisional application No. 61/801,089, filed on Mar. 15, 2013."
Should read:
-- Provisional application No. 61/789,607, filed on Mar. 15, 2013, provisional application No. 61/801,089, filed on Mar. 15, 2013, provisional application No. 62/092,793, filed on Dec. 16, 2014. --

In the Claims

Claim 4, Column 80, Lines 40-42:
"the multi-sensor unit comprises at least one of a waterproof barrier, a rail, a clamp, beam, a transversal beam,"
Should read:
-- the multi-sensor unit comprises at least one of a waterproof barrier, a rail, a clamp, a transversal beam, --

Signed and Sealed this  
Third Day of September, 2019

Andrei Iancu  
*Director of the United States Patent and Trademark Office*